(12) United States Patent
Sato et al.

(10) Patent No.: US 11,743,604 B2
(45) Date of Patent: Aug. 29, 2023

(54) IMAGING DEVICE AND IMAGE PROCESSING SYSTEM

(71) Applicant: SONY SEMICONDUCTOR SOLUTIONS CORPORATION, Kanagawa (JP)

(72) Inventors: Yasushi Sato, Kanagawa (JP); Junichi Sakamoto, Kanagawa (JP); Mitsuru Mishio, Kanagawa (JP); Yuichiro Baba, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/982,554

(22) PCT Filed: Mar. 8, 2019

(86) PCT No.: PCT/JP2019/009346
§ 371 (c)(1),
(2) Date: Sep. 19, 2020

(87) PCT Pub. No.: WO2019/188123
PCT Pub. Date: Oct. 3, 2019

(65) Prior Publication Data
US 2021/0006756 A1 Jan. 7, 2021

(30) Foreign Application Priority Data
Mar. 27, 2018 (JP) .................. 2018-059840

(51) Int. Cl.
*H04N 25/131* (2023.01)
*H04N 5/33* (2023.01)

(52) U.S. Cl.
CPC ............. *H04N 25/131* (2023.01); *H04N 5/33* (2013.01)

(58) Field of Classification Search
CPC .................. H04N 9/0453; H04N 5/33
(Continued)

(56) References Cited

U.S. PATENT DOCUMENTS 8,284,301 B2 * 10/2012 Honjo ............... G03B 17/14
348/371
10,090,347 B1 * 10/2018 Mlinar ............. H01L 27/14621
(Continued)

FOREIGN PATENT DOCUMENTS

CN 101854488 A 10/2010
CN 102334333 A 1/2012
(Continued)

OTHER PUBLICATIONS

International Search Report and Written Opinion of PCT Application No. PCT/JP2019/009346, dated May 21, 2019, 08 pages of ISRWO.

*Primary Examiner* — Amir Shahnami
*Assistant Examiner* — Jimmy S Lee
(74) *Attorney, Agent, or Firm* — Chip Law Group

(57) ABSTRACT

An imaging device includes: a pixel array part in which a plurality of pixel groups each including four pixels arranged in a matrix of 2×2 is arrayed. As a pixel group including four pixels, there are formed a first pixel group that includes three pixels that receive red light and one pixel that receives infrared light, a second pixel group that includes three pixels that receive blue light and one pixel that receives infrared light, a third pixel group that includes three pixels that receive green light and one pixel that receives infrared light, and a fourth pixel group that includes three pixels that receive green light and one pixel that receives infrared light. Four pixel groups including the first pixel group, the second pixel group, the third pixel group, and the fourth pixel group are arranged to form a set of 2×2 units in which the first pixel group and the second pixel group are diagonally positioned, (Continued)

and the third pixel group and the fourth pixel group are diagonally positioned.

20 Claims, 36 Drawing Sheets

(58) Field of Classification Search
USPC .......................................................... 348/164
See application file for complete search history.

(56) References Cited

U.S. PATENT DOCUMENTS

| | | | |
|---|---|---|---|
| 2006/0146155 A1* | 7/2006 | Shimizu | H04N 5/374 |
| | | | 348/E3.018 |
| 2012/0008023 A1 | 1/2012 | Wajs | |
| 2012/0169962 A1* | 7/2012 | Yuki | G06F 3/042 |
| | | | 445/25 |
| 2014/0099005 A1 | 4/2014 | Mogi | |
| 2015/0002707 A1 | 1/2015 | Wu | |
| 2015/0181187 A1 | 6/2015 | Wu et al. | |
| 2016/0088239 A1 | 3/2016 | Wajs | |
| 2016/0344965 A1* | 11/2016 | Grauer | H01L 27/14656 |
| 2017/0115436 A1* | 4/2017 | Qian | G02B 5/208 |
| 2018/0098014 A1* | 4/2018 | Zuleta | H04N 5/37206 |
| 2019/0029504 A1* | 1/2019 | Nadiv | A61B 1/00006 |

FOREIGN PATENT DOCUMENTS

| | | |
|---|---|---|
| CN | 102576164 A | 7/2012 |
| CN | 104280803 A | 1/2015 |
| CN | 105049829 A | 11/2015 |
| CN | 105635532 A | 6/2016 |
| CN | 105704463 A | 6/2016 |
| CN | 106249332 A | 12/2016 |
| CN | 106878690 A | 6/2017 |
| EP | 2822036 A2 | 1/2015 |
| JP | 2007-189376 A | 7/2007 |
| JP | 2011-029379 A | 2/2011 |
| JP | 2012-515480 A | 7/2012 |
| JP | 2015-012619 A | 1/2015 |
| JP | 2016-189633 A | 11/2016 |
| TW | 201518830 A | 5/2015 |
| TW | 201640206 A | 11/2016 |
| WO | 2010/081556 A1 | 7/2010 |

* cited by examiner

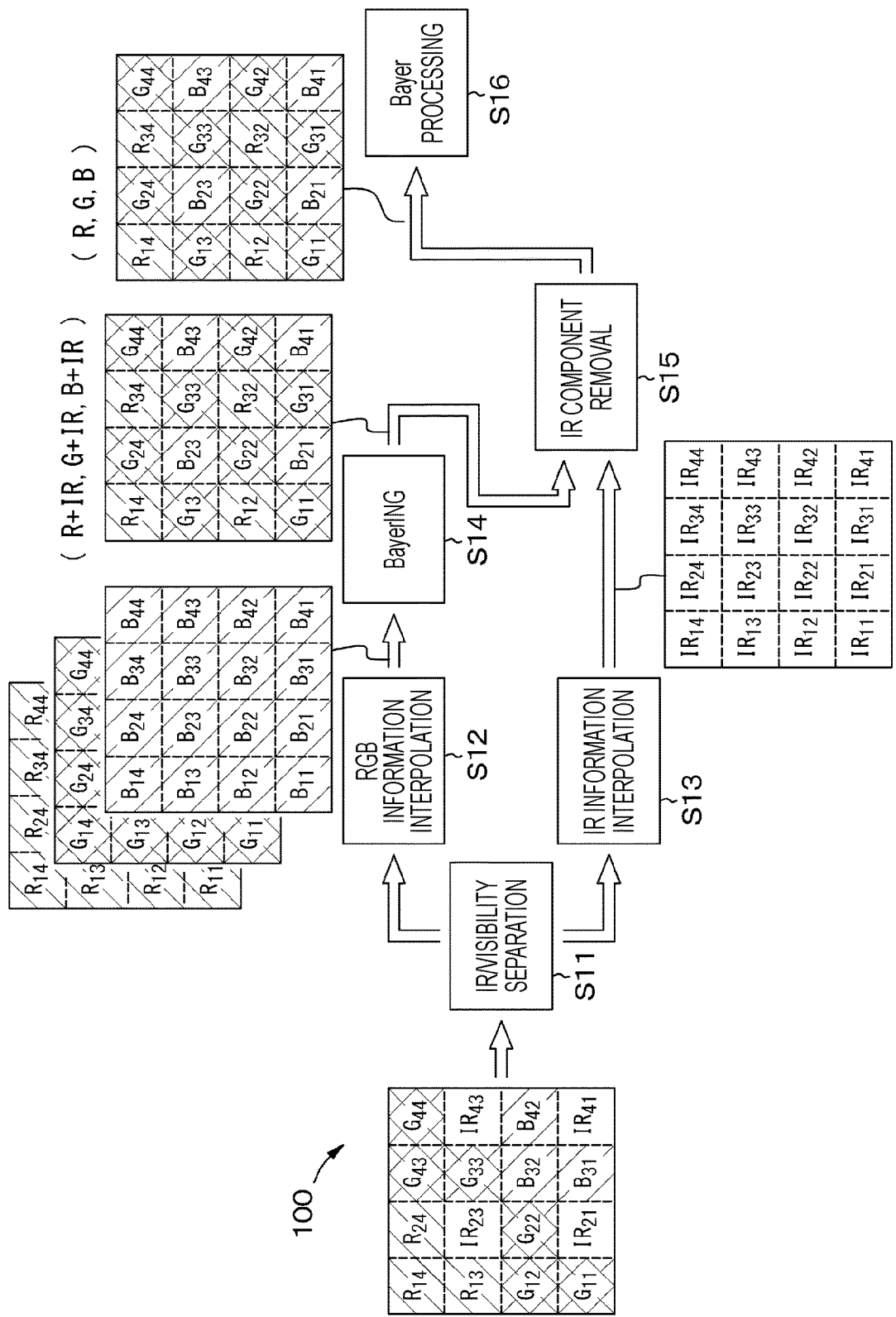

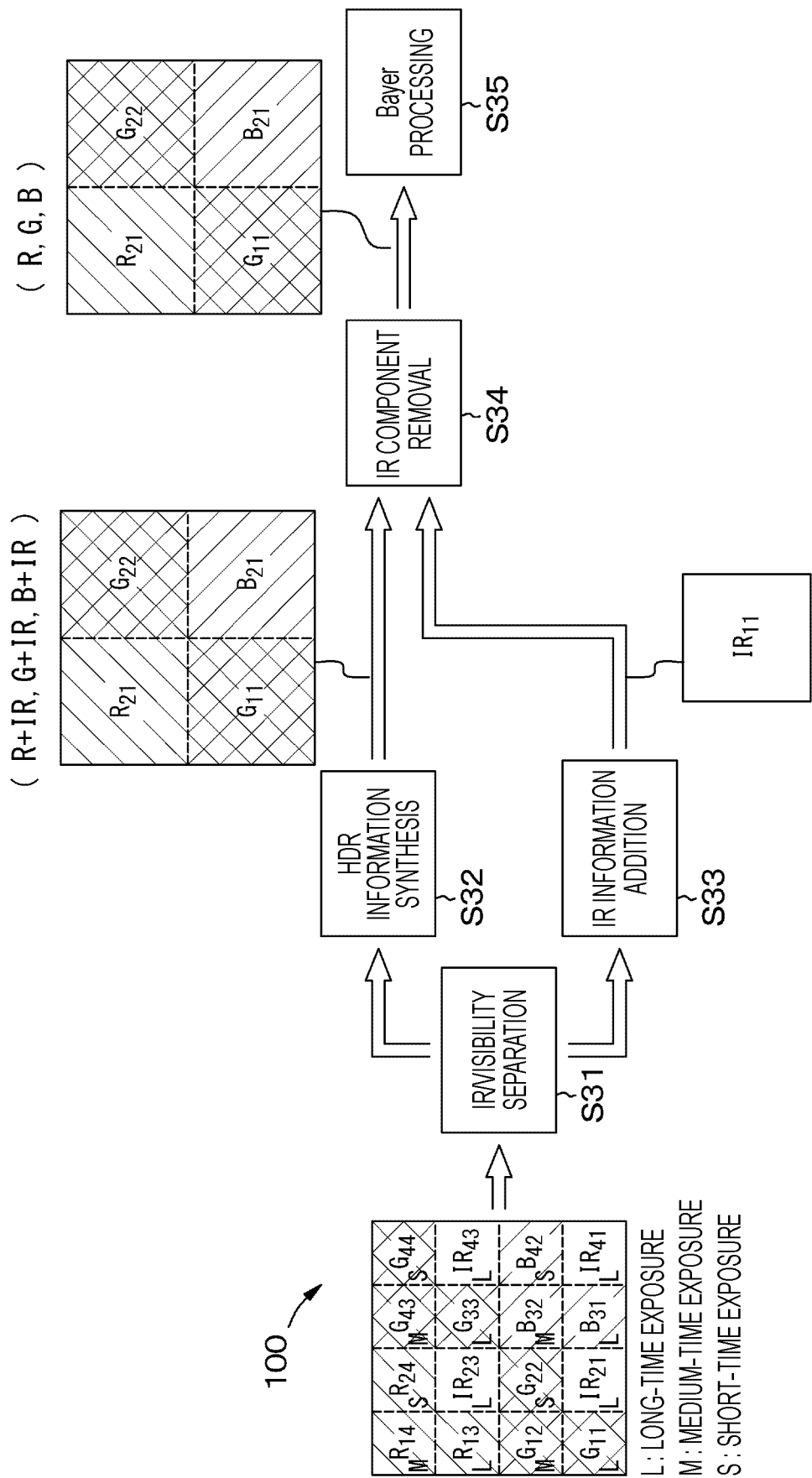

IMAGING DEVICE AND IMAGE PROCESSING SYSTEM

CROSS REFERENCE TO RELATED APPLICATIONS

This application is a U.S. National Phase of International Patent Application No. PCT/JP2019/009346 filed on Mar. 8, 2019, which claims priority benefit of Japanese Patent Application No. JP 2018-059840 filed in the Japan Patent Office on Mar. 27, 2018. Each of the above-referenced applications is hereby incorporated herein by reference in its entirety.

TECHNICAL FIELD

The present disclosure relates to an imaging device and an image processing system. In particular, the present disclosure relates to an imaging device and an image processing system suitable for use in capturing a visible light image and an infrared light image.

BACKGROUND ART

With the progress of semiconductor processing processes, an imaging device is proposed which is configured such that one pixel in a Bayer array is divided into a plurality of pixels (for example, see FIG. 14 of Patent Document 1). The imaging device with this configuration has an advantage that an image with an excellent S/N ratio can be obtained by adding and reading pixels of the same color, a high-resolution image can be obtained by performing full resolution demosaic processing, and furthermore, an image of a high dynamic range (HDR) can be obtained without requiring a plurality of times of imaging by setting different exposure conditions for a plurality of pixels corresponding to one pixel in the Bayer array.

CITATION LIST

Patent Document

Patent Document 1: Japanese Patent Application Laid-Open No. 2011-29379

SUMMARY OF THE INVENTION

Problems to be Solved by the Invention

In recent years, it is proposed to perform sensing processing of performing measurement processing and the like on image information and to use information such as the size of an object or the position of the center of gravity of the object, the distance to the object, and the movement amount of the object as sensing information.

It is preferable that the image information used for the sensing processing and the image information used for image display (viewing) can be acquired in a state where there is no parallax therebetween. Therefore, it is preferable that an infrared light image used for the sensing processing and the like and a visible light image used for the viewing processing and the like be obtained from one imaging device. However, with a configuration in which one pixel in the Bayer array is divided into a plurality of pixels, it is not possible to obtain the infrared light image and the visible light image from one imaging device.

An object of the present disclosure is to provide an imaging device which has an advantage of a configuration in which one pixel of a Bayer array is divided into a plurality of pixels and can also acquire an infrared light image and an image processing system using the imaging device.

Solutions to Problems

An imaging device according to the present disclosure for achieving the object described above includes:
a pixel array part in which a plurality of pixel groups each including four pixels arranged in a matrix of 2×2 is arrayed,
in which as a pixel group including four pixels, there are formed
a first pixel group that includes three pixels that receive red light and one pixel that receives infrared light,
a second pixel group that includes three pixels that receive blue light and one pixel that receives infrared light,
a third pixel group that includes three pixels that receive green light and one pixel that receives infrared light, and
a fourth pixel group that includes three pixels that receive green light and one pixel that receives infrared light, and
four pixel groups including the first pixel group, the second pixel group, the third pixel group, and the fourth pixel group are arranged to form a set of 2×2 units in which the first pixel group and the second pixel group are diagonally positioned, and the third pixel group and the fourth pixel group are diagonally positioned.

An image processing system according to the present disclosure for achieving the object described above includes:
an imaging device that images a subject and a signal processing part that processes a signal from the imaging device,
in which the imaging device includes a pixel array part in which a plurality of pixel groups each including four pixels arranged in a matrix of 2×2 is arrayed,
as a pixel group including four pixels, there are formed
a first pixel group that includes three pixels that receive red light and one pixel that receives infrared light,
a second pixel group that includes three pixels that receive blue light and one pixel that receives infrared light,
a third pixel group that includes three pixels that receive green light and one pixel that receives infrared light, and
a fourth pixel group that includes three pixels that receive green light and one pixel that receives infrared light, and
four pixel groups including the first pixel group, the second pixel group, the third pixel group, and the fourth pixel group are arranged to form a set of 2×2 units in which the first pixel group and the second pixel group are diagonally positioned, and the third pixel group and the fourth pixel group are diagonally positioned.

BRIEF DESCRIPTION OF DRAWINGS

FIG. 8 is a schematic process diagram illustrating a process of image processing accompanied by full resolution demosaic processing.

FIG. 11 is a schematic process diagram illustrating a process of image processing accompanied by HDR processing.

MODE FOR CARRYING OUT THE INVENTION

Figure 1:
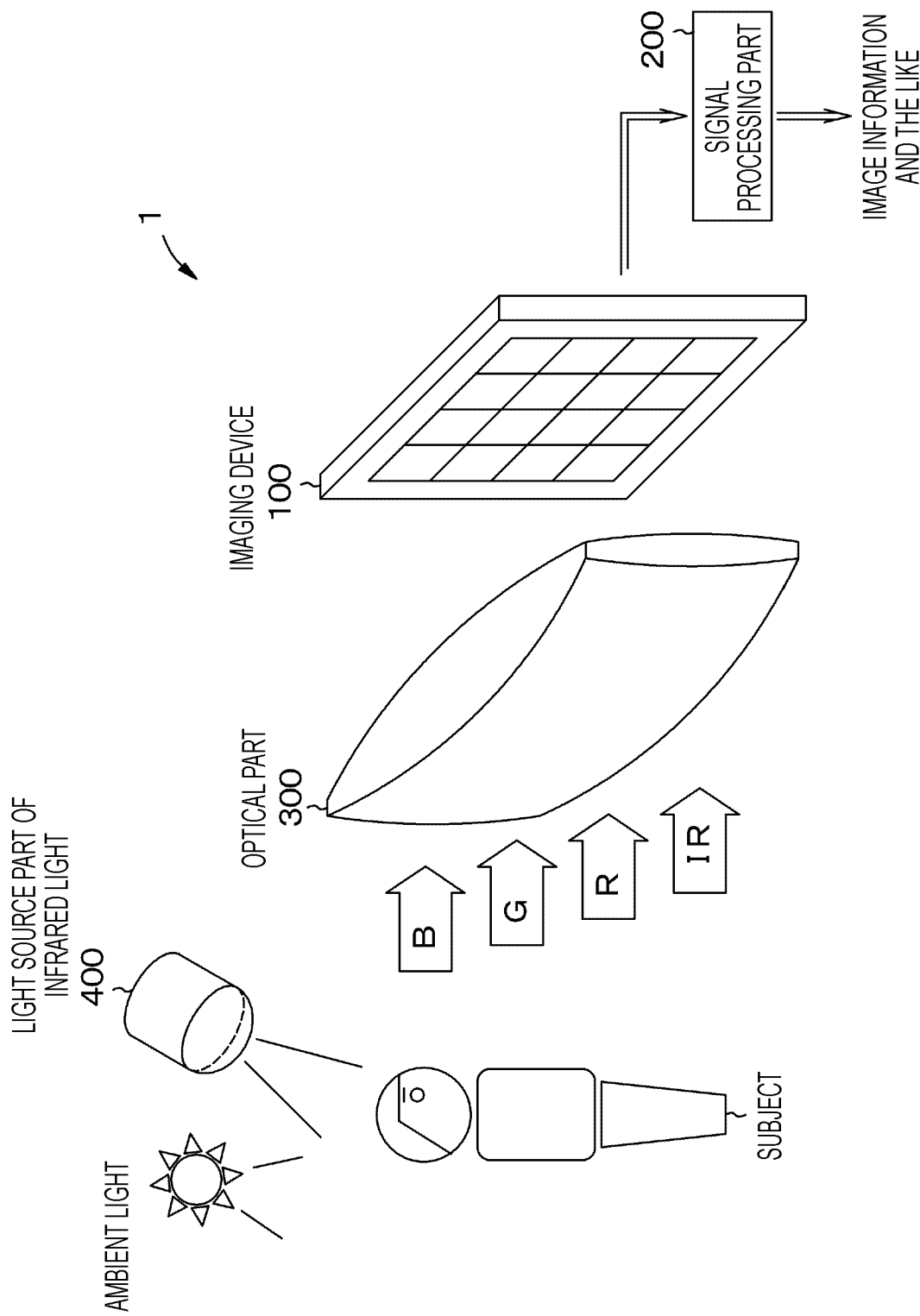
FIG. 1 is a basic configuration diagram of an image processing system using an imaging device according to a first embodiment.

Hereinafter, the present disclosure will be described on the basis of embodiments with reference to the drawings. The present disclosure is not limited to the embodiments, and various numerical values and materials in the embodiments are examples. In the following description, the same elements or elements having the same function will be denoted by the same reference signs, without redundant description. Note that the description will be given in the following order.

1. Overall Description of Imaging Device and Image Processing System of Present Disclosure
2. First Embodiment
3. Second Embodiment
4. Third Embodiment
5. Various Modification Examples
6. Application Example
7. Configuration of Present Disclosure Overall Description of Imaging Device and Image Processing System of Present Disclosure As described above, an imaging device of the present disclosure and an imaging device used in an image processing system of the present disclosure (hereinafter, these imaging devices are collectively referred to as an "imaging device of the present disclosure" in some cases) includes:
a pixel array part in which a plurality of pixel groups each including four pixels arranged in a matrix of 2×2 is arrayed.

As a pixel group including four pixels, there are formed
a first pixel group that includes three pixels that receive red light and one pixel that receives infrared light,
a second pixel group that includes three pixels that receive blue light and one pixel that receives infrared light,
a third pixel group that includes three pixels that receive green light and one pixel that receives infrared light, and
a fourth pixel group that includes three pixels that receive green light and one pixel that receives infrared light.

Four pixel groups including the first pixel group, the second pixel group, the third pixel group, and the fourth pixel group are arranged to form a set of 2×2 units in which the first pixel group and the second pixel group are diagonally positioned, and the third pixel group and the fourth pixel group are diagonally positioned.

In the imaging device of the present disclosure, in each pixel group, the pixels which receive infrared light can be provided at the same position. In this case, an on-chip lens may be arranged in each pixel.

In the imaging device of the present disclosure having the above-described various preferable configurations, any one of a red filter, a green filter, and a blue filter may be arranged to correspond to a pixel which receives red light, green light, or blue light, and an infrared light transmission filter may be arranged to correspond to a pixel which receives infrared light. The infrared light transmission filter can be formed by laminating at least two of the red filter, the green filter, and the blue filter. More preferably, the infrared light transmission filter is preferably formed by laminating two of the red filter and the blue filter.

Alternatively, in the imaging device of the present disclosure, a pixel which receives infrared light may be provided to be adjacent to pixels which receive infrared light in adjacent pixel groups, so that the pixels are arranged in a matrix of 2×2 in every four adjacent pixel groups.

Even in this case, an on-chip lens may be arranged in each pixel. Alternatively, an on-chip lens may be arranged in each pixel of the pixels which receive red light, green light, and blue light, and a common on-chip lens may be arranged in the pixels which are arranged in a matrix of 2×2 and receive infrared light.

In a configuration where a common on-chip lens is arranged, an image plane phase difference is detected by the pixels which are arranged in a matrix of 2×2 and receive infrared light, so that distance information can also be obtained together with an infrared light image.

Furthermore, any one of the red filter, the green filter, and the blue filter may be arranged to correspond to the pixel which receives red light, green light, or blue light, and a common infrared light transmission filter may be arranged in the pixels which are arranged in a matrix of 2×2 and receive infrared light. In this case, the common infrared light transmission filter can be configured by laminating at least two of the red filter, the green filter, and the blue filter.

In the imaging device of the present disclosure including the above-described various preferable configurations, image data having red, green, and blue components can be generated for each pixel. With this configuration, it is possible to increase the resolution of the image.

Alternatively, data of pixels of the same color in each pixel group may be added to generate image data. With this configuration, it is possible to improve an S/N ratio by adding pixels of the same color. In a case where the pixels which receive infrared light are arranged in a matrix of 2×2, the data of four pixels can be added to generate image data. In particular, if a pixel array part is configured to add and read the accumulated charges of a plurality of pixels, the reading speed can be increased.

Alternatively, three pixels except the pixel which receives infrared light in each pixel group can be exposed under different exposure conditions depending on the pixel. With this configuration, it is possible to acquire a high dynamic range image by using image information with different exposure conditions.

In this case, in each pixel group, the pixel which receive infrared light may be provided at the same position, a pair of scanning lines may be arranged in each pixel row, and in pixels in each image row, every pixel may be alternately connected to one scanning line and the other scanning line.

Alternatively, in this case, a pixel which receives infrared light may be provided to be adjacent to pixels which receive infrared light in adjacent pixel groups, so that the pixels are arranged in a matrix of 2×2 in every four adjacent pixel groups, a pair of scanning lines may be arranged in each pixel row, and pixels in each image row are alternately connected in units of two pixels to one scanning line and the other scanning line.

The image processing system using the imaging device of the present disclosure having the above-described various preferable configurations may further include a light source part which irradiates the subject with infrared light.

Furthermore, the image processing system of the present disclosure having the above-described preferable configuration may further include an authentication processing part that performs authentication processing on the basis of an infrared light image.

In this case, a pixel which receives infrared light may be provided to be adjacent to pixels which receive infrared light in adjacent pixel groups, so that the pixels are arranged in a matrix of 2×2 in every four adjacent pixel groups, a common on-chip lens may be arranged in the pixels which are arranged in a matrix of 2×2 and receive infrared light, and the authentication processing part may be configured to perform the authentication processing by using at least one of the infrared light image or a depth map which is generated on the basis of an image plane phase difference of the pixels which receive infrared light.

Examples of the imaging device of the present disclosure including the preferable form and configuration described above may include a CMOS image sensor and the like. The imaging device may be a front side illumination type or a back side illumination type. Then, examples of the imaging device and image processing system of the present disclosure may include a smartphone, a user interface camera for games, a biometric authentication camera, and the like. Various devices including the imaging device of the present disclosure can acquire a normal visible light image and an infrared light image without parallax and can suitably perform image processing.

Examples of a substrate on which the pixel array part is formed may include a semiconductor substrate, particularly, a silicon semiconductor substrate. The silicon semiconductor substrate absorbs light having a wavelength of about 1 μm in addition to visible light. Therefore, a photoelectric conversion element such as a photodiode or a phototransistor formed on a silicon substrate can perform photoelectric conversion on infrared light in addition to visible light.

Examples of a color filter and the infrared light transmission filter may include a filter layer which allows a specific wavelength of red, green, blue, and the like to transmit. The various filters may be configured of, for example, an organic material-based material layer using an organic compound such as a pigment and a dye.

In addition to the color filter and the infrared light transmission filter, an interlayer insulating layer, a flattening layer, and the like which configure the imaging device may be formed on the basis of known methods such as various chemical vapor deposition methods (CVD methods), coating methods, and various physical vapor deposition methods (PVD methods). Furthermore, examples of a patterning method may include a known method such as a combination of a lithography technology and an etching technology and a lift-off method.

In the imaging device of the present disclosure, an on-chip lens (OCL) may be arranged above the pixel in order to improve a light collection efficiency. The on-chip lens preferably includes a material which is a transparent material and has a high refractive index.

In a case where the interlayer insulating layer or the flattening layer used in the imaging device is configured of a transparent material, for example, an insulating material having no light absorption property, specifically, a $SiO_x$-based material (a composition material of a silicon-based oxide film), a low dielectric constant insulating material such as SiN, SiON, SiOC, SiOF, SiCN, and organic SOG, a polyimide-based resin, a fluorine-based resin, or the like may be used as the material. Basically, the on-chip lens is also similar.

The image processing system of the present disclosure may include an optical part including a lens which focuses light from the subject or the like, a light source part irradiating the subject with infrared light, and the like appropriately as necessary. The configuration of the light source part is not particularly limited, and a known light emitting element such as an infrared light emitting diode may be used.

A signal processing part which processes a signal from the imaging device may be configured to operate on the basis of physical connection by hardware or may be configured to operate on the basis of a program. The authentication processing part, a viewing processing part, a control part which controls the entire image processing system, and the like, are also similar. Furthermore, the image processing system may be integrated as a unit or may be configured as a separate body.

In the various requirements described in this specification, the existence of various variations caused by design or manufacturing, for example, is allowed. Furthermore, the drawings used in the following description are schematic. For example, FIG. 6 described later illustrates the end surface structure of the imaging device, but the ratios of width, height, thickness, and the like are not illustrated.

First Embodiment

A first embodiment relates to an imaging device according to the present disclosure and an image processing system using the imaging device.

Figure 2:
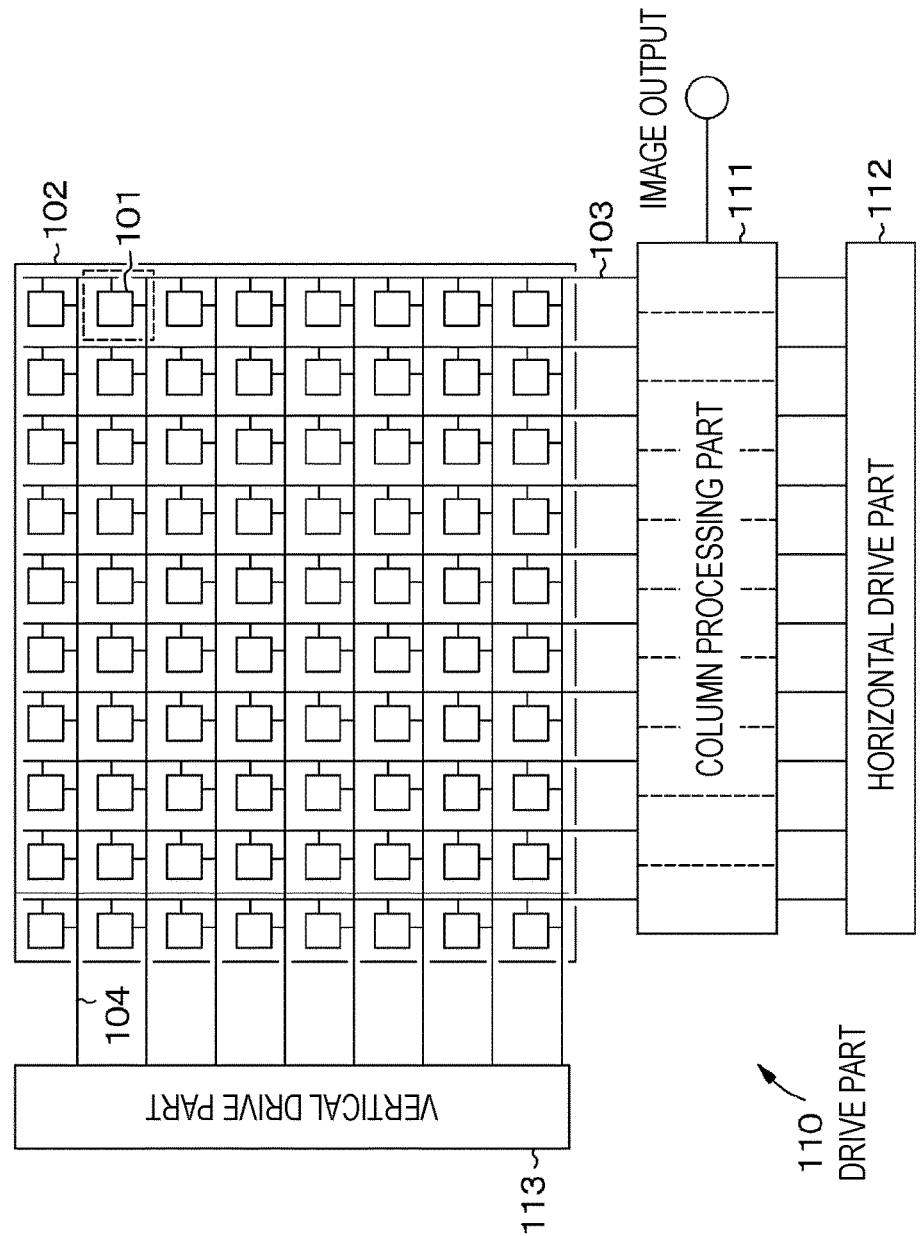
FIG. 2 is a schematic plan view for explaining a configuration of the imaging device.

FIG. 1 is a basic configuration diagram of the image processing system using the imaging device according to the first embodiment. FIG. 2 is a schematic plan view for explaining a configuration of the imaging device.

The image processing system 1 illustrated in FIG. 1 includes
an imaging device 100 which images the subject and a signal processing part 200 which processes a signal from the imaging device 100. Moreover, the image processing system includes
an optical part (imaging lens) 300 which focuses light from the subject, and
a light source part 400 which irradiates the subject with infrared light.

The operation of the entire image processing system 1 is controlled by a control part (not illustrated) or the like.

In the imaging device 100 illustrated in FIG. 2, a pixel array part 102 in which pixels 101 are arrayed in a two-dimensional array on and a drive part 110 for driving the pixel array part 102 are formed on a semiconductor substrate, for example, using silicon (Si) as a semiconductor material. The drive part 110 includes a column processing part 111, a horizontal drive part 112, a vertical drive part 113, and the like. The imaging device 100 is a so-called CMOS image sensor.

The pixel 101 includes, for example, a photoelectric conversion part using a photodiode (PD) or the like, a pixel transistor, and the like. Although depending on the configuration of the pixel, for example, the pixel transistor includes various transistors such as a transfer transistor, a selection transistor, a reset transistor, and an amplification transistor.

Next, the basic operation of the drive part 110 will be described.

The vertical drive part 113 is configured by, for example, a shift register, selects a predetermined scanning line 104, and drives the pixels 101 connected to the selected scanning line 104 in units of rows. The vertical drive part 113 selectively scans the pixel array part 102 in a vertical direction, and supplies a pixel signal based on a signal charge generated by each pixel 101 according to the amount of received light to the column processing part 111 through a signal line 103.

The column processing part 111 is arranged for every pixel column. The column processing part 111 performs a process on signals output from the pixels 101 for one row and performs processes such as correlated double sampling (CDS) and A/D conversion.

Similarly to the vertical drive part 113, the horizontal drive part 112 is also configured by, for example, a shift register. The horizontal drive part 112 sequentially selects each of the column processing parts 111 arranged in every pixel column and outputs a pixel signal.

Hereinbefore, the basic operation of the drive part 110 is described.

Note that the pixel 101 may be configured such that a binning operation of collectively handling a plurality of adjacent pixels can be performed depending on the operation mode of the imaging device 100. In the case of the binning operation, some of the pixel transistors are operated to be shared in the plurality of pixels.

Furthermore, FIG. 2 illustrates that one scanning line 104 and one signal line 103 are arranged in each pixel row and each pixel column, but this is merely an example. For example, in a case where an HDR image is acquired by one-time imaging, it is necessary to control the exposure time according to the pixel. In such a case, it becomes necessary to arrange a plurality of scanning lines in at least some pixel rows.

Next, the pixel arrangement of the pixel array part is described. In order to facilitate understanding of the present disclosure, first, a pixel arrangement of an imaging device of a reference example is described, and then the first embodiment will be described.

Figure 3:
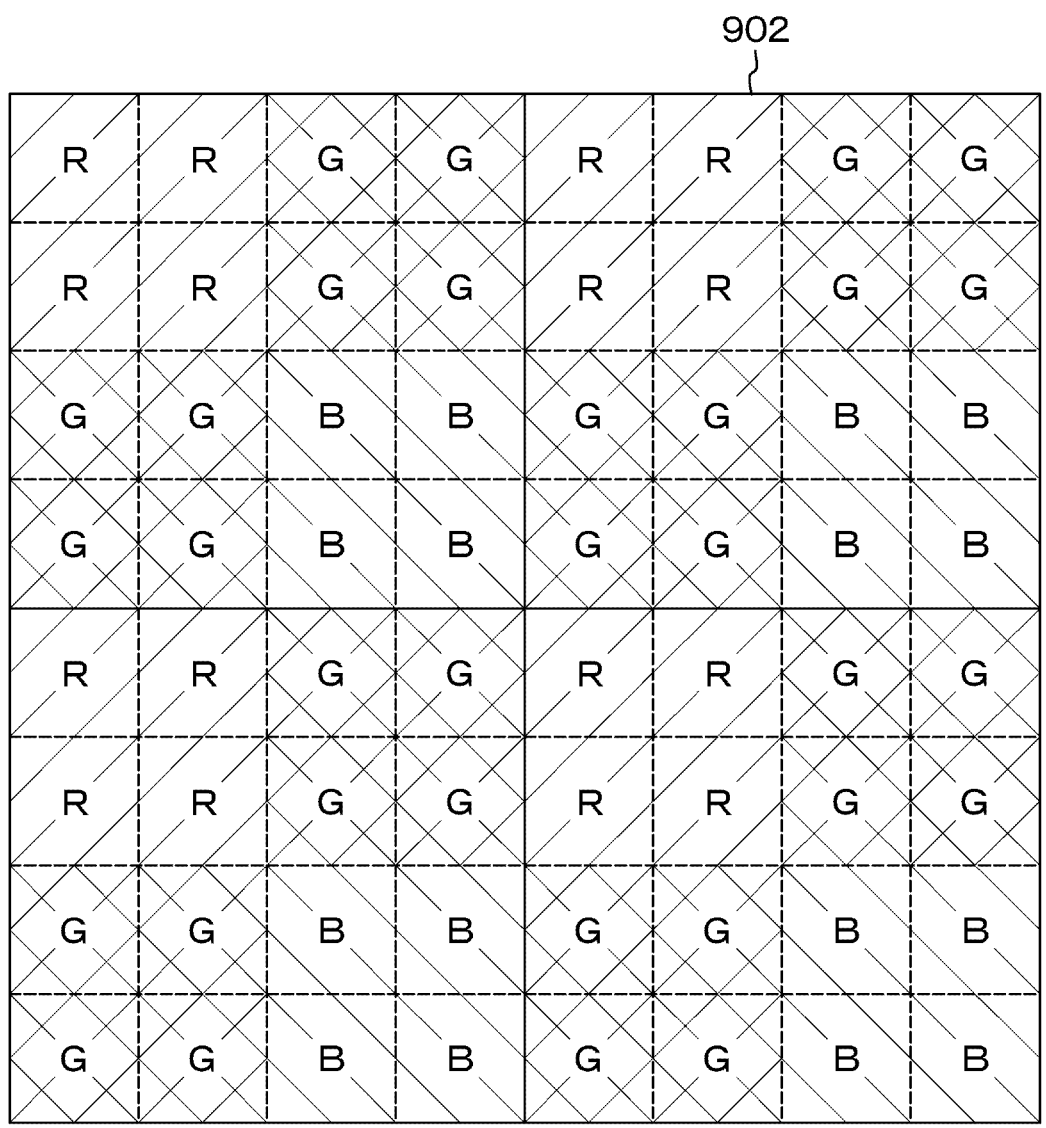
FIG. 3 is a schematic plan view for explaining a pixel array in an imaging device of a reference example.

FIG. 3 is a schematic plan view for explaining the pixel array in the imaging device of the reference example.

In a pixel array part 902 of the reference example, pixels are arrayed in a form that one pixel in a normal Bayer array is replaced with four pixels arranged in a matrix of 2×2. In the drawing, reference sign R indicates a pixel which receives red light, reference sign G indicates a pixel which receives green light, and reference sign B indicates a pixel which receives blue light. The other drawings are also similar.

This pixel array has an advantage that an image with an excellent S/N ratio can be obtained by adding and reading pixels of the same color, a high-resolution image can be obtained by performing full resolution demosaic processing, and furthermore, an image of a high dynamic range can be obtained without requiring a plurality of times of imaging by setting different exposure conditions for a plurality of pixels corresponding to one pixel in the Bayer array. However, an infrared light image and a visible light image cannot be obtained from one imaging device.

Figure 4:
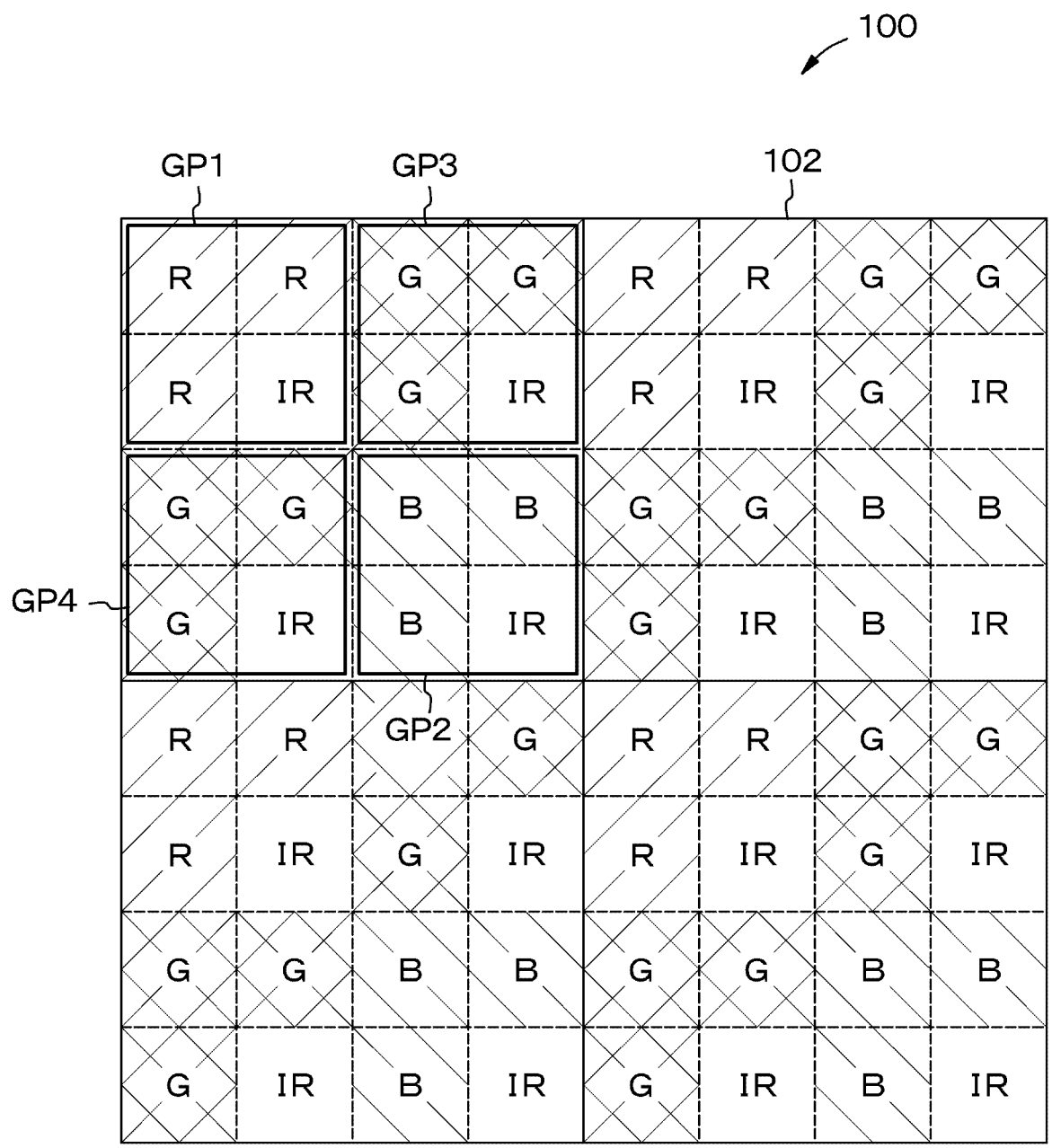
FIG. 4 is a schematic plan view for explaining a pixel array in the imaging device according to the first embodiment.

FIG. 4 is a schematic plan view for explaining the pixel array in the imaging device according to the first embodiment.

The imaging device 100 includes a pixel array part 102 in which a plurality of pixel groups each including four pixels arranged in a matrix of 2×2 is arrayed.

Specifically, as a pixel group including four pixels, there are formed a first pixel group GP1 which includes three pixels which receive red light and one pixel which receives infrared light, a second pixel group GP2 which includes three pixels which receive blue light and one pixel which receives infrared light, a third pixel group GP3 which includes three pixels which receive green light and one pixel which receives infrared light, and a fourth pixel group GP4 which includes three pixels which receive green light and one pixel which receives infrared light.

The four pixel groups including the first pixel group GP1, the second pixel group GP2, the third pixel group GP3, and the fourth pixel group GP4 are arranged to form a set of 2×2 units in which the first pixel group GP1 and the second pixel group GP2 are diagonally positioned, and the third pixel group GP3 and the fourth pixel group GP4 are diagonally positioned. A second embodiment described later is also similar. Note that the pixels which receive infrared light are represented by reference sign IR. The other drawings are also similar.

In each pixel group, the pixels which receive infrared light are provided at the same position. FIG. 4 illustrates an example of a case where the pixel which receives infrared light is provided on the lower right side of 2×2 rows in each pixel group.

Hereinbefore, the pixel array is described. Next, a relationship between the pixel array and an on-chip lens array and an arrangement relationship between various components are described.

Figure 5:
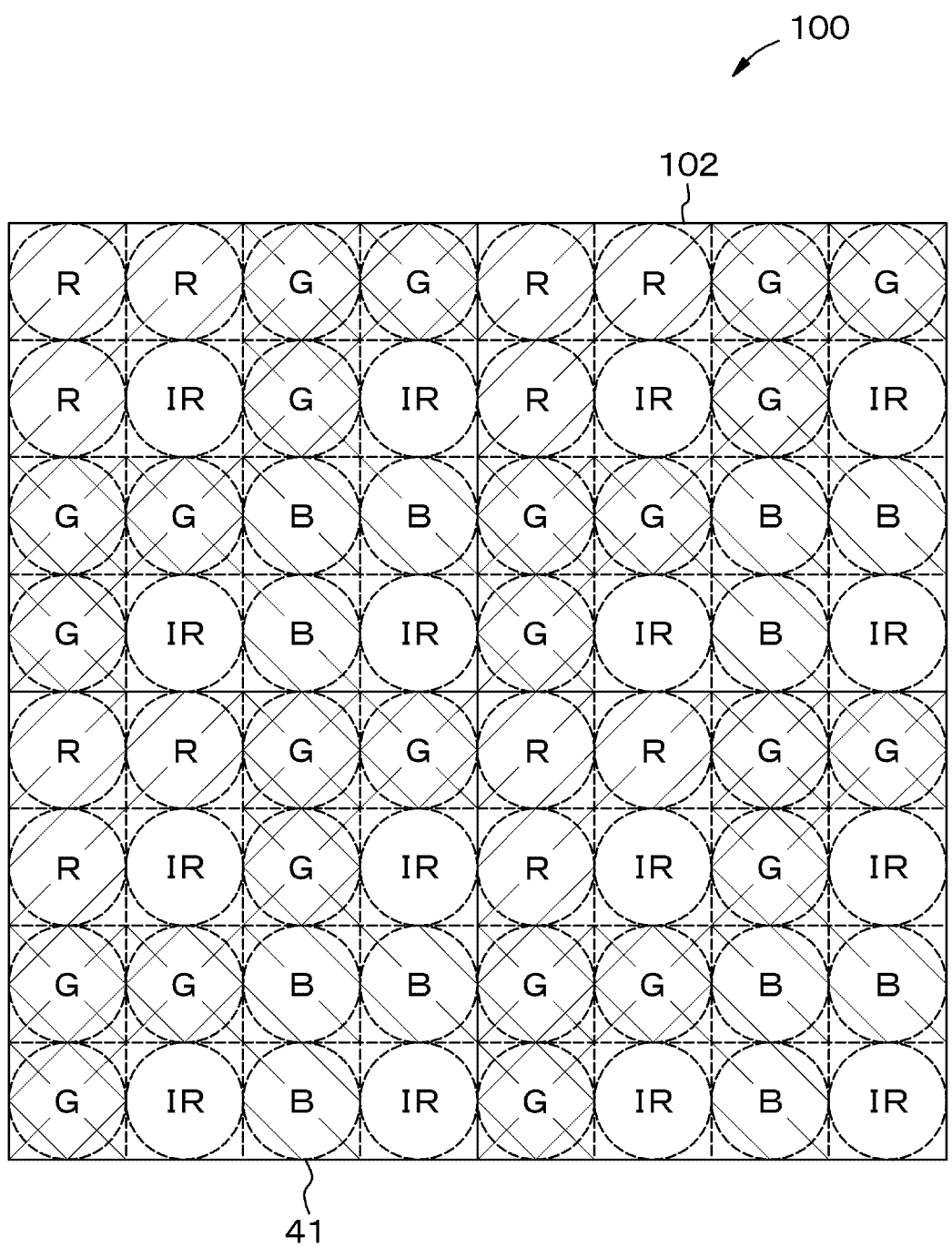
FIG. 5 is a schematic plan view for explaining a relationship between a pixel array and an on-chip lens array.
Figure 6:
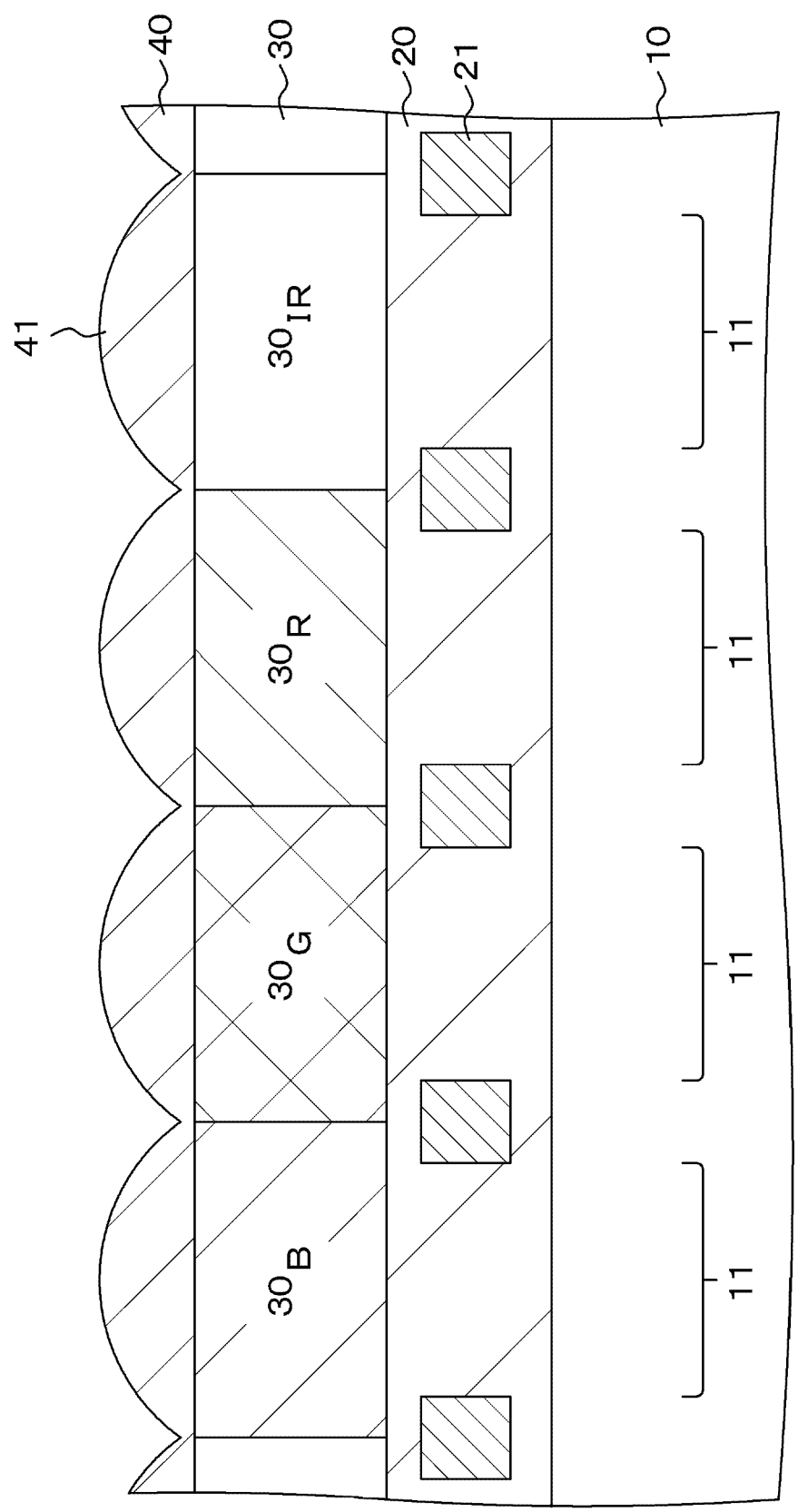
FIG. 6 is a schematic partial end view of the imaging device.

FIG. 5 is a schematic plan view for explaining the relationship between the pixel array and the on-chip lens array. FIG. 6 is a schematic partial end view of the imaging device.

As illustrated in FIGS. 5 and 6, in the imaging device 100, an on-chip lens 41 is arranged for each pixel. Furthermore, as illustrated in FIG. 6, any one of a red filter $30_R$, a green filter $30_G$, and a blue filter $30_B$ is arranged to correspond to the pixel which receives red light, green light, or blue light. Then, an infrared light transmission filter $30_{IR}$ is arranged to correspond to the pixel which receives infrared light. Note that the above filters are collectively referred to as a filter 30 in some cases.

In FIG. 6, for convenience of illustration, the components for red light, green light, blue light, and infrared light are illustrated to be arrayed in a line for convenience. The filter 30 and the on-chip lens 41 are arranged to be laminated on the light incident surface side of a photoelectric conversion part 11 included in each pixel.

The photoelectric conversion part 11 is formed on a semiconductor substrate 10 including, for example, silicon. Note that the photodiodes and the like forming the photoelectric conversion part 11, the wiring connected thereto, and the like are not illustrated. Reference sign 21 indicates a light-shielding layer which is arranged to be positioned between the photoelectric conversion parts 11 adjacent to each other, and reference sign 20 indicates a flattening layer which covers the light-shielding layer 21 and the like. Moreover, the filter 30 is formed thereon. A transparent material layer 40 is formed to cover the entire surface of the filter 30. The surface of the transparent material layer 40 is formed into a lens shape corresponding to each photoelectric conversion part 11 and configures the on-chip lens 41.

The filters 30 can be formed in such a manner that a material layer for forming these is configured by using a material having a lithographic property, and patterning is performed by exposure or the like. Alternatively, the filters can also be formed in such a manner that a photoresist is formed on the upper layer of the material layer and is left selectively by a lithography technology, and patterning is performed by processing by dry etching or the like.

Figure 7:
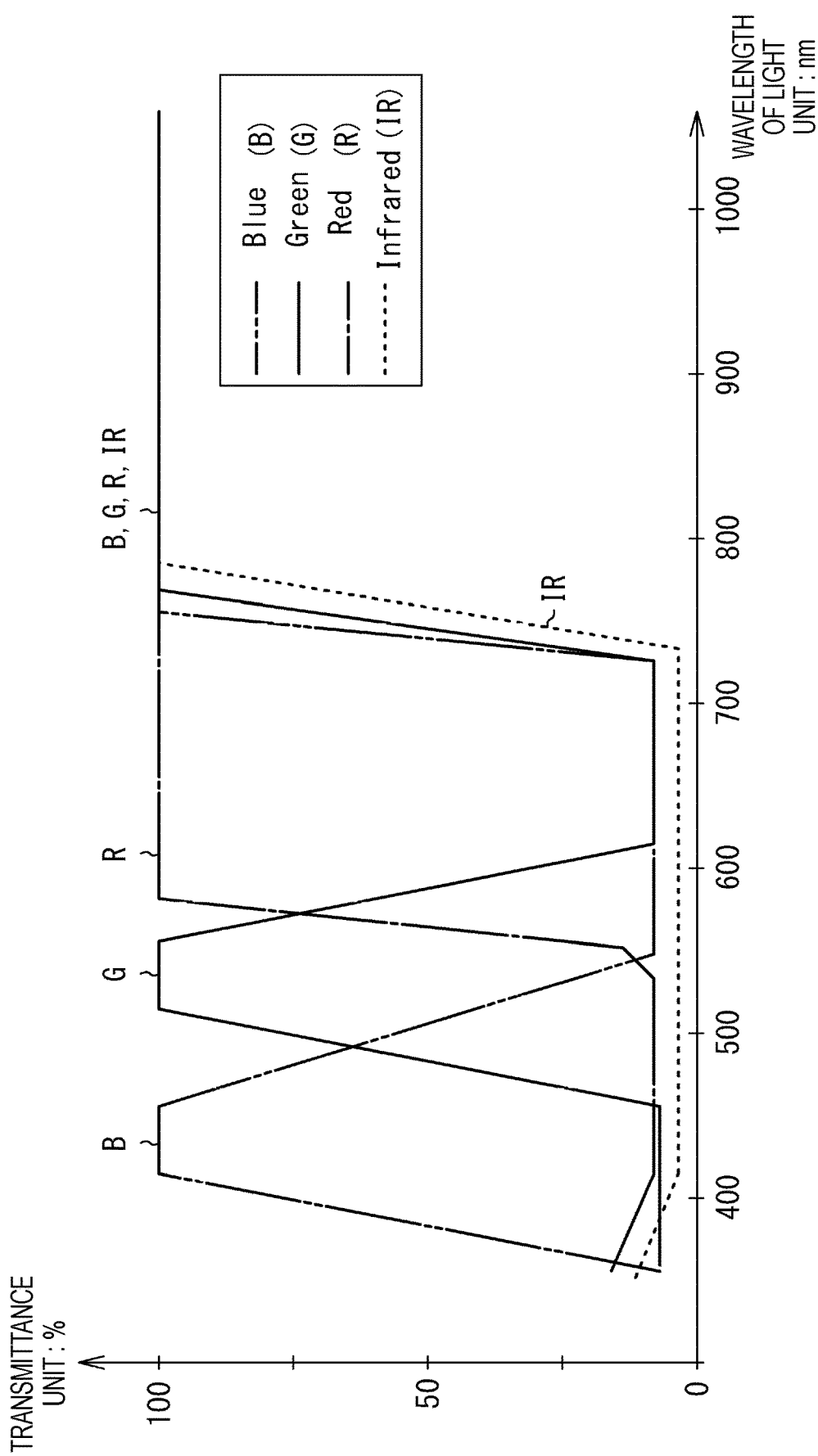
FIG. 7 is a schematic graph of a spectral transmittance of a filter.
Figure 28:
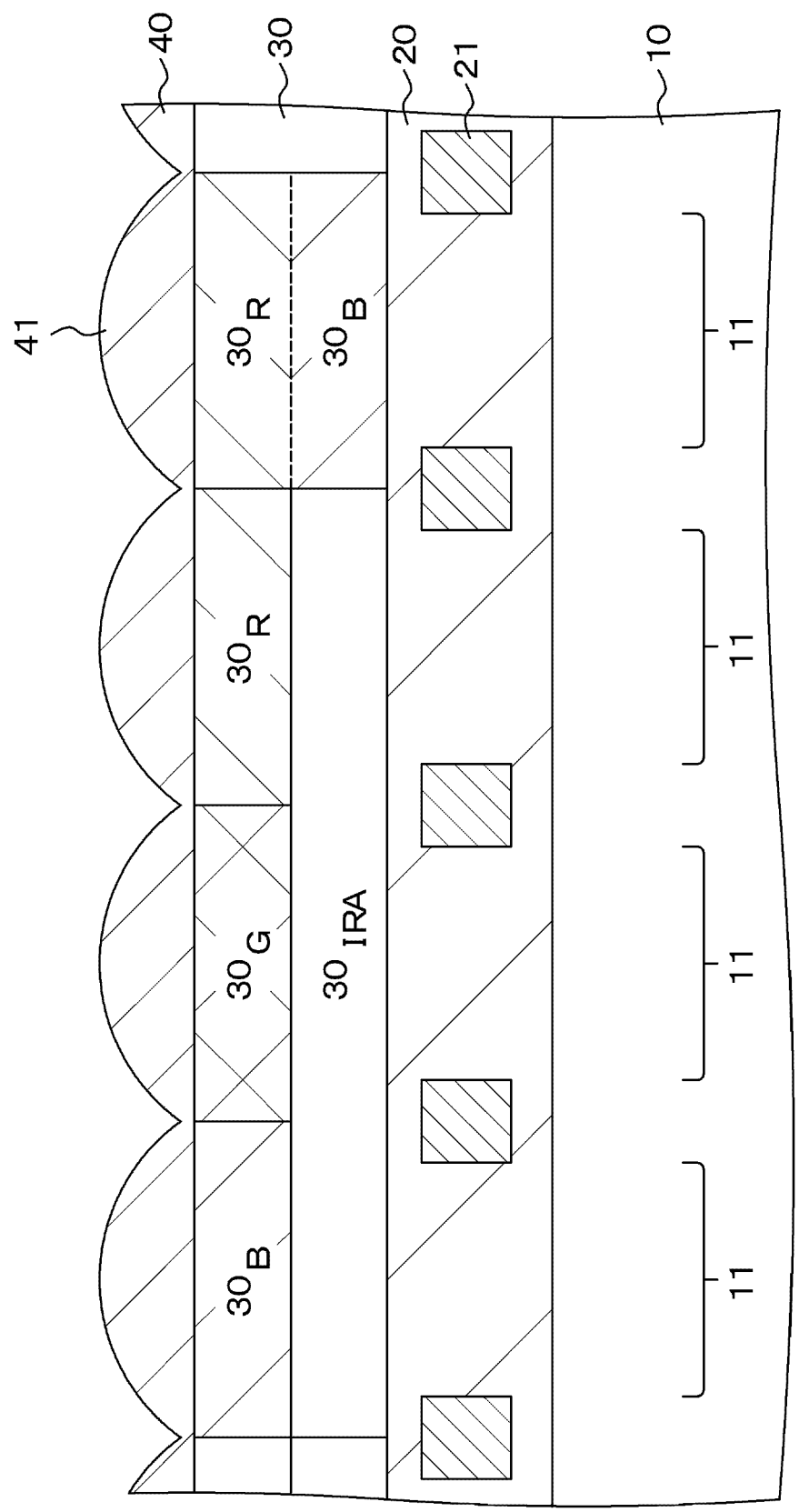
FIG. 28 is a schematic partial end view of an imaging device for explaining a filter configuration capable of reducing an influence of infrared light on a pixel which receives visible light.

FIG. 7 is a schematic graph of a spectral transmittance of a filter. As illustrated in the drawing, color filters distributed in the market for imaging devices generally exhibit a transmittance close to 100% on the wavelength side longer than 800 nm. Note that, as illustrated in FIG. 28 described later, the infrared light transmission filter may be formed by laminating at least two of a red filter, a green filter, and a blue filter.

As described above, in the imaging device 100, each pixel group includes any of three pixels for red light, three pixels for green light, and three pixels for blue light, and includes one infrared light pixel. Accordingly, it is possible to gain an advantage of the configuration in which one pixel in the Bayer array is divided into a plurality of pixels and acquire an infrared light image.

In the image processing system 1 illustrated in FIG. 1, a high-resolution image can be obtained by generating image data having red, green, and blue components for each pixel. Hereinafter, the description is given with reference to FIG. 8.

FIG. 8 is a schematic process diagram illustrating a process of image processing accompanied by full resolution demosaic processing. For convenience of illustration, a process for a total of 16 pixels in 4×4 rows including the first pixel group GP1, the second pixel group GP2, the third pixel group GP3, and the fourth pixel group GP4 is schematically illustrated. Other drawings described later are also similar.

The pixel signals from the imaging device 100 are separated into the pixel signals of the pixel for red light, the pixel for green light, and the pixel for blue light (hereinafter, these pixels are referred to as visible light pixels in some cases) and the pixel signal of the infrared light pixel (step S11: IR/visibility separation). Herein, the separated signal is referred to as RGB information or IR information. Furthermore, for convenience of description, the reference sign of the pixel is described as representing the information of the pixel in some cases. Other drawings described later are also similar.

Interpolation processing is appropriately performed on the RGB information to generate high-resolution information (step S12: RGB information interpolation). Next, Bayering processing is performed (step S14: Bayering).

As described with reference to FIG. 7, the color filter exhibits transparency to wavelengths in an infrared area in addition to target light. In FIG. 8, the Bayered information is schematically represented as (R+IR, G+IR, B+IR). Here, the description such as "+IR" indicates that the infrared light component is included in addition to the visible light component. Other drawings described later are also similar.

Interpolation processing is appropriately performed on the IR information such that the information corresponds to the normal Bayer array (step S13: IR information interpolation).

The interpolation processing in steps S12 and S13 is not particularly limited and can be performed using a known method. Here, an example of the interpolation processing in step S13 will be described with reference to the drawings.

Figure 9B:
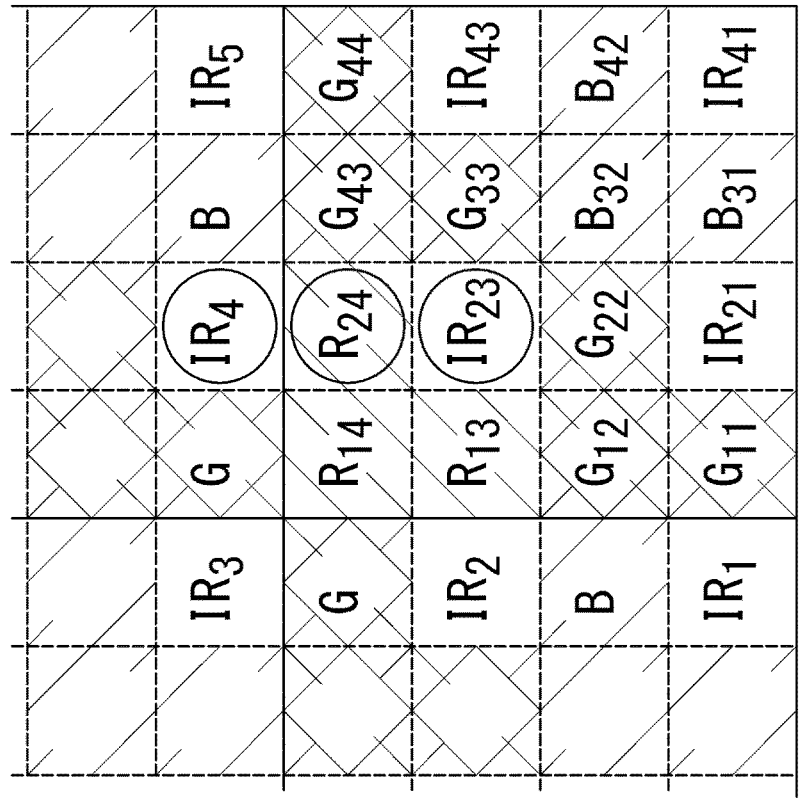
FIGS. 9A and 9B are schematic diagrams for explaining a relationship of pixels used for interpolation in the full resolution demosaic processing.
Figure 9A:
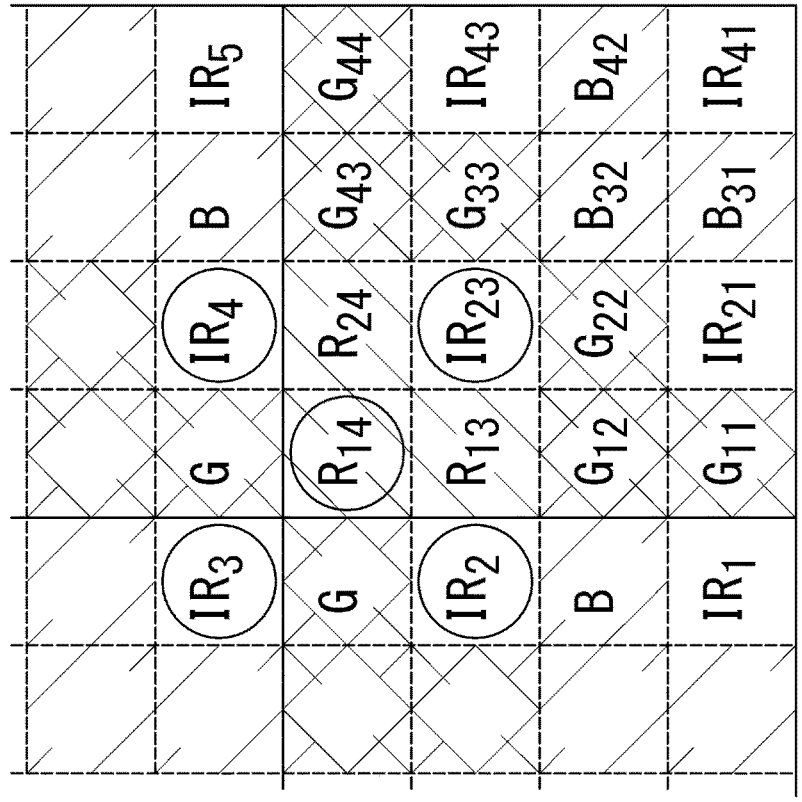

FIGS. 9A and 9B are schematic diagrams for explaining a relationship of pixels used for interpolation in the full resolution demosaic processing.

In FIG. 9A, the IR information (represented by reference sign $IR_{14}$) corresponding to the pixel indicated by reference sign $R_{14}$ can be interpolated, for example, by a calculation of $$IR_{14}=(IR_2+IR_3+IR_4+IR_{23})/4$$

by using the information of infrared light pixels (reference signs $IR_2$, $IR_3$, $IR_4$, and $IR_{23}$) positioned around the pixel $R_{14}$.

Furthermore, in FIG. 9B, the IR information (represented by reference sign $IR_{24}$) corresponding to the pixel indicated by the reference sign $R_{24}$ can be interpolated, for example, by a calculation of $$IR_{24}=(IR_4+IR_{23})/2$$

by using the information of the infrared light pixels (reference signs $IR_4$ and $IR_{23}$) positioned above and below the pixel $R_{14}$.

Hereinbefore, the interpolation processing is described. Next, processes following step S14 and step S13 are described with reference to FIG. 8.

The infrared light component contained in the RGB information after interpolation is removed by dividing the IR information after interpolation from the RGB information after interpolation (step S15: IR component removal). More specifically, the processing is performed in a state where the IR information after interpolation is multiplied by a predetermined coefficient according to the specifications of the imaging device 100 and the like. In FIG. 8, the information from which the infrared light component is removed is schematically represented as (R, G, B).

The RGB information after step S15 is the information of the normal Bayer array, and the information in which the effect of the infrared light is also reduced. On the basis of this, high-resolution image information can be obtained by performing normal Bayer processing (step S16: Bayer processing).

Hereinbefore, the process of obtaining the high-resolution image is described.

Furthermore, in the image processing system 1 illustrated in FIG. 1, an image with excellent S/N can be obtained by adding data of pixels of the same color in each pixel group to generate image data. Hereinafter, the description is given with reference to FIG. 10.

Figure 10:
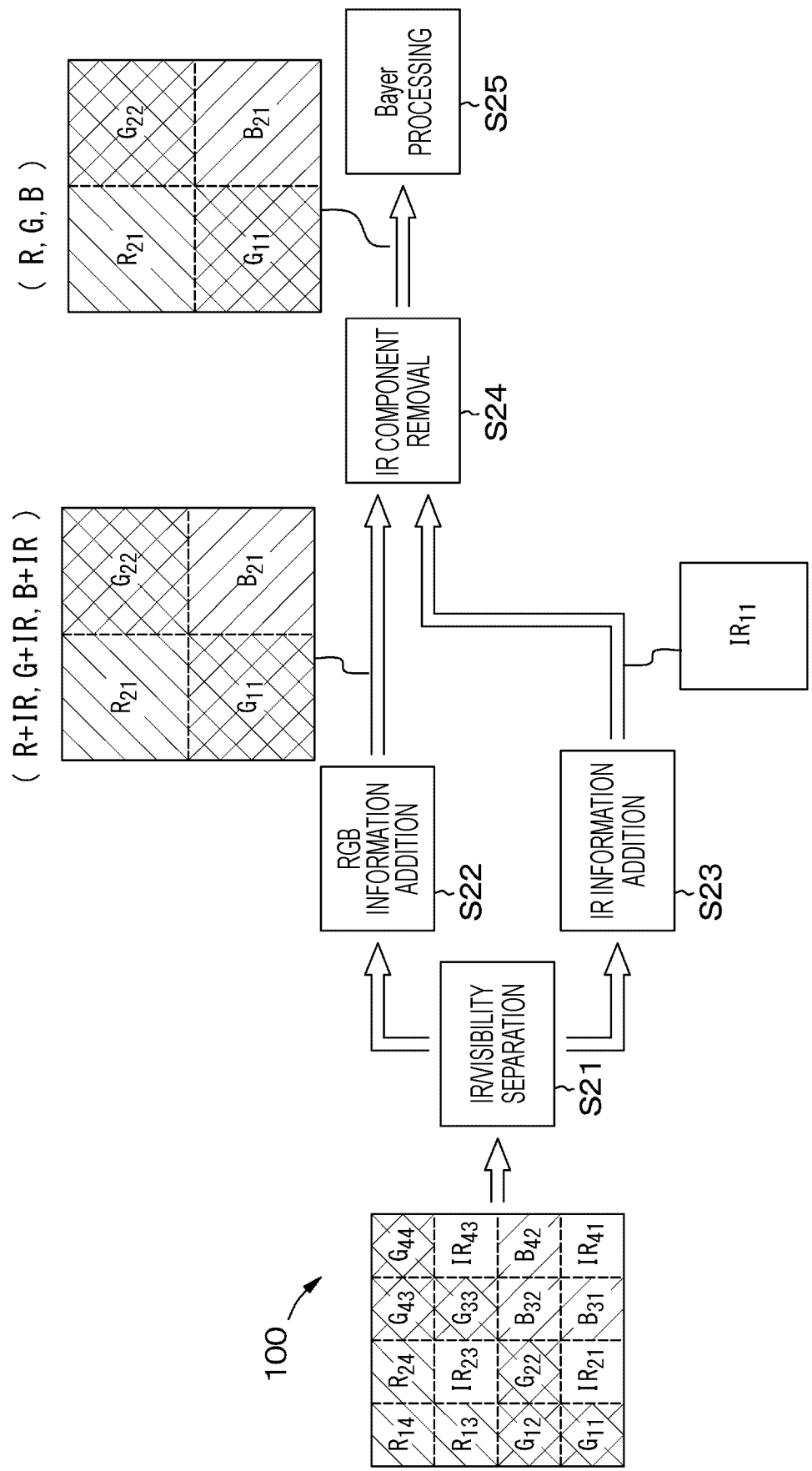
FIG. 10 is a schematic process diagram illustrating a process of image processing accompanied by pixel addition processing.

FIG. 10 is a schematic process diagram illustrating a process of image processing accompanied by pixel addition processing.

The pixel signals from the imaging device 100 are separated into the pixel signals of the visible light pixel and the pixel signal of the infrared light pixel (step S21: IR/visibility separation). This step is similar to the process described in FIG. 8, and thus the description is omitted.

Regarding the RGB information, a process of adding pixel information of the same color is performed for every pixel group (step S22: RGB information addition). By adding the information of a plurality of pixels, the S/N is improved as a result.

Regarding the IR information, a process of adding information included in the four pixel groups is performed (step S23: IR information addition).

The infrared light component contained in the RGB information after addition is removed by dividing the IR information after addition from the RGB information after addition (step S24: IR component removal). More specifically, the processing is performed in a state in which the IR information after addition is multiplied by a predetermined coefficient according to the specifications of the imaging device 100 and the like.

The RGB information after step S24 is the information of the normal Bayer array with the resolution reduced and the information in which the effect of the infrared light is also reduced. On the basis of this, the image information can be obtained by performing the normal Bayer processing (step S25: Bayer processing).

Hereinbefore, the process of obtaining the image with excellent S/N is described.

Furthermore, in the image processing system 1 illustrated in FIG. 1, an image excellent in dynamic range can be obtained when the three pixels except the pixel which receives infrared light in each pixel group are exposed under different exposure conditions depending on the pixel. Hereinafter, the description is given with reference to FIG. 11.

FIG. 11 is a schematic process diagram illustrating a process of image processing accompanied by HDR processing.

In the imaging device 100, three visible light pixels among the 2×2 pixel group are exposed under different exposure conditions. In the drawing, reference sign L indicates a pixel which is exposed for a long time, reference sign M indicates a pixel which is exposed for a medium time, and reference sign S indicates a pixel which is exposed for a short time. The long-time exposure is exposure for a longer time than the medium-time exposure. The medium-time exposure is exposure for a longer time than the short-time exposure.

Figure 12A:
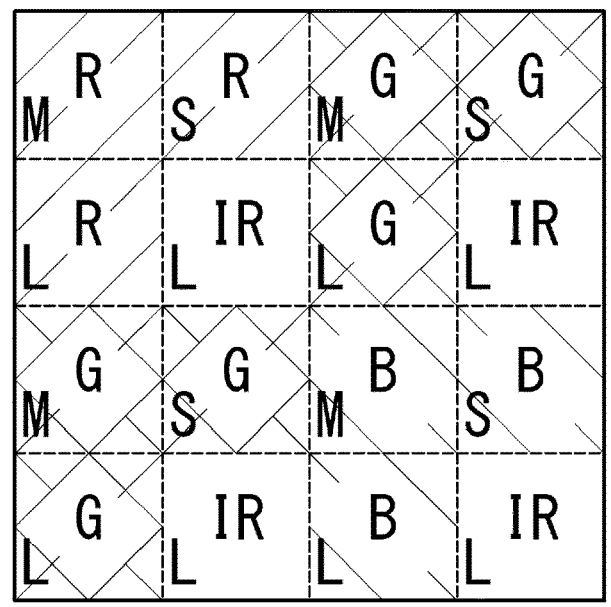
FIG. 12A is a schematic plan view for explaining an array of pixels having different exposure times.
Figure 12B:
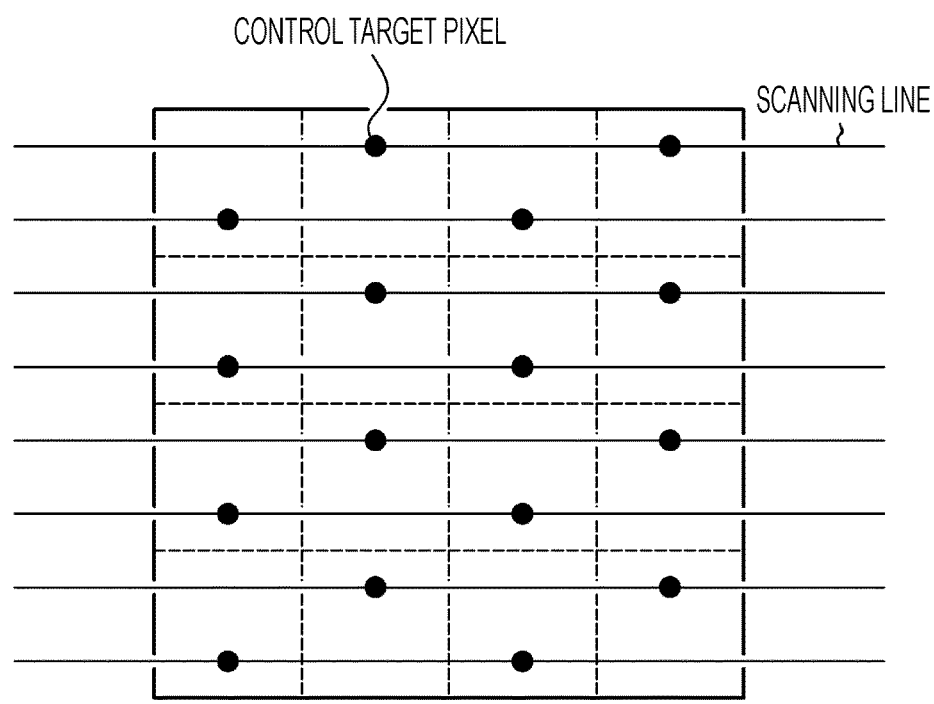
FIG. 12B is a schematic plan view for explaining a relationship between a scanning line connected to the pixel and a control target pixel.

FIG. 12A is a schematic plan view for explaining an array of pixels having different exposure times. FIG. 12B is a schematic plan view for explaining a relationship between a scanning line connected to the pixel and a control target pixel.

As illustrated in FIG. 12A, in each pixel group, the pixel which receives infrared light is provided at the same position. Then, as illustrated in FIG. 12B, a pair of scanning lines is arranged in every pixel row. In the pixels in each image row, every pixel is alternately connected to one scanning line and the other scanning line. Specifically, a first scanning line is connected to the pixel which is exposed for a short time through a contact, a second scanning line is connected to the pixel which is exposed for a medium time through a contact, a third scanning line is connected to the pixel which is exposed for a long time through a contact, and a fourth scanning line is connected to the IR pixel through a contact. In an exposure time for the IR pixel, an exposure time suitable for the IR pixel is set. As one example, the exposure time is set to be longer than the exposure time of the medium-time exposure and shorter than the exposure time of the long-time exposure. Note that the relationship between each scanning line and each contact is not limited to the configuration of FIG. 12B, and such a configuration is only required to connect the same scanning line to pixels having the same exposure time via a contact.

The pixel signals from the imaging device 100 are separated into the pixel signals of the visible light pixel and the pixel signal of the infrared light pixel (step S31: IR/visibility separation). This step is similar to the process described in FIG. 8, and thus the description is omitted.

Regarding the RGB information, the RGB information with an expanded dynamic range is synthesized in every pixel group on the basis of the pixel information having different exposure times (step S32: HDR information synthesis).

Regarding the IR information, a process of adding information included in the four pixel groups is performed (step S33: IR information addition).

The infrared light component contained in the RGB information after synthesis is removed by dividing the IR information after addition from the RGB information after synthesis (step S34: IR component removal). More specifically, the processing is performed in a state in which the IR information after addition is multiplied by a predetermined coefficient according to the specifications of the imaging device 100 and the like.

The RGB information after step S34 is the information of the normal Bayer array with the resolution reduced and the RGB information with an expanded dynamic range. On the basis of this, the image information with an expanded dynamic range can be obtained by performing the normal Bayer processing (step S35: Bayer processing).

Hereinbefore, the first embodiment is described. For example, in the image processing system of the first embodiment, a plurality of pixels can be added in low illuminance, and a full resolution signal can be generated by re-mosaic in high illuminance. Alternatively, by controlling the exposure times of the IR pixel and other pixels individually, it is possible to prevent the S/N from decreasing due to IR color mixture. Furthermore, for example, in imaging at low illuminance, it is possible to perform high image quality processing such as performing NR processing on a visible light image using the signal of the IR pixel as a guide.

Figure 13:
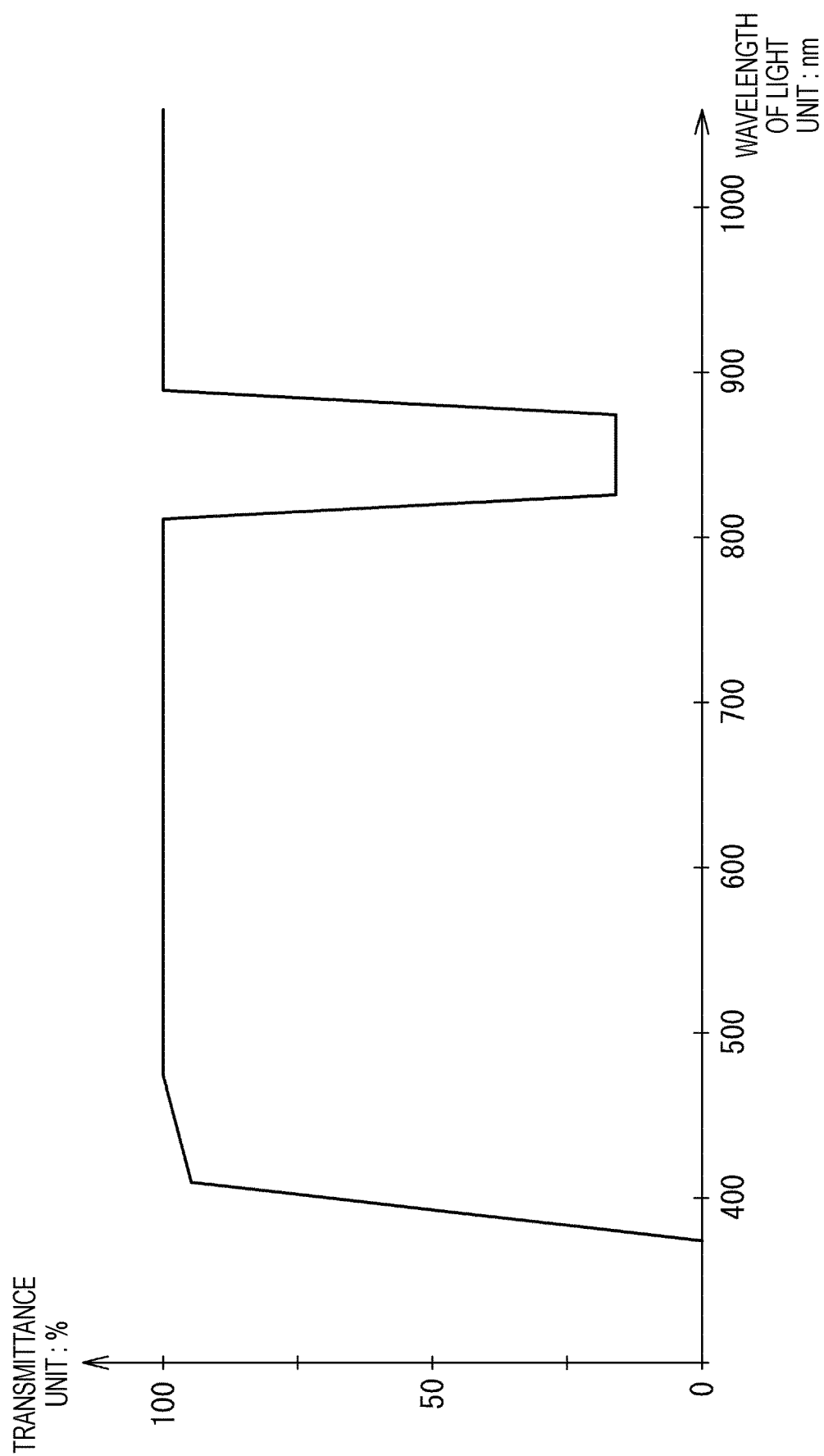
FIG. 13 is a schematic graph for explaining a spectral transmittance of a dual bandpass filter.
Figure 14:
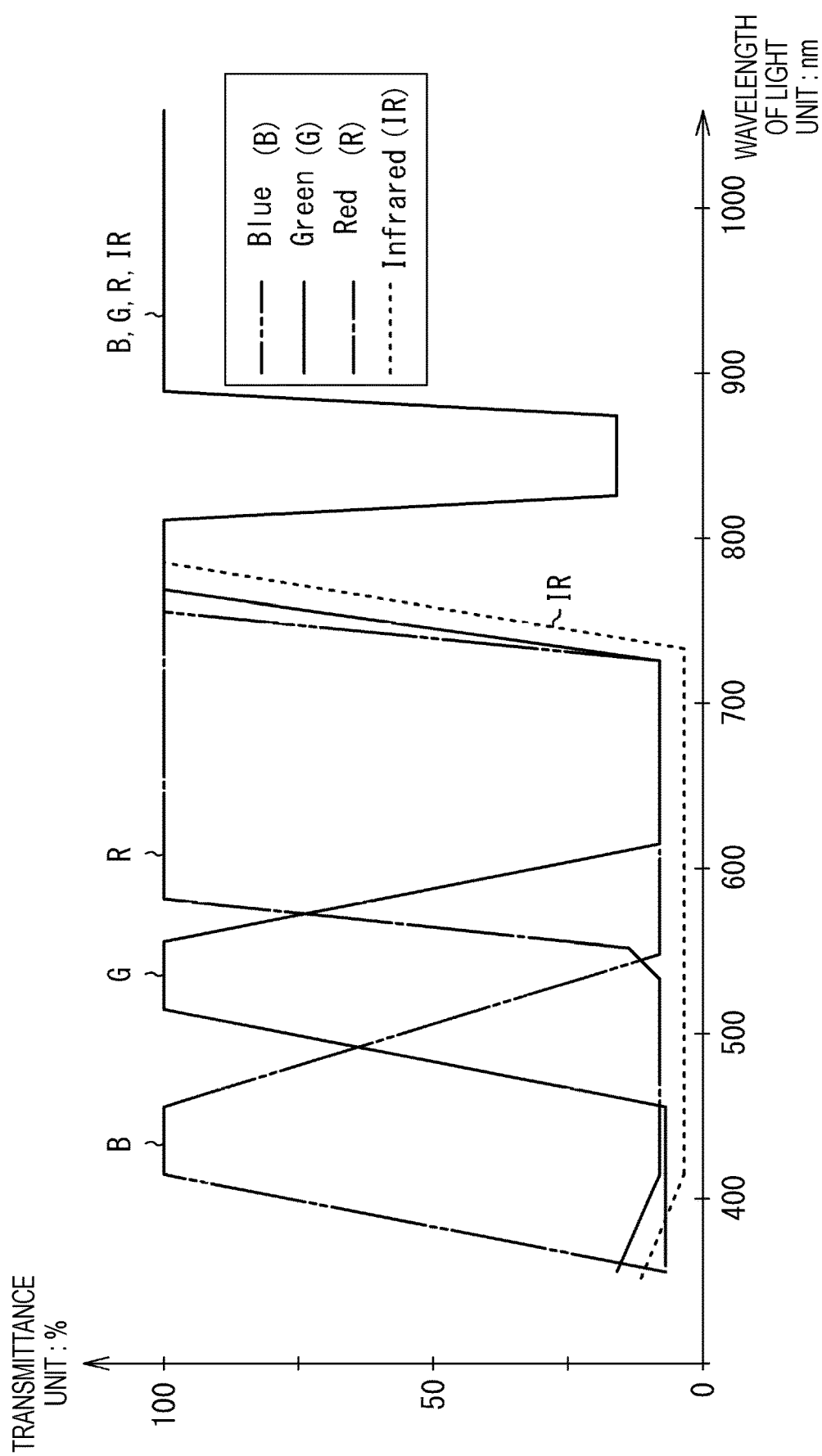
FIG. 14 is a schematic graph for explaining a spectral transmittance when the dual bandpass filter and a color filter are overlapped.

Note that in the above description, the visible light pixel is described as capturing an image containing an infrared light component. In some cases, a dual bandpass filter having a transmission band for visible light and infrared light in a predetermined range may be used to reduce the influence of infrared light components on the visible light pixels. FIG. 13 is a schematic graph for explaining a spectral transmittance of the dual bandpass filter. FIG. 14 is a schematic graph for explaining a spectral transmittance when the dual bandpass filter and the color filter are overlapped.

Second Embodiment

The second embodiment also relates to an imaging device according to the present disclosure and an image processing system using the imaging device.

The second embodiment has a configuration similar to that described in the first embodiment except that the pixel array and the on-chip lens array in the pixel array part are different. In a schematic configuration diagram of an image processing system 2 in the second embodiment, it is sufficient if the imaging element 100 in FIG. 1 is replaced with the imaging element 100A, and the image processing system 1 is replaced with the image processing system 2.

Figure 15:
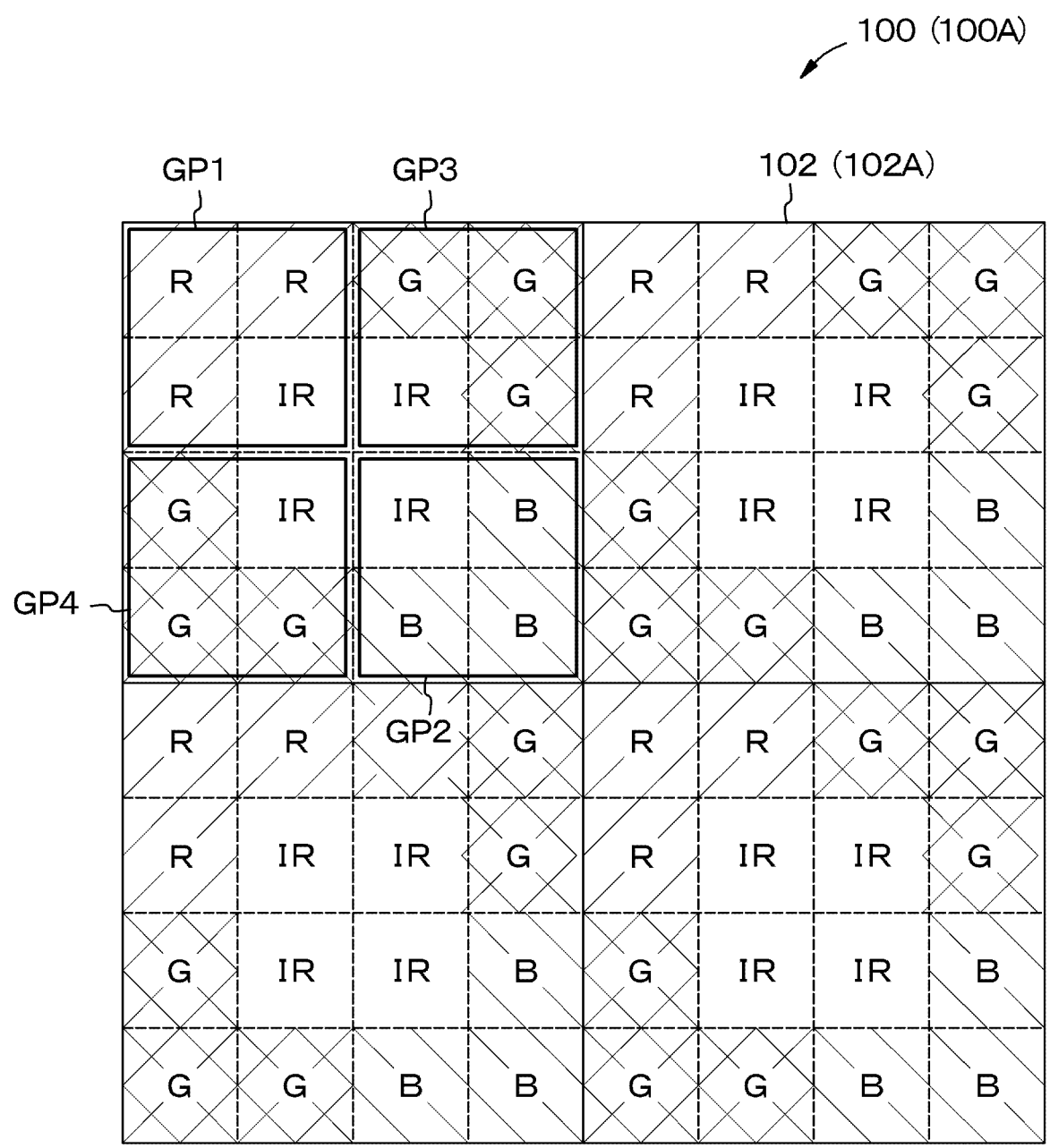
FIG. 15 is a schematic plan view for explaining a pixel array in an imaging device according to a second embodiment.

FIG. 15 is a schematic plan view for explaining the pixel array in the imaging device according to the second embodiment.

The imaging device 100A includes a pixel array part 102A in which a plurality of pixel groups each including four pixels arranged in a matrix of 2×2 is arrayed.

In the first embodiment, in each pixel group, the pixel which receives infrared light is provided at the same position. On the other hand, in the second embodiment, a pixel which receives infrared light is provided to be adjacent to pixels which receive infrared light in adjacent pixel groups, so that the pixels are arranged in a matrix of 2×2 in every four adjacent pixel groups.

Hereinbefore, the pixel array is described. Next, a relationship between the pixel array and an on-chip lens array and an arrangement relationship between various components are described.

Figure 16:
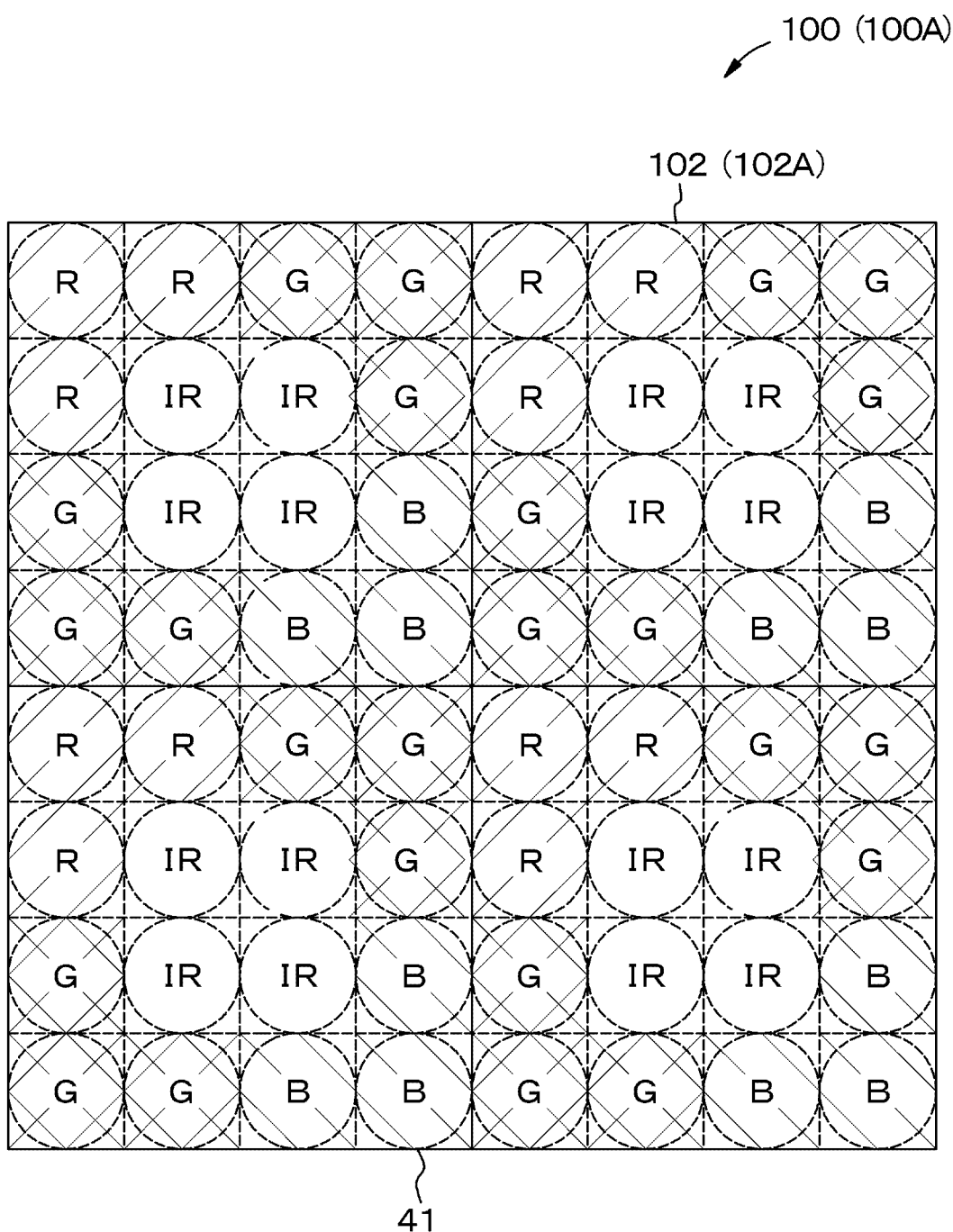
FIG. 16 is a schematic plan view for explaining a relationship between a pixel array and an on-chip lens array.

In the second embodiment, similarly to the first embodiment, the on-chip lens 41 may be arranged for each pixel. FIG. 16 illustrates this example.

Figure 17:
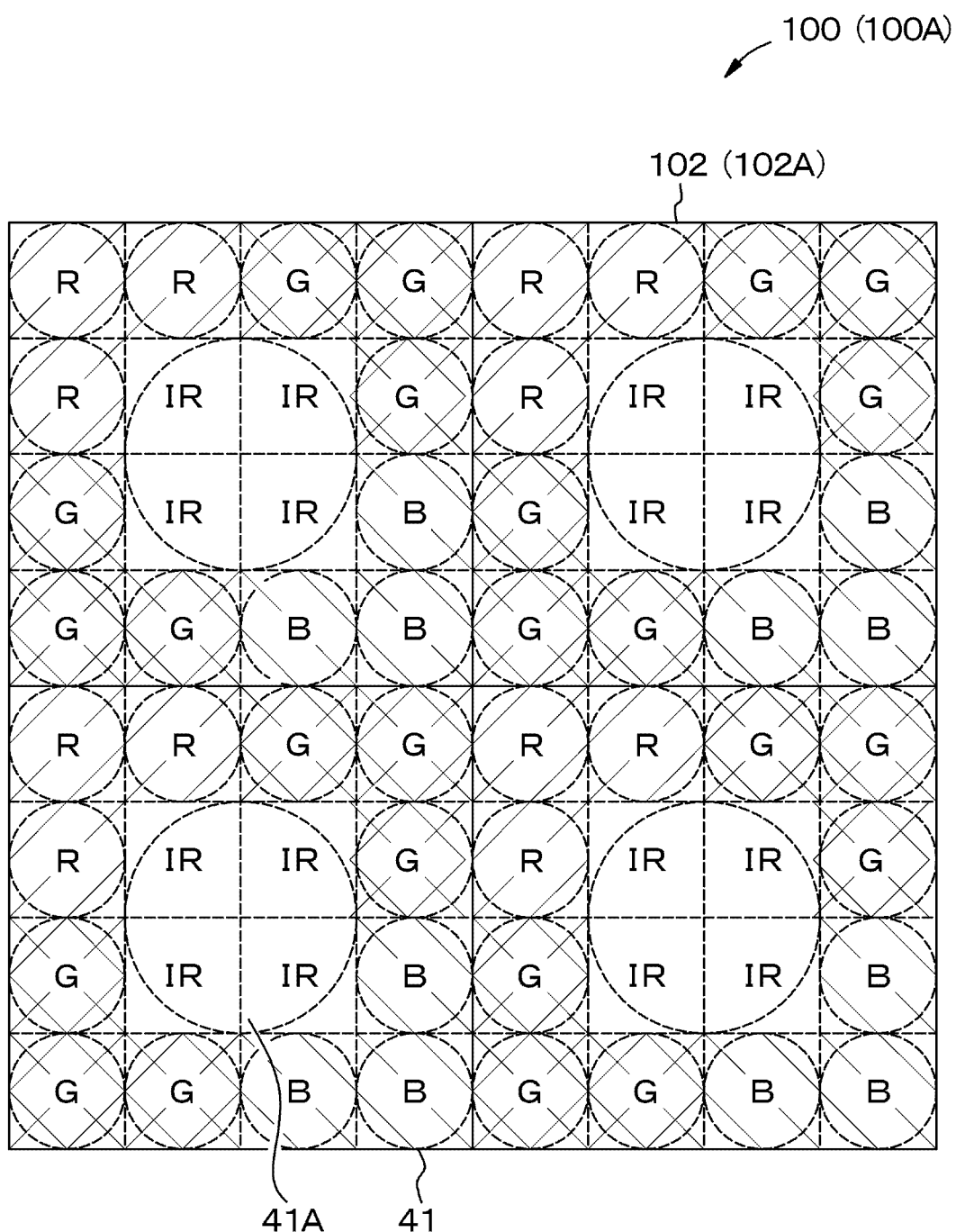
FIG. 17 is a schematic plan view for explaining the relationship between the pixel array and the on-chip lens array, following FIG. 16.
Figure 18:
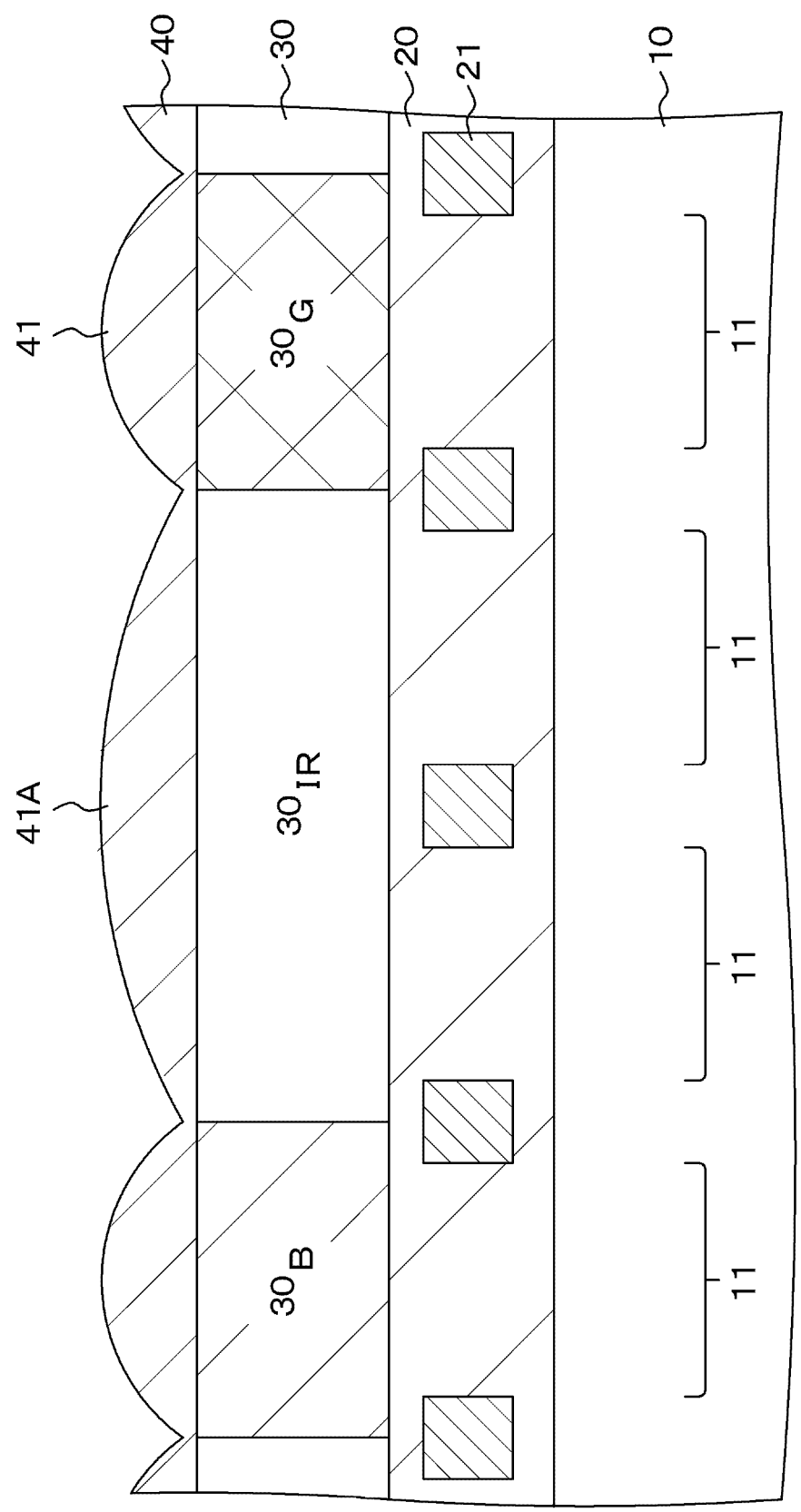
FIG. 18 is a schematic partial end view of an imaging device including the on-chip lens illustrated in FIG. 17.

Alternatively, unlike the second embodiment, an on-chip lens may be arranged in each pixel of the pixels which receive red light, green light, and blue light, and a common on-chip lens may be arranged in the pixels which are arranged in a matrix of 2×2 and receive infrared light. FIG. 17 illustrates this example and illustrates an arrangement relationship between the normal on-chip lens 41 and a common on-chip lens 41A. FIG. 18 is a schematic partial end view of the imaging device including the on-chip lens illustrated in FIG. 17.

The imaging device in which the common on-chip lens is arranged has an advantage that the distance measurement can be performed using the image plane phase difference in the IR pixel in addition to the capturing of the infrared light image. Hereinafter, in the description, the common on-chip lens is arranged in the pixels which are arranged in a matrix of 2×2 and receive the infrared light. Generally, in the color filter formation, when the color array is different between adjacent pixels, there is a possibility that the color filters may overlap between the adjacent pixels of different colors, and that portion blocks the transmission of light and becomes an invalid area. In the second embodiment, four IR pixels are arranged adjacent to each other, and thus a boundary between different color filters is reduced. Therefore, the overlap of color filters between adjacent pixels is reduced, and the sensitivity can be improved. More preferably, as illustrated in FIG. 18, the pixels which receive infrared light arranged in a matrix of 2×2 are formed by a single color filter, and the sensitivity can be improved further.

Also in the image processing system 2 according to the second embodiment, a high-resolution image can be obtained by generating image data having red, green, and blue components for each pixel.

Figure 19:
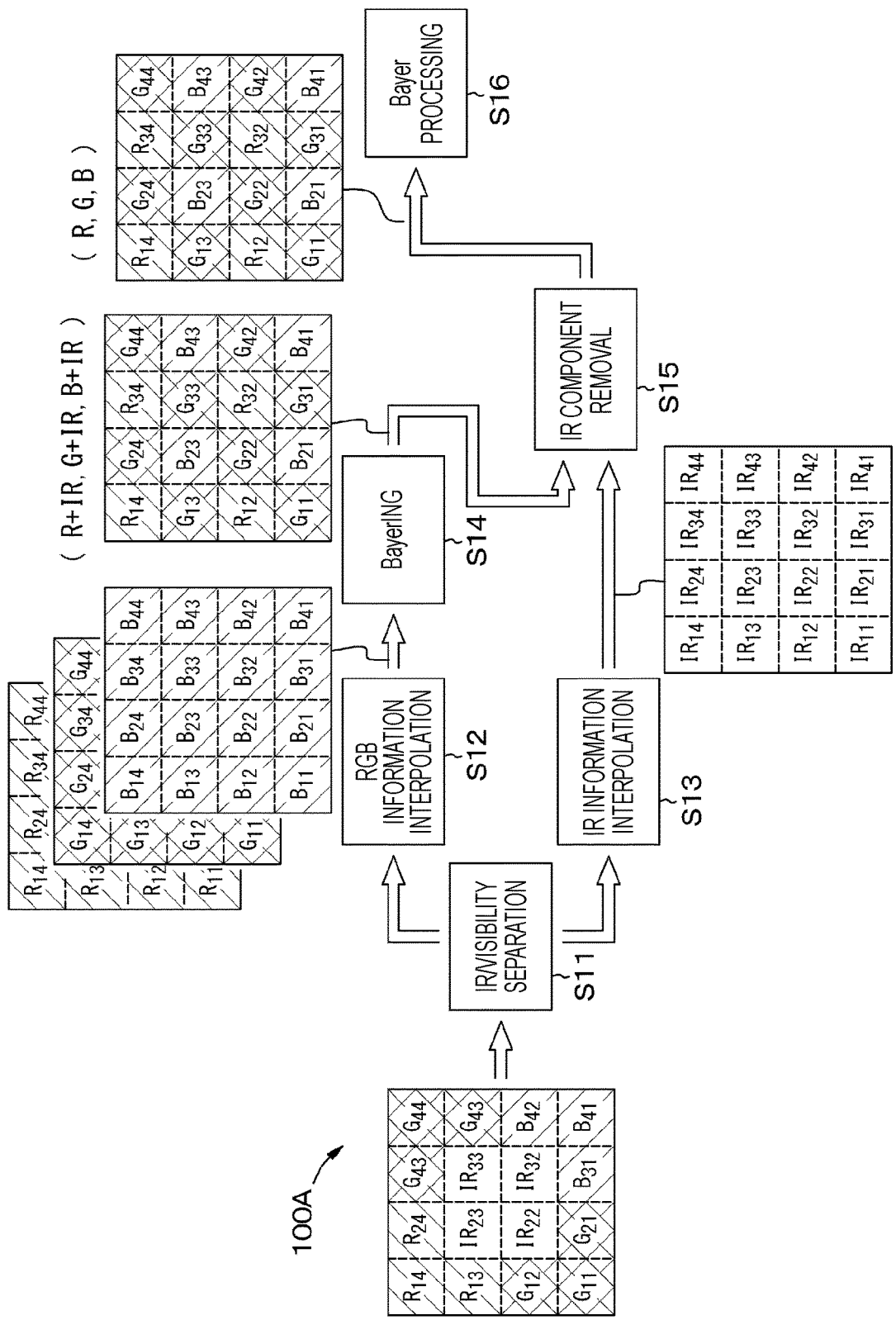
FIG. 19 is a schematic process diagram illustrating a process of image processing accompanied by the full resolution demosaic processing.

FIG. 19 is a schematic process diagram illustrating a process of image processing accompanied by the full resolution demosaic processing.

In the first embodiment, the image processing process accompanied by the full resolution demosaic processing is described with reference to FIG. 8. The process in FIG. 19 is basically similar except that the calculation formulas or the like for the interpolation of the RGB information and the interpolation of the IR information are different due to the difference in the pixel array. Therefore, the description is omitted.

Furthermore, also in the image processing system 2 according to the second embodiment, an image with excellent S/N can be obtained by adding data of pixels of the same color in each pixel group to generate image data. Hereinafter, the description is given with reference to FIG. 20.

Figure 20:
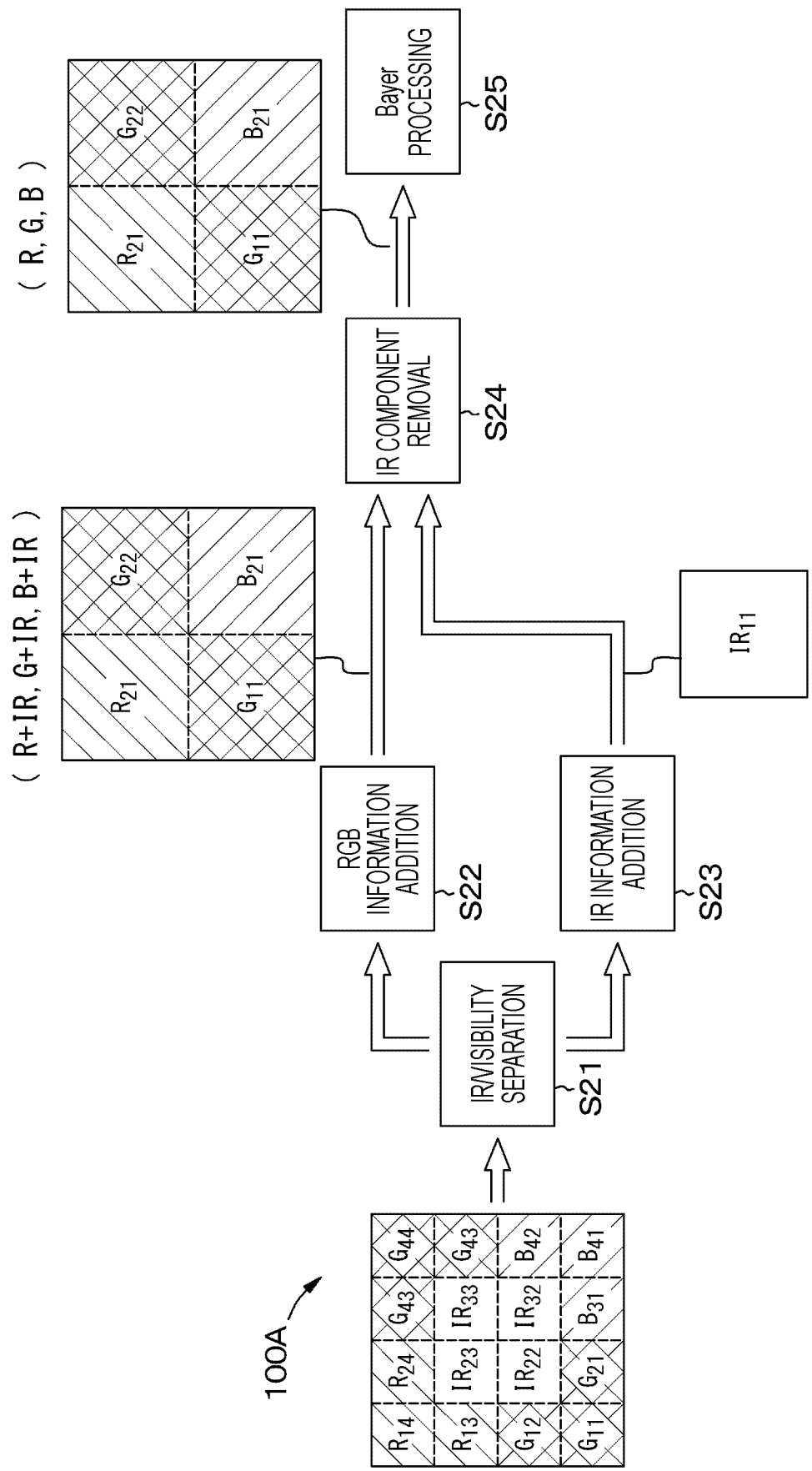
FIG. 20 is a schematic process diagram illustrating a process of image processing accompanied by pixel addition processing.

FIG. 20 is a schematic process diagram illustrating a process of image processing accompanied by pixel addition processing.

In the first embodiment, the image processing process accompanied by the pixel addition processing is described with reference to FIG. 10. The process in FIG. 20 is also basically similar but different in that the binning operation at a pixel array level can be performed on the infrared light pixel as well as the visible light pixel.

That is, in the first embodiment, IR pixels are discretely arranged. Therefore, the binning operation at the pixel array level in which a plurality of adjacent pixels is collectively handled is difficult to be performed on the IR pixel. Therefore, an operation of extracting the IR pixel information individually and then adding the information externally is required, and processing time is required.

On the other hand, in the second embodiment, the binning operation at the pixel array level can be performed on the visible light pixel and the infrared light pixel. Therefore, the operation speed can be increased. The advantages obtained by increasing the operation speed are described.

Figure 21:
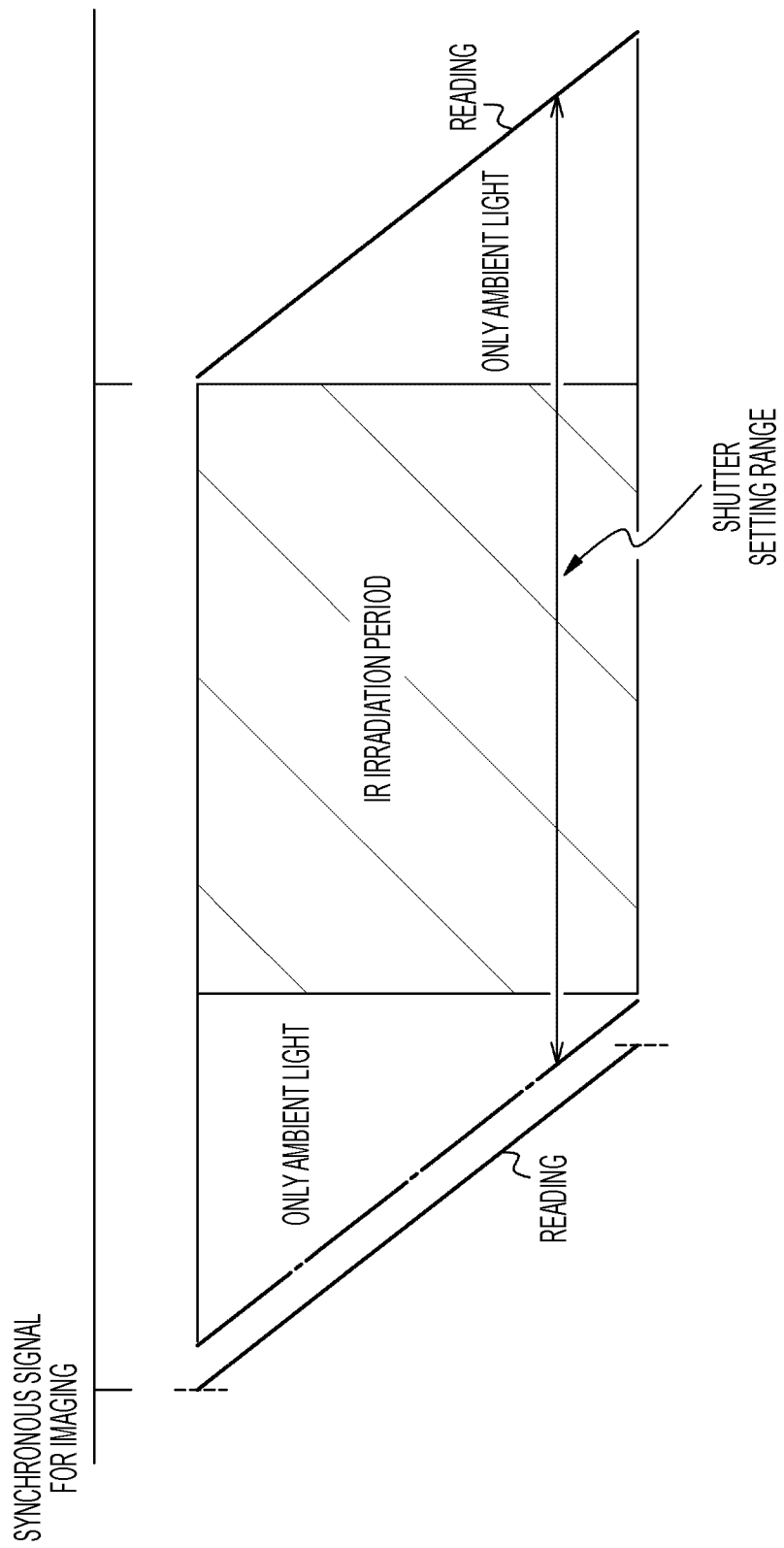
FIG. 21 is a schematic operation diagram for explaining an influence of ambient infrared light when an infrared light image is captured during a rolling shutter operation.

FIG. 21 is a schematic operation diagram for explaining an influence of ambient infrared light when the infrared light image is captured during a rolling shutter operation.

In the rolling shutter operation, the start and end of an exposure period change for each pixel row. Therefore, even in a case where the infrared light is actively emitted from a shutter start of a last row in a previous frame to a readout start of a current frame to capture an image, exposure is performed in a state where only ambient light is emitted during the period according to the readout.

Figure 22:
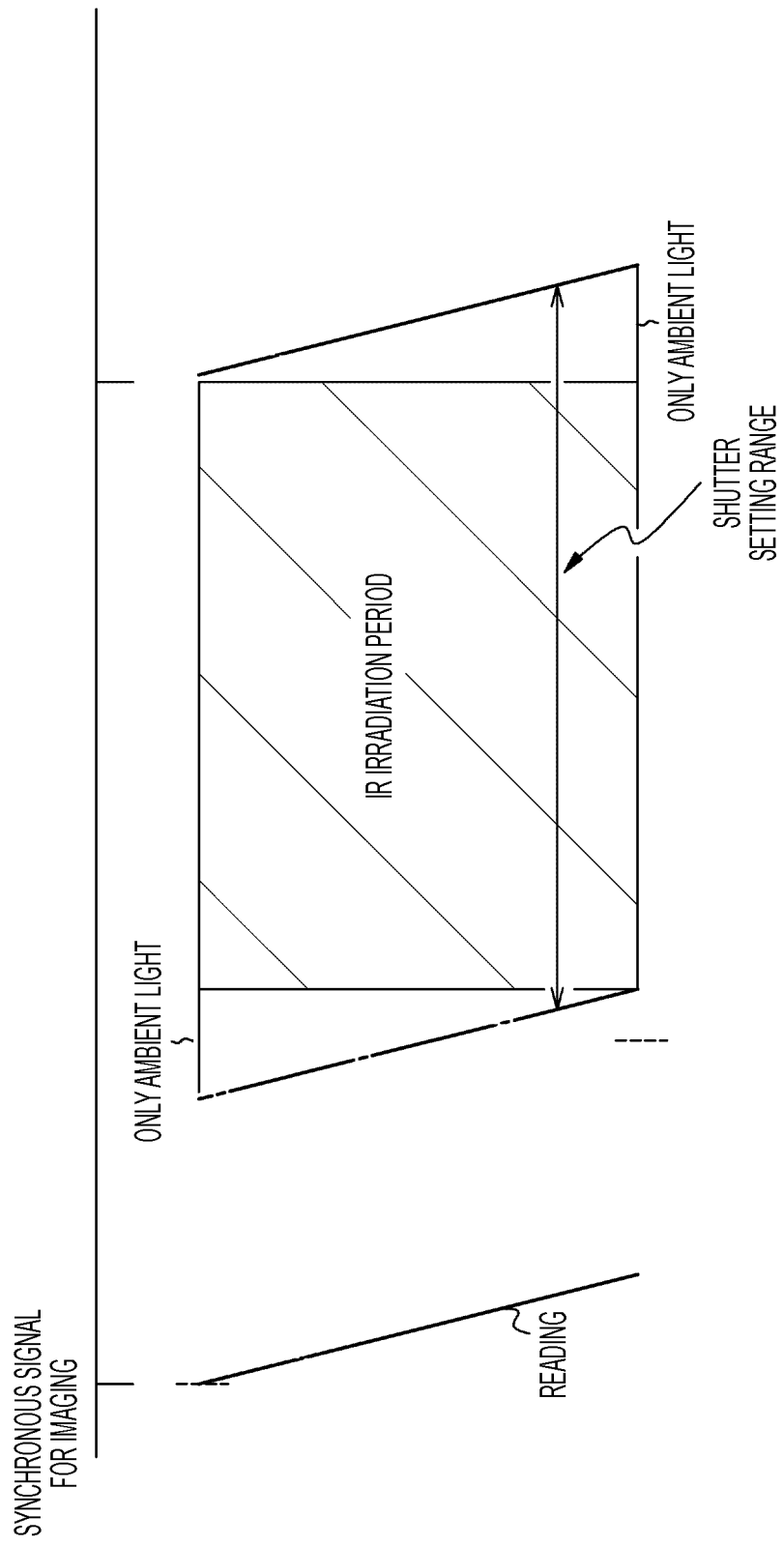
FIG. 22 is a schematic operation diagram for explaining the influence of ambient infrared light when the infrared light image is captured during the rolling shutter operation, following FIG. 21.

FIG. 22 is a schematic operation diagram for explaining the influence of ambient infrared light when the infrared light image is captured during the rolling shutter operation, following FIG. 21.

FIG. 22 illustrates a case where the reading speed is higher than that in FIG. 21. The shutter setting period is the same in FIGS. 21 and 22. However, the length of the period in which only ambient light is emitted and exposed is shorter than that in FIG. 21. Therefore, by increasing the operation speed, it is possible to reduce the influence of ambient infrared light when the infrared light image is captured.

In the description of the examples of FIGS. 21 and 22, the infrared light is actively emitted from the shutter start of the last row in the previous frame to the readout start in the current frame. In FIGS. 21 and 22, if the infrared light is actively emitted even to the portion shown as only the ambient light, the influence of the ambient infrared light can be reduced. In this case, the period of infrared light irradiation can be shortened by increasing the operation speed, and thus power consumption associated with infrared light irradiation can be reduced.

Hereinbefore, the advantages of the binning operation at the pixel array level are described above.

Furthermore, in the image processing system 2, an image excellent in dynamic range can be obtained when the three pixels except the pixel which receives infrared light in each pixel group are exposed under different exposure conditions depending on the pixel. Hereinafter, the description is given with reference to FIG. 23.

Figure 23:
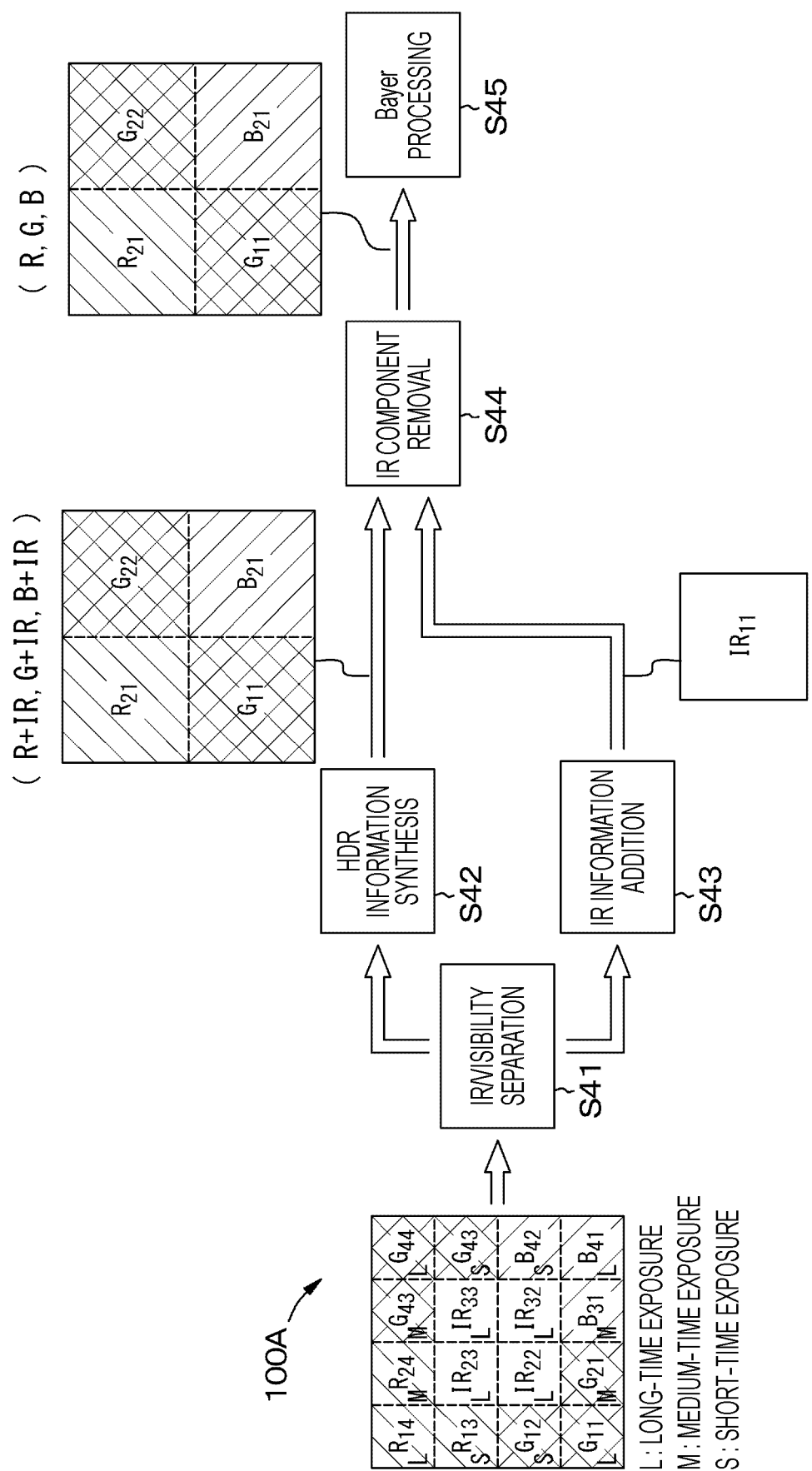
FIG. 23 is a schematic process diagram illustrating a process of image processing accompanied by the HDR processing.

FIG. 23 is a schematic process diagram illustrating a process of image processing accompanied by the HDR processing.

In the imaging device 100A, three visible light pixels in the 2×2 pixel group are exposed under different exposure conditions. In the drawing, reference sign L indicates a pixel which is exposed for a long time, reference sign M indicates a pixel which is exposed for a medium time, and reference sign S indicates a pixel which is exposed for a short time.

In the first embodiment, the image processing process accompanied by the HDR processing is described with reference to FIG. 11. The process in FIG. 23 is basically similar except that the pixel array and the like are different. Therefore, the description is omitted.

Figure 24A:
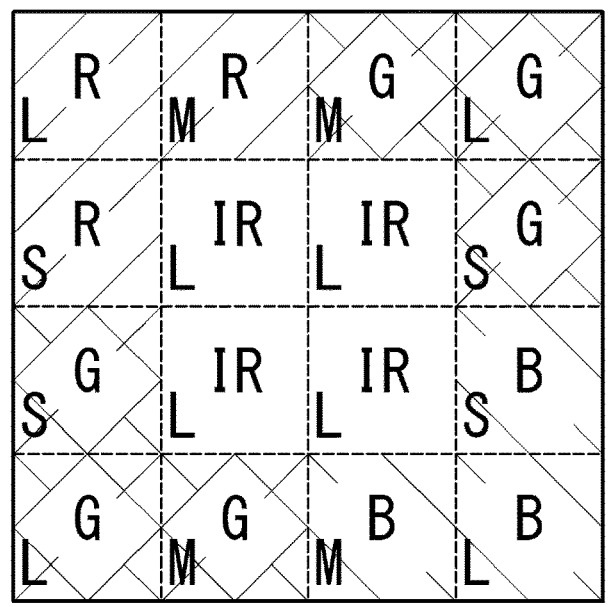
FIG. 24A is a schematic plan view for explaining an array of pixels having different exposure times.
Figure 24B:
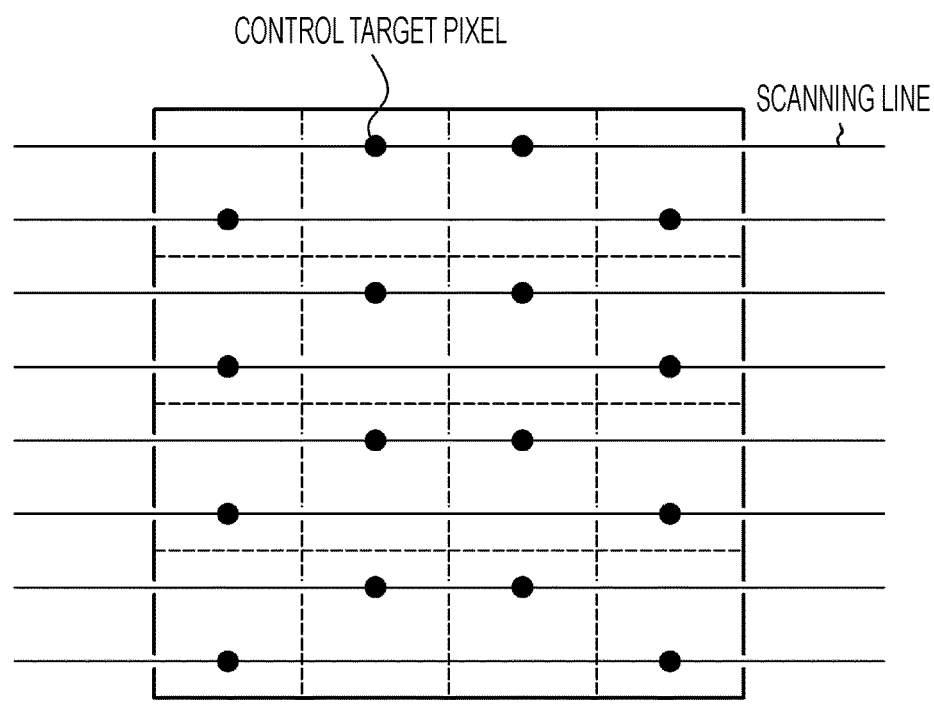
FIG. 24B is a schematic plan view for explaining a relationship between a scanning line connected to the pixel and a control target pixel.

FIG. 24A is a schematic plan view for explaining an array of pixels having different exposure times. FIG. 24B is a schematic plan view for explaining a relationship between a scanning line connected to the pixel and a control target pixel.

As illustrated in FIG. 24A, a pixel which receives infrared light is provided to be adjacent to pixels which receive infrared light in adjacent pixel groups, so that the pixels are arranged in a matrix of 2×2 in every four adjacent pixel groups. Then, as illustrated in FIG. 24B, a pair of scanning lines is arranged in every pixel row. The pixels in each image row are alternately connected in units of two pixels to one scanning line and the other scanning line. Specifically, the first scanning line is connected to the pixel which is exposed for a medium time through a contact, the second scanning line is connected to the pixel which is exposed for a long time through a contact, the third scanning line is connected to the IR pixel through a contact, and the fourth scanning line is connected to the pixel which is exposed for a long time through a contact. In an exposure time for the IR pixel, an exposure time suitable for the IR pixel is set. As one example, the exposure time is set to be longer than the exposure time of the medium-time exposure and shorter than the exposure time of the long-time exposure. Note that the relationship between each scanning line and each contact is not limited to the configuration of FIG. 24B, and any configuration may be made as long as the same scanning line is connected to pixels having the same exposure time through a contact.

Hereinbefore, the second embodiment is described. The image processing system of the second embodiment has the effect that the binning operation at the pixel array level is easy in addition to the effect of the image processing system of the first embodiment.

Third Embodiment

A third embodiment relates to an image processing system using the imaging device according to the present disclosure.

In the description of the second embodiment, in the configuration in which the common on-chip lens is arranged for the IR pixels, the distance measurement can be performed using the image plane phase difference in the IR pixel in addition to the capturing of the infrared light image. The third embodiment is an image processing system which uses the imaging device according to the second embodiment and performs authentication processing and viewing processing.

Figure 25:
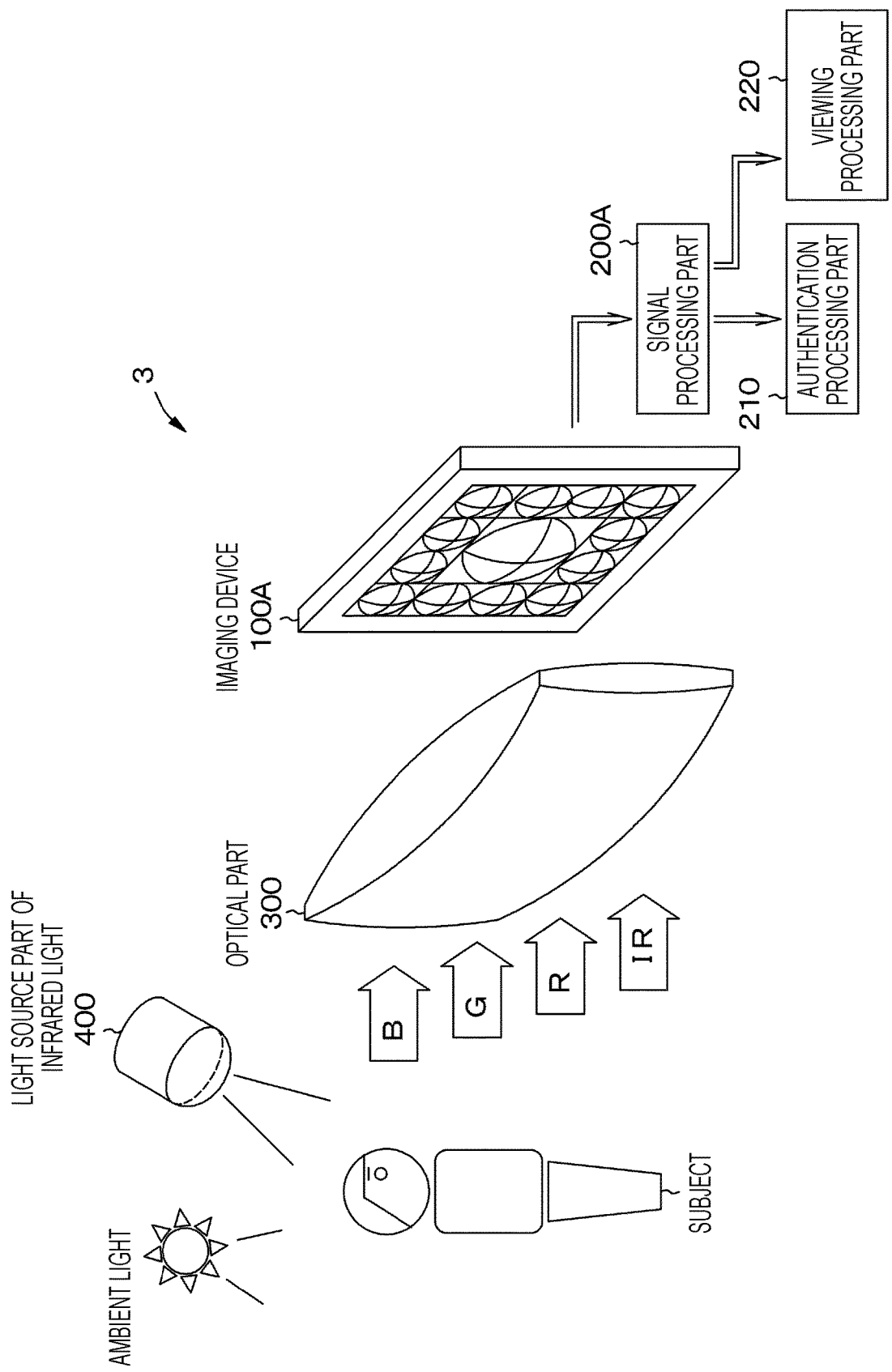
FIG. 25 is a basic configuration diagram of an image processing system which performs authentication processing and viewing processing according to a third embodiment.

FIG. 25 is a basic configuration diagram of the image processing system which performs the authentication processing and the viewing processing according to the third embodiment.

The image processing system 3 illustrated in FIG. 25 includes the imaging device 100A which images the subject, the signal processing part 200 which processes a signal from the imaging device 100A, and an authentication processing part 210 which performs authentication processing on the basis of the infrared light image. The image processing system 3 further includes a viewing processing part 220 which performs viewing processing, an optical part (imaging lens) 300 which focuses light from the subject, and a light source part 400 which irradiates the subject with infrared light. The operation of the entire image processing system 2 is controlled by a control part or the like (not illustrated).

Figure 26:
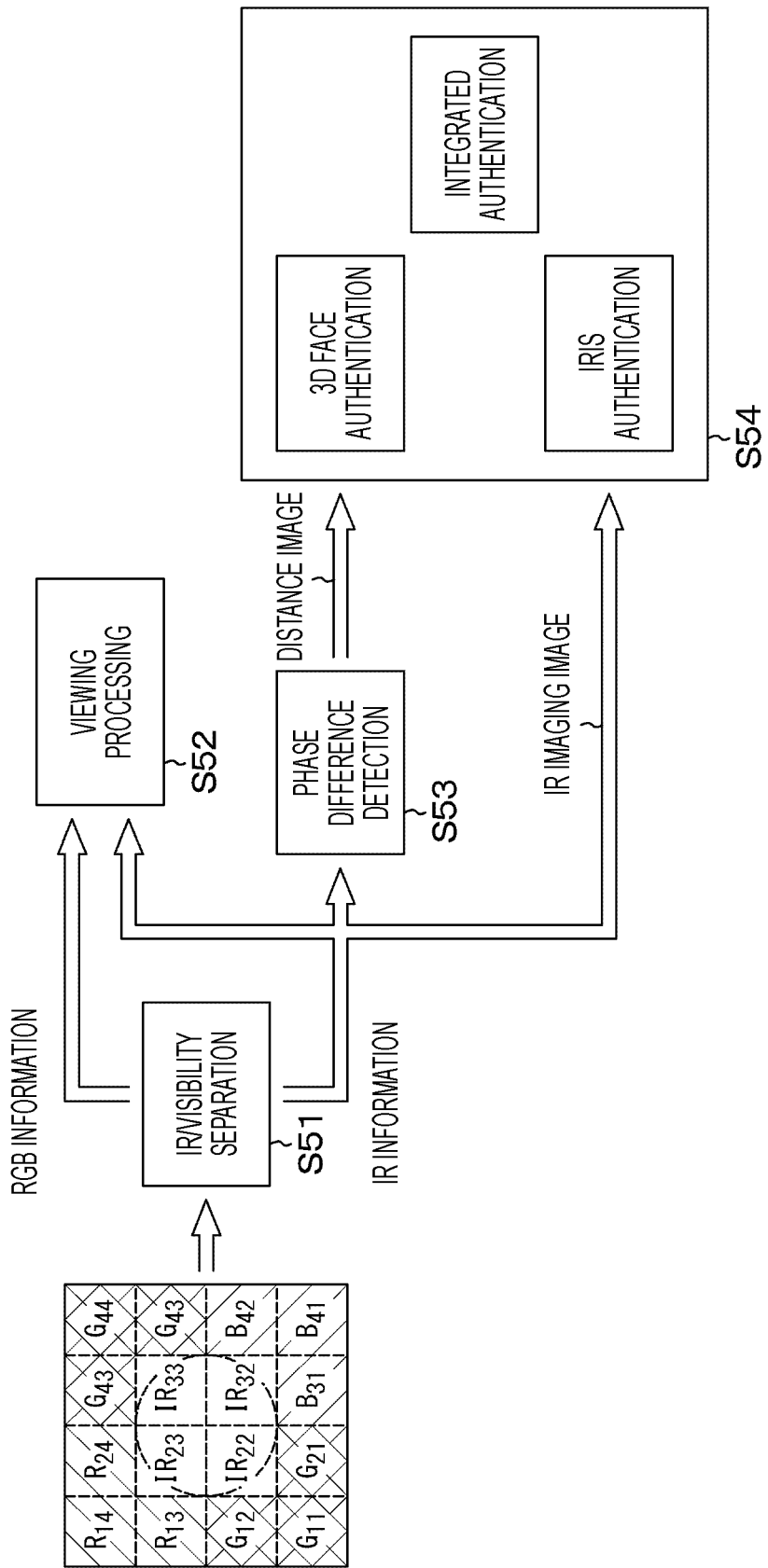
FIG. 26 is a schematic process diagram illustrating an image processing process accompanied by an authentication processing process and a viewing processing process.

FIG. 26 is a schematic process diagram illustrating an image processing process accompanied by an authentication processing process and a viewing processing process.

The pixel signals from the imaging device 100A are separated into the pixel signals of the visible light pixel and the pixel signal of the infrared light pixel (step S51: IR/visibility separation). Then, the viewing process is performed on the basis of the separated RGB information (step S52: viewing processing).

The separated IR information is used as the infrared light image. Furthermore, the phase difference is detected on the basis of the separated IR information, and the information of the distance image is generated (step S53: phase difference detection). Then, the authentication processing part 210 performs the authentication processing by using at least one of the infrared light image or the depth map generated on the basis of the image plane phase difference of the pixel which receives infrared light. For example, integrated authentication such as the 3D face authentication and the iris authentication can be performed on the basis of the information of the infrared light image and the distance image (step S54).

Note that it is sufficient if the image processing accompanied by the full resolution demosaic processing, the image processing by the pixel addition, and the image processing accompanied by the HDR processing described with reference to FIGS. 19, 20, and 23 are appropriately performed in addition to the above steps.

In a system such which emits infrared light with a specific pattern as a structure light in order to obtain information of the distance image, it is difficult to satisfactorily image the iris. That is, in such a system, it is difficult to adopt a configuration in which iris information is used for authentication.

On the other hand, the image processing system 3 does not need to emit infrared light with a specific pattern in order to obtain the information of the distance image. That is, it is sufficient if the light source part irradiates the subject with flat infrared light, and thus the iris can be imaged satisfactorily, and the iris information can be used for authentication.

Hereinbefore, the third embodiment is described. In the image processing system of the third embodiment, the distance measurement can be performed under irradiation of flat infrared light, and the sensing processing such as the iris authentication using the infrared light image, the 3D face authentication using distance information from the infrared light image, and gesture recognition can be performed at the same time as acquisition of a viewing image with a monocular configuration.

In face detection and face authentication by capturing visible light, it is difficult to determine impersonation by a photograph or the like. In this application, both the image and the depth map can be acquired in the monocular configuration, and thus it is possible to determine impersonation by a photograph or the like without adding an IR sensor additionally.

Figure 27:
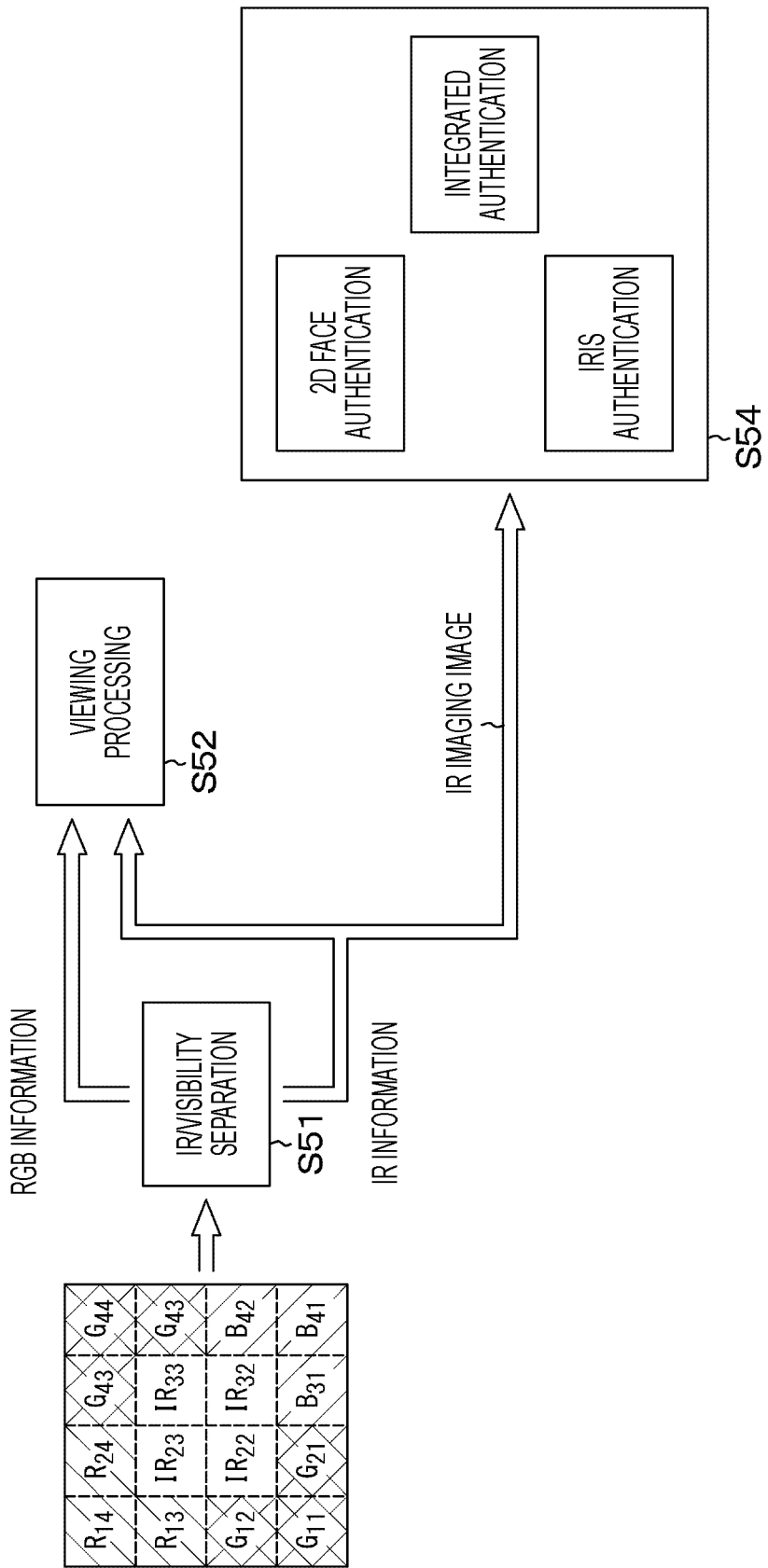
FIG. 27 is a schematic process diagram illustrating an image processing process accompanied by an authentication processing process and a viewing processing process when the imaging device according to the first embodiment is used.

Note that in the case of the image processing system using the imaging device according to the second embodiment, while the depth map cannot be generated, the iris information can be used for authentication. FIG. 27 is a schematic process diagram illustrating an image processing process accompanied by an authentication processing process and a viewing processing process when the imaging device according to the first embodiment is used.

Various Modification Examples

Next, various modification examples are described.

In the above description, the visible light pixel is influenced by infrared light due to the characteristics of the color filter. In some cases, it may be possible to reduce the degree to which the visible light pixel is affected by infrared light.

FIG. 28 is a schematic partial end view of an imaging device for explaining a filter configuration capable of reducing an influence of infrared light on the pixel which receives visible light.

In FIG. 28, the color filter configuration of the visible light pixel has a two-layer structure. More specifically, the configuration has a laminated structure of an infrared light absorption filter $30_{IRA}$ and a color filter. With this configuration, it is possible to reduce the degree to which the visible light pixel is affected by infrared light.

Furthermore, in the example of FIG. 28, the filter of the infrared light pixel is configured by laminating two types of filters for visible light. Therefore, it is not necessary to form an infrared light transmission filter separately from the color filter. As the two types of laminated filters for visible light which are used in the infrared light pixel, any two types of filters among R, G, and B transmission filters can be used. The most suitable combination among the arbitrary combinations is the combination of the R transmission filter and the B transmission filter illustrated in the example of FIG. 28. The reason is that, as shown by the spectral characteristics in FIG. 7, the transmission area of the R transmission filter and the transmission region of the B transmission filter have the smallest overlap in the visible light area. Therefore, by combining the R transmission filter and the B transmission filter, it is possible to more effectively block visible light and transmit infrared light. Note that the filter for visible light used in the infrared light pixel is not limited to two types of laminated filters, and three or more types of filters for visible light may be laminated.

Next, a modification example of the pixel arrangement will be described.

Figure 29:
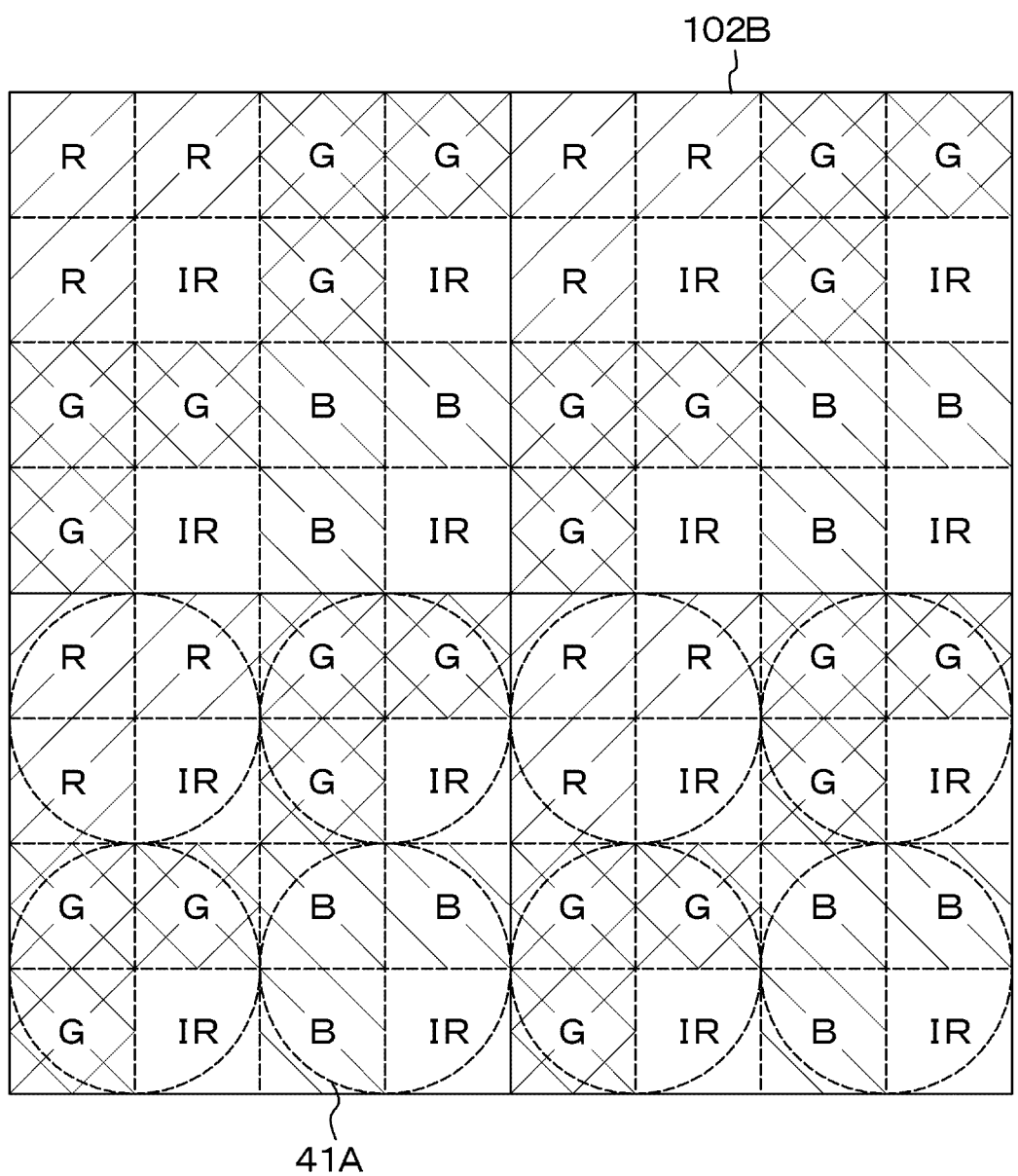
FIG. 29 is a schematic plan view for explaining a first modification example of the pixel array.

FIG. 29 is a schematic plan view for explaining a first modification example of the pixel array.

FIG. 29 is a modification of the pixel array of the first embodiment in which a common on-chip lens is provided in every pixel group. Note that although 8×8 pixels are illustrated in the drawing, the upper 8×4 pixels are illustrated only in the pixel arrangement, and the lower 8×4 pixels are illustrated with the on-chip lens arrangement superimposed on the pixel arrangement. FIGS. 30, 31, 32, 33, and 34 described later are also similar.

Figure 30:
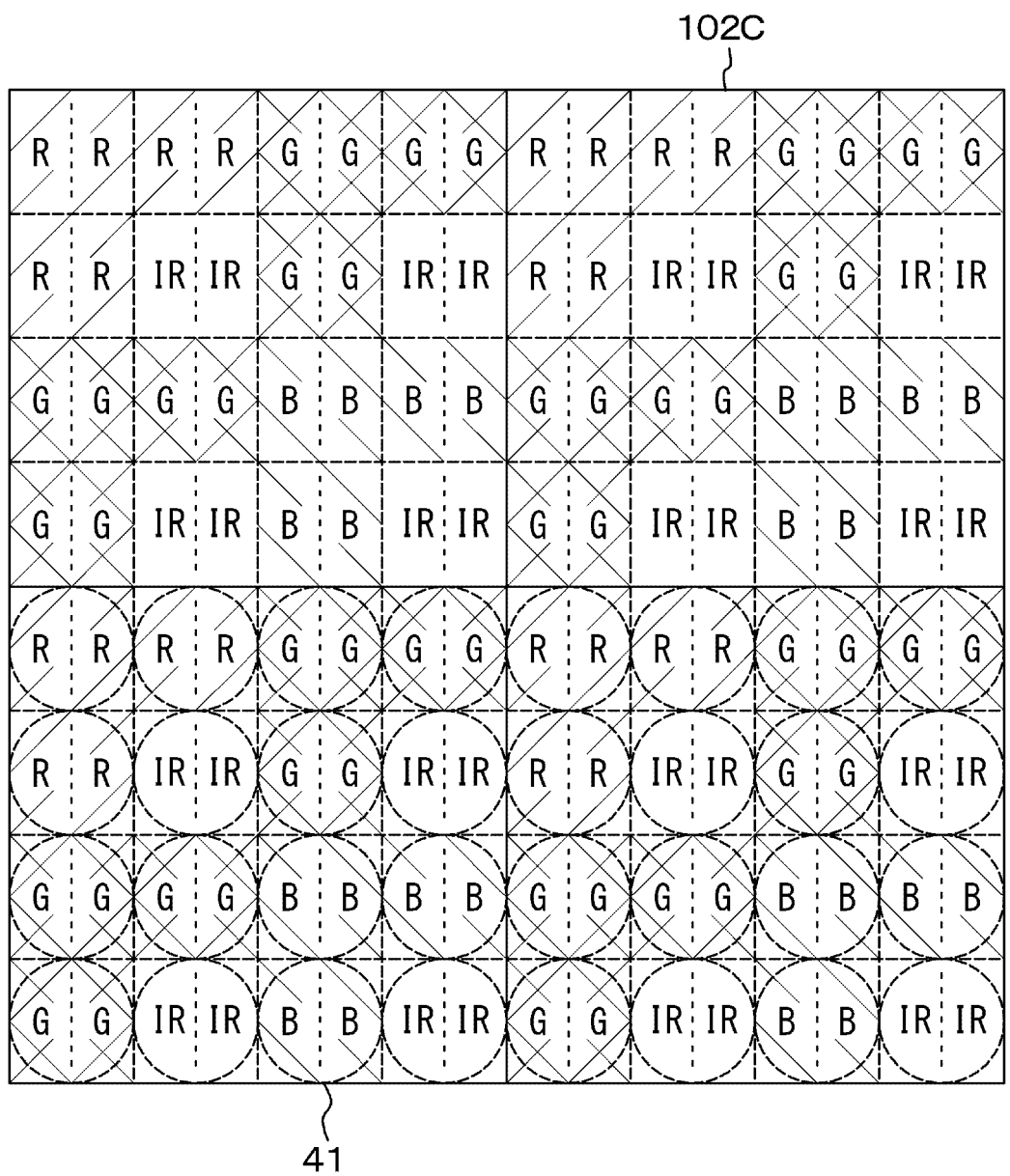
FIG. 30 is a schematic plan view for explaining a second modification example of the pixel array.

The configuration of FIG. 30 has an advantage that an image plane phase difference can be detected in capturing visible light. Therefore, for example, the 3D face authentication using the distance information of visible light and the face image of infrared light is possible. Furthermore, similarly, the iris authentication is also possible.

FIG. 30 is a schematic plan view for explaining a second modification example of the pixel array.

FIG. 30 is a modification of the pixel array of the first embodiment which is configured such that one pixel includes two photoelectric conversion parts. An on-chip lens is provided in each pixel.

The configuration of FIG. 30 has an advantage that one pixel includes two photoelectric conversion parts, and the image plane phase difference can be detected.

Figure 31:
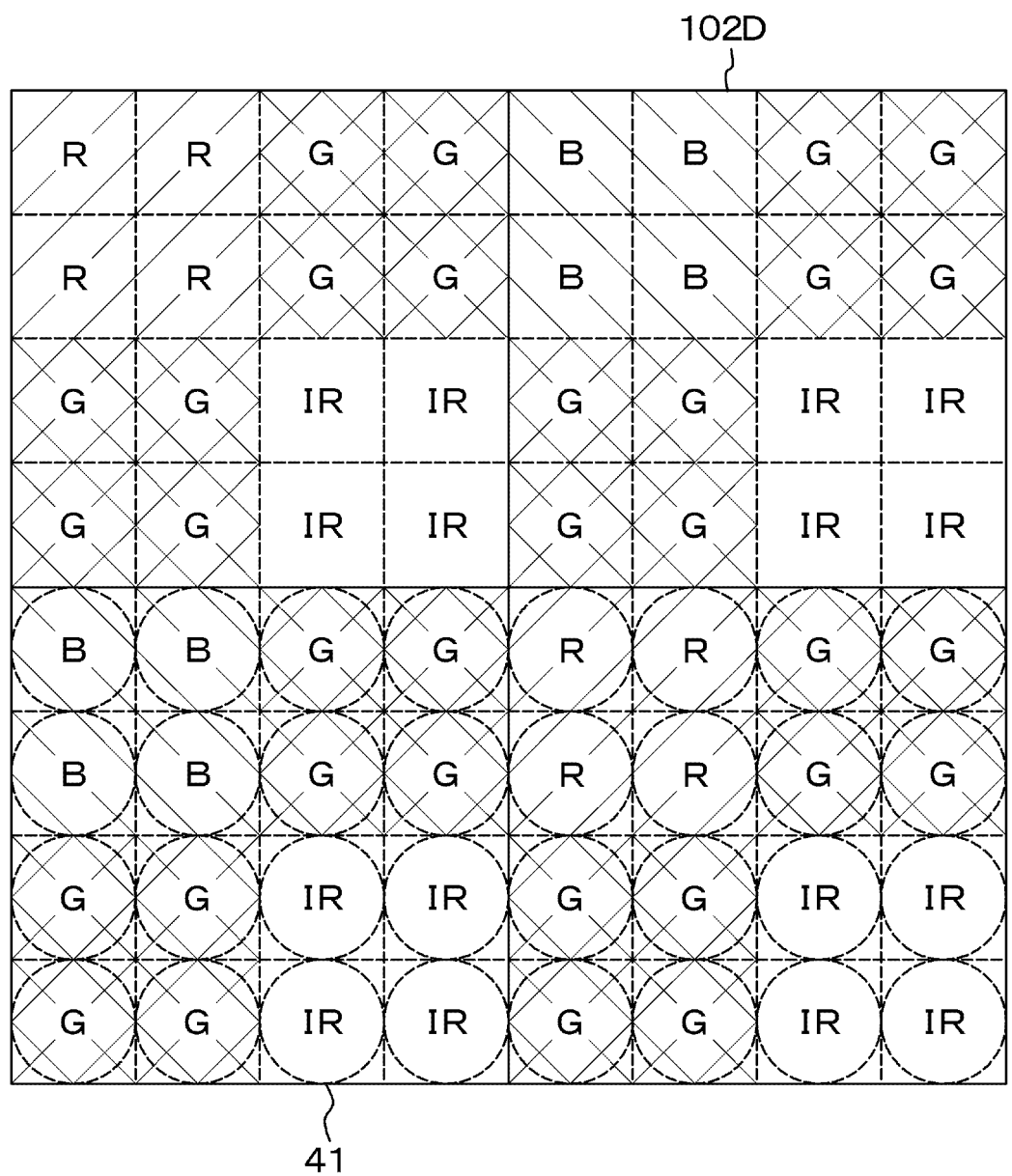
FIG. 31 is a schematic plan view for explaining a third modification example of the pixel array.

FIG. 31 is a schematic plan view for explaining a third modification example of the pixel array.

FIG. 31 illustrates a configuration in which pixel groups each having 2×2 pixels of the same color are arranged, and a part of the pixel groups is used for infrared light. An on-chip lens is arranged in each pixel.

Figure 32:
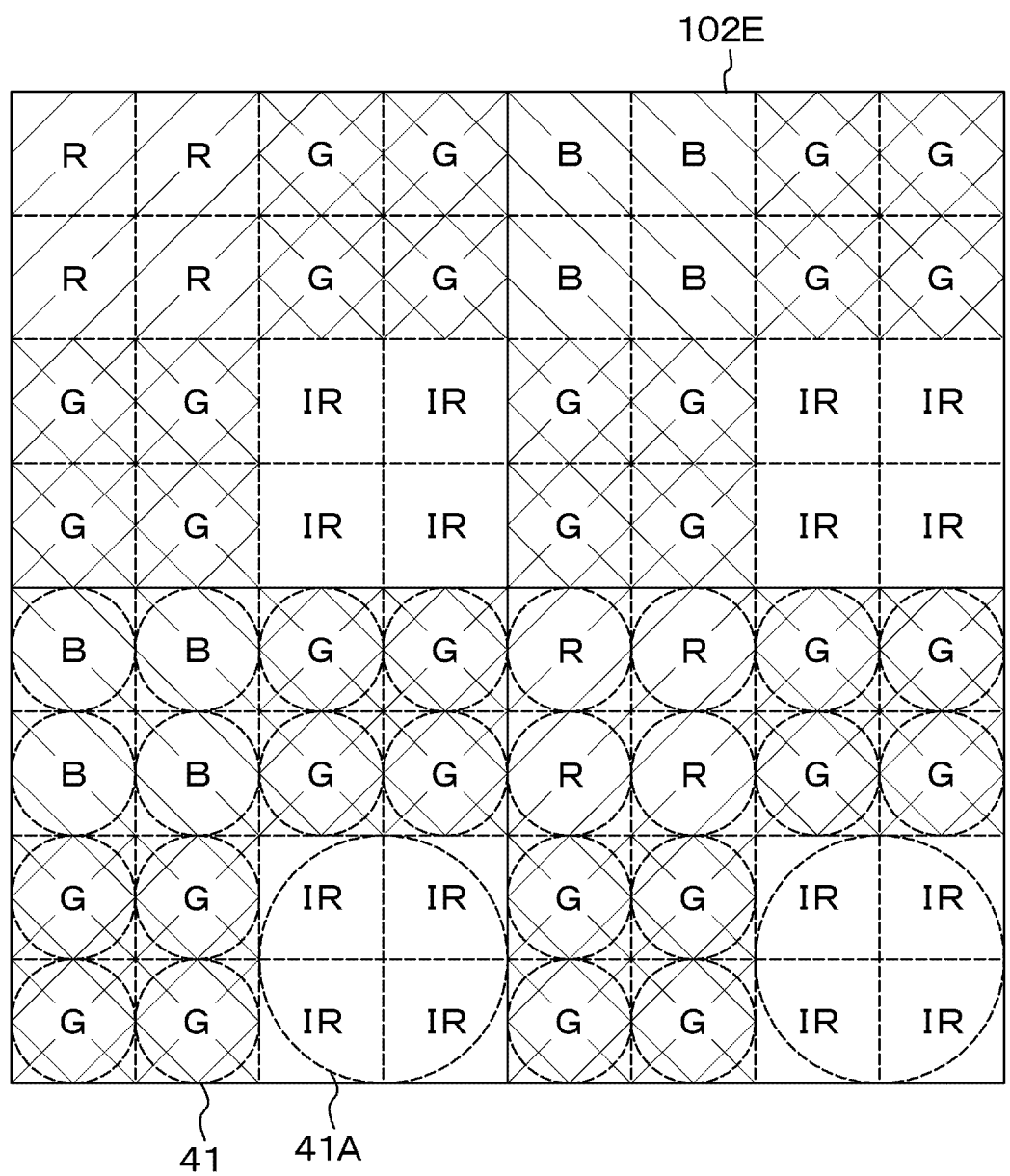
FIG. 32 is a schematic plan view for explaining a fourth modification example of the pixel array.

FIG. 32 is a schematic plan view for explaining a fourth modification example of the pixel array.

FIG. 32 also illustrates a configuration in which pixel groups each having 2×2 pixels of the same color are arranged, and a part of the pixel groups is used for infrared light. For visible light pixels, an on-chip lens is arranged in each pixel, and for infrared light pixels, a common on-chip lens is arranged in 2×2 pixels.

Figure 33:
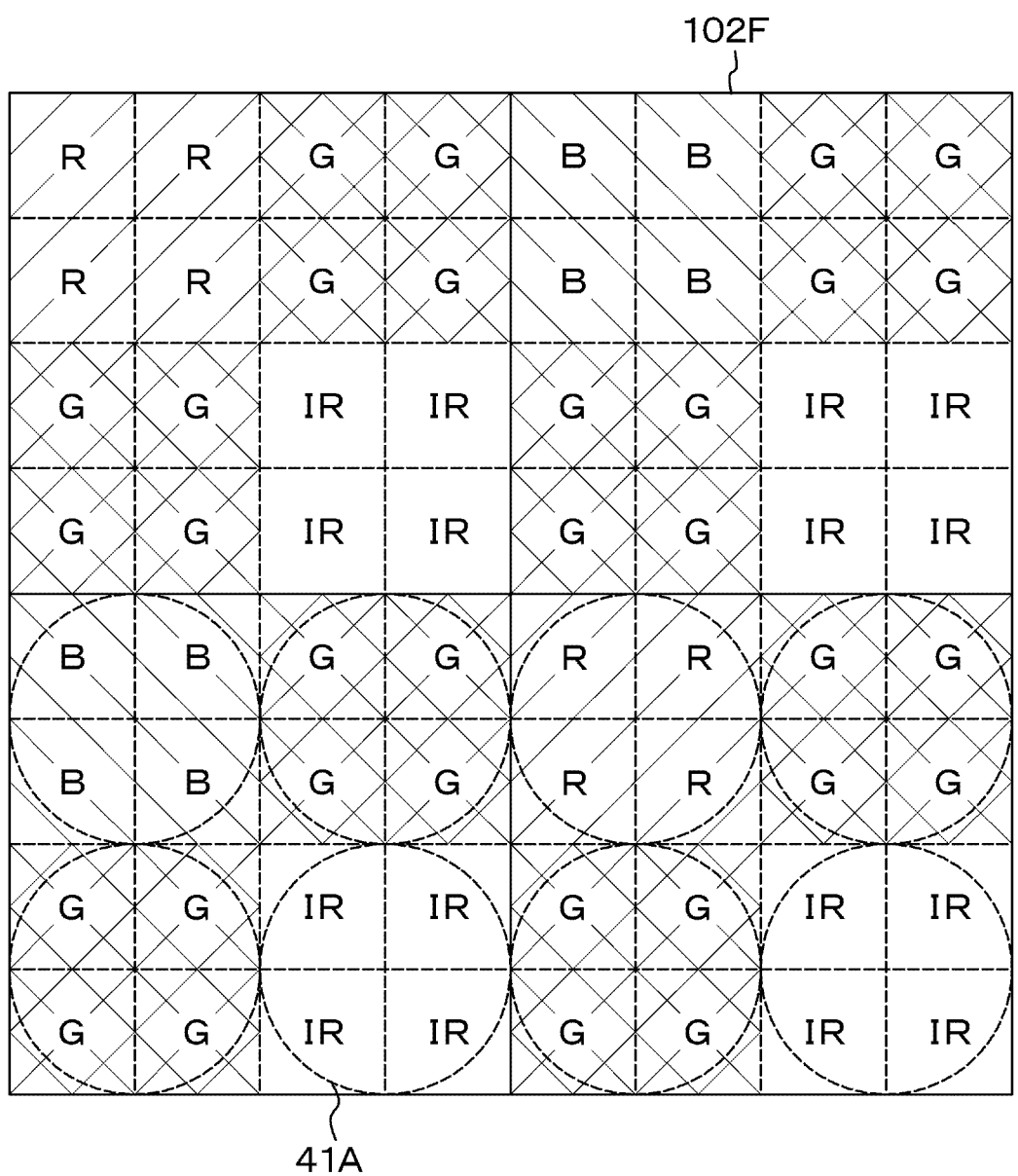
FIG. 33 is a schematic plan view for explaining a fifth modification example of the pixel array.

FIG. 33 is a schematic plan view for explaining a fifth modification example of the pixel array.

FIG. 33 also illustrates a configuration in which pixel groups each having 2×2 pixels of the same color are arranged, and a part of the pixel groups is used for infrared light. For visible light pixels and infrared light pixels, a common on-chip lens is arranged in 2×2 pixels.

Figure 34:
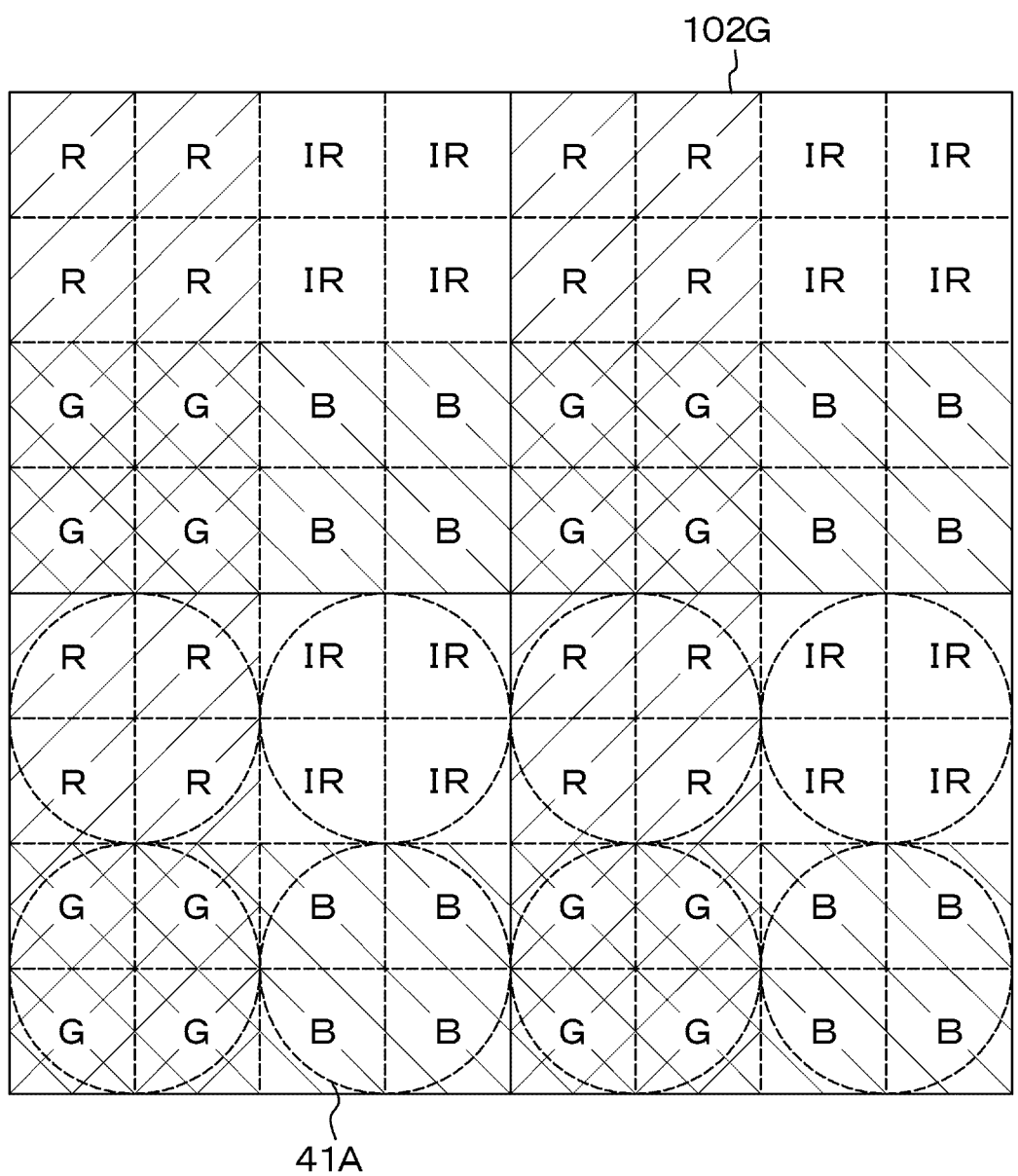
FIG. 34 is a schematic plan view for explaining a sixth modification example of the pixel array.

FIG. 34 is a schematic plan view for explaining a sixth modification example of the pixel array.

FIG. 34 also illustrates a configuration in which pixel groups each having 2×2 pixels of the same color are arranged, and a part of the pixel groups is used for infrared light. For visible light pixels and infrared light pixels, a common on-chip lens is arranged in 2×2 pixels.

The various imaging devices according to the present disclosure described above have an advantage of a configuration in which one pixel of the Bayer array is divided into a plurality of pixels, for example, an advantage that an S/N ratio is improved by adding and reading pixels of the same color, and a resolution is increased by performing the full resolution demosaic processing. The information of the infrared light image and the information of the visible light image can be obtained from one imaging device. Furthermore, according to the image processing system using the imaging device according to the present disclosure, it is possible to perform the sensing processing at the same time as the acquisition of the viewing image in the monocular configuration.

Application Example

The technology according to the present disclosure can be applied to various products. For example, the technology according to the present disclosure may be realized as a device mounted on any type of moving body such as an automobile, an electric vehicle, a hybrid electric vehicle, a motorcycle, a bicycle, a personal mobility, an airplane, a drone, a ship, a robot, a construction machine, and an agricultural machine (tractor).

Figure 35:
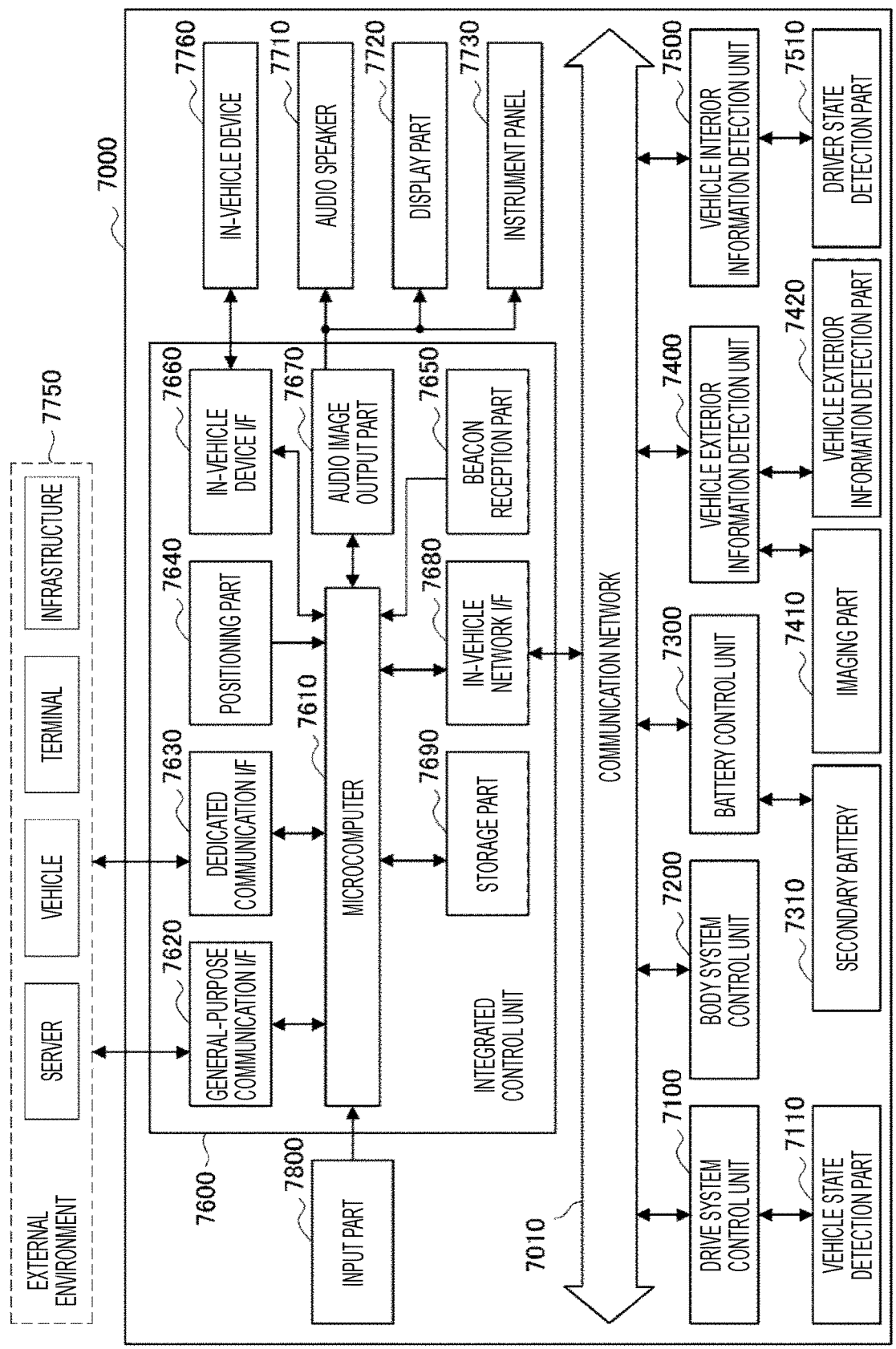
FIG. 35 is a block diagram illustrating an example of a schematic configuration of a vehicle control system.

FIG. 35 is a block diagram illustrating a schematic configuration of a vehicle control system 7000 which is an example of a moving body control system to which the technology according to the present disclosure can be applied. The vehicle control system 7000 includes a plurality of electronic control units connected via a communication network 7010. In the example illustrated in FIG. 35, the vehicle control system 7000 includes a drive system control unit 7100, a body system control unit 7200, a battery control unit 7300, a vehicle exterior information detection unit 7400, a vehicle interior information detection unit 7500, and an integrated control unit 7600. The communication network 7010 connecting these multiple control units may be, for example, a controller area network (CAN), a local interconnect network (LIN), a local area network (LAN) or an in-vehicle communication network based on arbitrary standards such as FlexRay (registered trademark).

Each control unit includes a microcomputer which performs arithmetic processing according to various programs, a storage part which stores a program executed by the microcomputer, parameters used for various arithmetic operations, and the like, and a drive circuit which drives various devices as control targets. Each control unit includes a network I/F for communicating with other control units via the communication network 7010 and includes a communication I/F for communicating with devices, sensors, and the like inside or outside the vehicle by wired communication or wireless communication. In FIG. 35, as the functional configuration of the integrated control unit 7600, a microcomputer 7610, a general-purpose communication I/F 7620, a dedicated communication I/F 7630, a positioning part 7640, a beacon reception part 7650, an in-vehicle device I/F 7660, an audio image output part 7670, an in-vehicle network I/F 7680 and a storage part 7690 are illustrated. Similarly, another control unit also includes a microcomputer, a communication I/F, a storage part, and the like.

The drive system control unit 7100 controls the operation of devices related to the drive system of the vehicle according to various programs. For example, the drive system control unit 7100 functions as a control device for a drive force generation device, such as an internal combustion engine and a drive motor, for generating a drive force of a vehicle, a drive force transmission mechanism for transmitting the drive force to wheels, a steering mechanism for adjusting a steering angle of the vehicle, a braking device for generating a braking force of the vehicle, and the like. The drive system control unit 7100 may have a function as a control device such as an antilock brake system (ABS) and an electronic stability control (ESC).

A vehicle state detection part 7110 is connected to the drive system control unit 7100. The vehicle state detection part 7110 includes, for example, a gyro sensor which detects the angular velocity of the shaft rotational movement of a vehicle body, an acceleration sensor which detects the acceleration of the vehicle, or at least one of sensors for detecting the operation amount of an accelerator pedal, the operation amount of a brake pedal, the steering angle of a steering wheel, an engine speed, a wheel rotation speed, and the like. The drive system control unit 7100 performs arithmetic processing by using the signal input from the vehicle state detection part 7110 to control an internal combustion engine, a drive motor, an electric power steering device, a brake device, and the like.

The body system control unit 7200 controls the operation of various devices mounted on the vehicle body according to various programs. For example, the body system control unit 7200 functions as a keyless entry system, a smart key system, a power window device, or a control device for various lamps such as a head lamp, a back lamp, a brake lamp, a winker, and a fog lamp. In this case, the body system control unit 7200 may receive radio waves transmitted from a portable device that substitutes for the key or signals of various switches. The body system control unit 7200 receives the input of these radio waves or signals and controls a vehicle door lock device, a power window device, a lamp, and the like.

The battery control unit 7300 controls a secondary battery 7310 which is the power supply source of the drive motor according to various programs. For example, the battery control unit 7300 receives information such as a battery temperature, a battery output voltage, or the remaining capacity of the battery from a battery device including the secondary battery 7310. The battery control unit 7300 performs arithmetic processing by using these signals to control the temperature adjustment of the secondary battery 7310, the cooling device provided in the battery device, and the like.

The vehicle exterior information detection unit 7400 detects the external information of the vehicle equipped with the vehicle control system 7000. For example, at least one of an imaging part 7410 or a vehicle exterior information detection part 7420 is connected to the vehicle exterior information detection unit 7400. The imaging part 7410 includes at least one of a time of flight (ToF) camera, a stereo camera, a monocular camera, an infrared camera, and other cameras. The vehicle exterior information detection part 7420 includes, for example, an environment sensor for detecting the current weather or weather conditions or at least one of ambient information detection sensors for detecting another vehicle, an obstacle, a pedestrian, and the like around the vehicle equipped with the vehicle control system 7000.

The environment sensor may be, for example, at least one of a raindrop sensor which detects rainy weather, a fog sensor which detects fog, a sunshine sensor which detects the degree of sunshine, and a snow sensor which detects snowfall. The ambient information detection sensor may be at least one of an ultrasonic sensor, a radar device, and a light detection and ranging, laser imaging detection and ranging (LIDAR) device. The imaging part 7410 and the vehicle exterior information detection part 7420 may be provided as independent sensors or devices or may be provided as a device in which a plurality of sensors or devices is integrated.

Figure 36:
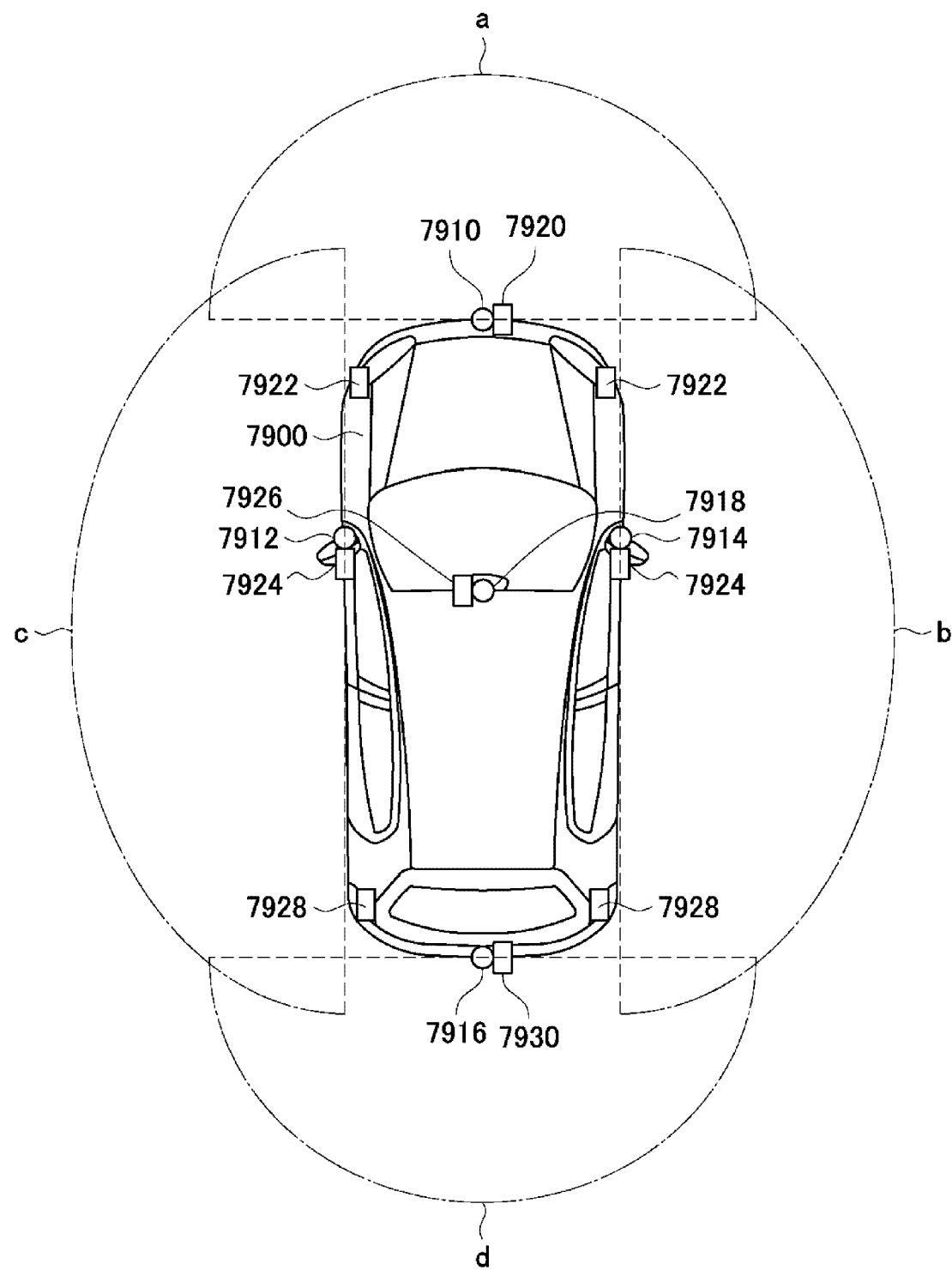
FIG. 36 is an explanatory diagram illustrating an example of installation positions of a vehicle exterior information detection part and an imaging part.

Herein, FIG. 36 illustrates an example of the installation positions of the imaging part 7410 and the vehicle exterior information detection part 7420. Imaging parts 7910, 7912, 7914, 7916, and 7918 each is provided, for example, at at least one position of the front nose, the side mirrors, the rear bumper, and the back door of the vehicle 7900 and the upper part of the windshield inside the vehicle. The imaging part 7910 provided on the front nose and the imaging part 7918 provided on the upper portion of the windshield inside the vehicle mainly acquire an image on the front side of the vehicle 7900. The imaging parts 7912 and 7914 provided in the side mirrors mainly acquire images on the side of the vehicle 7900. The imaging part 7916 provided on the rear bumper or the back door mainly acquires an image on the rear side of the vehicle 7900. The imaging part 7918 provided on the upper portion of the windshield inside the vehicle is mainly used to detect a preceding vehicle, a pedestrian, an obstacle, a traffic signal, a traffic sign, a lane, and the like.

Note that FIG. 36 illustrates an example of the imaging ranges of the imaging parts 7910, 7912, 7914, and 7916. An imaging range a indicates the imaging range of the imaging part 7910 provided on the front nose, imaging ranges b and c indicate the imaging ranges of the imaging parts 7912 and 7914 provided on the side mirrors, and an imaging range d is the imaging range of the imaging part 7916 provided in the rear bumper or the back door. For example, by superposing the image data obtained by the imaging of the imaging parts 7910, 7912, 7914, and 7916 on each other, an overhead image of the vehicle 7900 viewed from above can be obtained.

Vehicle exterior information detection parts 7920, 7922, 7924, 7926, 7928, 7930 provided on the front, rear, sides, corners of the vehicle 7900 and in the upper portion of the windshield inside the vehicle may be, for example, ultrasonic sensors or radar devices. The vehicle exterior information detection parts 7920, 7926, 7930 provided on the front nose, rear bumper, and back door of the vehicle 7900 and in the upper portion of the windshield inside the vehicle may be, for example, LIDAR devices. These vehicle exterior information detection parts 7920 to 7930 are mainly used to detect a preceding vehicle, a pedestrian, an obstacle, and the like.

Returning to FIG. 35, the description is continued. The vehicle exterior information detection unit 7400 causes the imaging part 7410 to capture an image outside the vehicle and receives the captured image data. Furthermore, the vehicle exterior information detection unit 7400 also receives detection information from the vehicle exterior information detection part 7420 connected thereto. In a case where the vehicle exterior information detection part 7420 is an ultrasonic sensor, a radar device, or a LIDAR device, the vehicle exterior information detection unit 7400 transmits ultrasonic waves, electromagnetic waves, and the like, and receives information on the received reflected waves. The vehicle exterior information detection unit 7400 may perform object detection processing or distance detection processing on a person, a vehicle, an obstacle, a sign, characters on the road surface, and the like on the basis of the received information. The vehicle exterior information detection unit 7400 may perform environment recognition processing of recognizing rainfall, fog, road surface conditions, and the like on the basis of the received information. The vehicle exterior information detection unit 7400 may calculate a distance to the object outside the vehicle on the basis of the received information.

Furthermore, the vehicle exterior information detection unit 7400 may perform image recognition processing or distance detection processing of recognizing a person, a vehicle, an obstacle, a sign, characters on the road surface, and the like on the basis of the received image data. The vehicle exterior information detection unit 7400 may perform processing such as distortion correction or position adjustment on the received image data and may synthesize image data obtained by the imaging of the different imaging parts 7410 to generate an overhead image or a panoramic image. The vehicle exterior information detection unit 7400 may perform viewpoint conversion processing by using image data obtained by the imaging of the different imaging parts 7410.

The vehicle interior information detection unit 7500 detects in-vehicle information. For example, a driver state detection part 7510 which detects the state of a driver is connected to the vehicle interior information detection unit 7500. The driver state detection part 7510 may include a camera which captures an image of the driver, a biometric sensor which detects biometric information of the driver, a microphone which collects audio inside the vehicle, and the like. The biometric sensor is provided on, for example, a seat surface, a steering wheel, or the like and detects biometric information of an occupant sitting on a seat or a driver holding the steering wheel. The vehicle interior information detection unit 7500 may calculate the degree of tiredness or concentration of the driver on the basis of the detection information input from the driver state detection part 7510 or may determine whether or not the driver is asleep. The vehicle interior information detection unit 7500 may perform processing such as noise canceling processing on the collected audio signal.

The integrated control unit 7600 controls overall operations in the vehicle control system 7000 according to various programs. An input part 7800 is connected to the integrated control unit 7600. For example, the input part 7800 is realized by a device, such as a touch panel, a button, a microphone, a switch, or a lever, which can be input and operated by the occupant. The integrated control unit 7600 may receive data obtained by audio recognition of the audio input by a microphone. The input part 7800 may be, for example, a remote control device using infrared rays or other radio waves or may be an external connection device such as a mobile phone and a personal digital assistant (PDA) responding to the operation of the vehicle control system 7000. The input part 7800 may be, for example, a camera, and in that case, the occupant can input information by gesture. Alternatively, the data obtained by detecting the movement of the wearable device worn by the occupant may be input. Moreover, the input part 7800 described above may include, for example, an input control circuit and the like which generates an input signal on the basis of the information input by the occupant and the like using the input part 7800 and outputs the input signal to the integrated control unit 7600. By operating the input part 7800, the occupant and the like inputs various data to the vehicle control system 7000 or gives an instruction for processing operation.

The storage part 7690 may include a read only memory (ROM) which stores various programs executed by the microcomputer and a random access memory (RAM) which stores various parameters, calculation results, sensor values, and the like. Furthermore, the storage part 7690 may be realized by a magnetic storage device such as a hard disc drive (HDD), a semiconductor storage device, an optical storage device, a magneto-optical storage device, and the like.

The general-purpose communication I/F 7620 is a general-purpose communication I/F which mediates communication with various devices existing in an external environment 7750. The general-purpose communication I/F 7620 may implement a cellular communication protocol such as global system of mobile communications (GSM) (registered trademark), WiMAX, long term evolution (LTE), and LTE-advanced (LTE-A) or another wireless communication protocol such as wireless LAN (also referred to as Wi-Fi (registered trademark)) and Bluetooth (registered trademark). The general-purpose communication I/F 7620 may be connected to a device (for example, an application server or a control server) existing on an external network (for example, the Internet, a cloud network, or an operator-specific network) via a base station or an access point, for example. Furthermore, for example, by using peer to peer (P2P) technology, the general-purpose communication I/F 7620 may be connected with a terminal (for example, a terminal of a driver, a pedestrian, or a store or a machine type communication (MTC) terminal) existing in the vicinity of the vehicle.

The dedicated communication I/F 7630 is a communication I/F which supports a communication protocol designed for use in a vehicle. For example, the dedicated communication I/F 7630 may implement wireless access in vehicle environment (WAVE) which is a combination of the lower layer IEEE802.11p and the upper layer IEEE1609, dedicated short range communications (DSRC), or a standard protocol such as a cellular communication protocol. The dedicated communication I/F 7630 typically performs a V2X communication which is a concept including one or more communications of a vehicle-to-vehicle communication, a vehicle-to-infrastructure communication, a vehicle-to-home communication, and a vehicle-to-pedestrian communication.

For example, the positioning part 7640 receives a global navigation satellite system (GNSS) signal from a GNSS satellite (for example, a GPS signal from a global positioning system (GPS) satellite) to perform positioning and generates the position information including the latitude, longitude, and altitude of the vehicle. Note that the positioning part 7640 may specify the current position by exchanging signals with the wireless access point or may acquire position information from a terminal such as a mobile phone, PHS, or smartphone having a positioning function.

For example, the beacon reception part 7650 receives radio waves or electromagnetic waves transmitted from a wireless station or the like installed on the road and acquires information such as the current position, traffic congestion, traffic closure, and required time. Note that the function of beacon reception part 7650 may be included in dedicated communication I/F 7630 described above.

The in-vehicle device I/F 7660 is a communication interface which mediates a connection between the microcomputer 7610 and various in-vehicle devices 7760 existing in the vehicle. The in-vehicle device I/F 7660 may establish a wireless connection using a wireless communication protocol such as wireless LAN, Bluetooth (registered trademark), near field communication (NFC) or wireless USB (WUSB). Furthermore, the in-vehicle device I/F 7660 may establish a wired connection such as a universal serial bus (USB), a high-definition multimedia interface (HDMI) (registered trademark), and a mobile high-definition link (MHL) through a connection terminal (not illustrated) (and a cable if necessary). For example, the in-vehicle device 7760 may include at least one of a mobile device and a wearable device which the occupant has and an information device which is carried in or attached to a vehicle. Furthermore, the in-vehicle device 7760 may include a navigation device which searches for a route to an arbitrary destination. The in-vehicle device I/F 7660 exchanges control signals or data signals with these in-vehicle devices 7760.

The in-vehicle network I/F 7680 is an interface which mediates communication between the microcomputer 7610 and the communication network 7010. The in-vehicle network I/F 7680 transmits and receives signals and the like according to a predetermined protocol supported by the communication network 7010.

The microcomputer 7610 of the integrated control unit 7600 controls the vehicle control system 7000 according to various programs on the basis of the information acquired through at least one of the general-purpose communication I/F 7620, the dedicated communication I/F 7630, the positioning part 7640, the beacon reception part 7650, the in-vehicle device I/F 7660, and the in-vehicle network I/F 7680. For example, the microcomputer 7610 may calculate the control target value of the drive force generation device, the steering mechanism or the braking device on the basis of the acquired information on the inside and outside of the vehicle and may output a control command to the drive system control unit 7100. For example, the microcomputer 7610 may perform a cooperative control aiming at realizing the functions of advanced driver assistance system (ADAS) including collision avoidance or impact mitigation of a vehicle, follow-up traveling based on inter-vehicle distance, vehicle speed maintenance traveling, vehicle collision warning, vehicle lane departure warning, and the like. Furthermore, the microcomputer 7610 may perform a cooperative control aiming at autonomous driving and the like of autonomously traveling independently of the operation of the driver by controlling the drive force generation device, the steering mechanism, the braking device, and the like on the basis of the acquired surrounding information of the vehicle.

The microcomputer 7610 may generate three-dimensional distance information between the vehicle and surrounding objects such as structures and persons on the basis of the information acquired through at least one of the general-purpose communication I/F 7620, the dedicated communication I/F 7630, the positioning part 7640, the beacon reception part 7650, the in-vehicle device I/F 7660, and the in-vehicle network I/F 7680 and may create local map information including peripheral information of the current position of the vehicle. Furthermore, the microcomputer 7610 may predict a risk of a vehicle collision, a proximity of a pedestrian and the like, an approach to a closed road, or the like on the basis of the acquired information and may generate a warning signal. The warning signal may be, for example, a signal for generating a warning sound or turning on a warning lamp.

For the occupant of the vehicle or the outside of the vehicle, the audio image output part 7670 transmits an output signal of at least one of an audio or an image to an output device capable of visually or audibly notifying information. In the example of FIG. 35, an audio speaker 7710, a display part 7720, and an instrument panel 7730 are illustrated as output devices. For example, the display part 7720 may include at least one of an onboard display and a head-up display. The display part 7720 may have an augmented reality (AR) display function. The output device may be a device other than these devices, such as a headphone, a wearable device such as a glasses-type display worn by the occupant, a projector, and a lamp. In a case where the output device is a display device, the display device visually displays the results obtained by various processes performed by the microcomputer 7610 or the information received from another control unit in various formats such as texts, images, tables, and graphs. Furthermore, in a case where the output device is a voice output device, the voice output device converts an audio signal including reproduced audio data, acoustic data, and the like into an analog signal and outputs the signal audibly.

Note that in the example illustrated in FIG. 35, at least two control units connected through the communication network 7010 may be integrated as one control unit. Alternatively, each control unit may be configured by a plurality of control units. Moreover, the vehicle control system 7000 may include another control unit (not illustrated). Furthermore, in the above description, some or all of the functions of any control unit may be given to another control unit. That is, if the information is transmitted and received through the communication network 7010, predetermined arithmetic processing may be performed by any control unit. Similarly, a sensor or device connected to one of the control units may be connected to another control unit, and a plurality of control units may transmit and receive detection information to and from each other through the communication network 7010.

The technology according to the present disclosure can be applied to, for example, the imaging part of the vehicle exterior information detection unit among the configurations described above.

Note that the technology of the present disclosure can also have the following configurations.

[A1]

An imaging device including:

a pixel array part in which a plurality of pixel groups each including four pixels arranged in a matrix of 2×2 is arrayed, in which as a pixel group including four pixels, there are formed a first pixel group that includes three pixels that receive red light and one pixel that receives infrared light, a second pixel group that includes three pixels that receive blue light and one pixel that receives infrared light, a third pixel group that includes three pixels that receive green light and one pixel that receives infrared light, and a fourth pixel group that includes three pixels that receive green light and one pixel that receives infrared light, and four pixel groups including the first pixel group, the second pixel group, the third pixel group, and the fourth pixel group are arranged to form a set of 2×2 units in which the first pixel group and the second pixel group are diagonally positioned, and the third pixel group and the fourth pixel group are diagonally positioned.

[A2]

The imaging device according to [A1], in which in each pixel group, the pixel that receives infrared light is provided at the same position.

[A3]

The imaging device according to [A2], in which an on-chip lens is arranged for each pixel.

[A4]

The imaging device according to [A1] or [A2], in which any one of a red filter, a green filter, and a blue filter is arranged to correspond to a pixel that receives red light, green light, or blue light, and an infrared light transmission filter is arranged to correspond to a pixel that receives infrared light.

[A5]

The imaging device according to [A4], in which the infrared light transmission filter is formed by laminating at least two of a red filter, a green filter, and a blue filter.

[A6]

The imaging device according to [A5], in which the infrared light transmission filter is formed by laminating two of the red filter and the blue filter.

[A7]

The imaging device according to [A1], in which a pixel that receives infrared light is provided to be adjacent to pixels that receive infrared light in adjacent pixel groups, so that the pixels are arranged in a matrix of 2×2 in every four adjacent pixel groups.

[A8]

The imaging device according to [A7], in which an on-chip lens is arranged for each pixel.

[A9]

The imaging device according to [A7], in which an on-chip lens is arranged in each pixel of the pixels that receive red light, green light, and blue light, and a common on-chip lens is arranged in the pixels that are arranged in a matrix of 2×2 and receive infrared light.

[A10]

The imaging device according to any one of [A7] to [A9], in which any one of a red filter, a green filter, and a blue filter is arranged to correspond to the pixel that receives red light, green light, or blue light, and a common infrared light transmission filter is arranged in the pixels that are arranged in a matrix of 2×2 and receive infrared light.

[A11]

The imaging device according to [A10], in which the common infrared light transmission filter is configured by laminating at least two of the red filter, the green filter, and the blue filter.

[A12]

The imaging device according to any one of [A1] to [A11], in which image data having red, green, and blue components is generated for each pixel.

[A13]

The imaging device according to any one of [A1] to [A11], in which data of pixels of the same color in each pixel group is added to generate image data.

[A14]

The imaging device according to any one of [A7] to [A11], in which data of four pixels that are arranged in a matrix of 2×2 and receive infrared light is added to generate image data.

[A15]

The imaging device according to [A1], in which three pixels except a pixel that receives infrared light in each pixel group are exposed under different exposure conditions depending on the pixel.

[A16]

The imaging device according to [A15], in which in each pixel group, the pixel that receive infrared light is provided at the same position, a pair of scanning lines is arranged in each pixel row, and in pixels in each image row, every pixel is alternately connected to one scanning line and another scanning line.

[A17]

The imaging device according to [A15], in which a pixel that receives infrared light is provided to be adjacent to pixels that receive infrared light in adjacent pixel groups, so that the pixels are arranged in a matrix of 2×2 in every four adjacent pixel groups, a pair of scanning lines is arranged in each pixel row, and pixels in each image row are alternately connected in units of two pixels to one scanning line and another scanning line.

[B1]

An image processing system including:

an imaging device that images a subject and a signal processing part that processes a signal from the imaging device, in which the imaging device includes a pixel array part in which a plurality of pixel groups each including four pixels arranged in a matrix of 2×2 is arrayed, as a pixel group including four pixels, there are formed a first pixel group that includes three pixels that receive red light and one pixel that receives infrared light, a second pixel group that includes three pixels that receive blue light and one pixel that receives infrared light, a third pixel group that includes three pixels that receive green light and one pixel that receives infrared light, and a fourth pixel group that includes three pixels that receive green light and one pixel that receives infrared light, and four pixel groups including the first pixel group, the second pixel group, the third pixel group, and the fourth pixel group are arranged to form a set of 2×2 units in which the first pixel group and the second pixel group are diagonally positioned, and the third pixel group and the fourth pixel group are diagonally positioned.

[B2]

The image processing system according to [B1], further including:

a light source part that irradiates the subject with infrared light.

[B3]

The image processing system according to [B1] or [B2], further including:

an authentication processing part that performs authentication processing on the basis of an infrared light image.

[B4]

The image processing system according to any one of [B1] to [B3], in which a pixel that receives infrared light is provided to be adjacent to pixels that receive infrared light in adjacent pixel groups, so that the pixels are arranged in a matrix of 2×2 in every four adjacent pixel groups, a common on-chip lens is arranged in the pixels that are arranged in a matrix of 2×2 and receive infrared light, and the authentication processing part is configured to perform the authentication processing by using at least one of the infrared light image or a depth map that is generated on the basis of an image plane phase difference of the pixels that receive infrared light.

REFERENCE SIGNS LIST 1, 2, 3 Image processing system
10 Semiconductor substrate
11 Photoelectric conversion part
20 Flattening layer
21 Light-shielding layer
30 Filter
$30_R$ Red filter
$30_G$ Green filter
$30_B$ Blue filter
$30_{IR}$ Infrared light transmission filter
$30_{IRA}$ Infrared light absorption (reflection) filter
40 Transparent material layer
41 On-chip lens
41A Common on-chip lens
100, 100A Imaging device
101 Pixel
102, 102A, 102B, 102C, 102D, 102E, 102F, 102G, 902 Pixel array part
103 Signal line
104 Scanning line
110 Drive part
111 Column processing part
112 Horizontal drive part
113 Vertical drive part
200 Signal processing part
210 Authentication processing part
220 Viewing processing part
300 Optical part
400 Light source part of infrared light

The invention claimed is:
1. An imaging device, comprising:
a pixel array part that includes a plurality of pixel groups, wherein
each pixel group of the plurality of pixel groups includes four pixels in a matrix of 2×2,
the plurality of pixel groups includes:
a first pixel group, wherein
three pixels of the four pixels of the first pixel group are configured to receive red light, and
a first pixel of the four pixels of the first pixel group is configured to receive infrared light,
a second pixel group, wherein
three pixels of the four pixels of the second pixel group are configured to receive blue light, and
a second pixel of the four pixels of the second pixel group is configured to receive the infrared light,
a third pixel group, wherein
three pixels of the four pixels of the third pixel group are configured to receive green light, and
a third pixel of the four pixels of the third pixel group is configured to receive the infrared light, and
a fourth pixel group, wherein
three pixels of the four pixels of the fourth pixel group are configured to receive the green light, and
a fourth pixel of the four pixels of the fourth pixel group is configured to receive the infrared light,
each pixel of the three pixels of each of the first pixel group, the second pixel group, the third pixel group, and the fourth pixel group includes a color filter and an infrared light absorption filter in contact with the color filter,
the first pixel group, the second pixel group, the third pixel group, and the fourth pixel group are arranged in a set of 2×2 units in which the first pixel group and the second pixel group are diagonally positioned, and the third pixel group and the fourth pixel group are diagonally positioned,
each pixel of the three pixels of each of the first pixel group, the second pixel group, the third pixel group, and the fourth pixel group is exposed under different exposure conditions,
a first exposure pixel of the three pixels of each of the first pixel group, the second pixel group, the third pixel group, and the fourth pixel group has a first exposure time,
a second exposure pixel of the three pixels of each of the first pixel group, the second pixel group, the third pixel group, and the fourth pixel group has a second exposure time,
a third exposure pixel of the three pixels of each of the first pixel group, the second pixel group, the third pixel group, and the fourth pixel group has a third exposure time,
each of the first pixel, the second pixel, the third pixel, and the fourth pixel, has a fourth exposure time,
the second exposure time is longer than the first exposure time,
the third exposure time is longer than the second exposure time, and
the fourth exposure time is longer than the second exposure time and shorter than the third exposure time.

2. The imaging device according to claim 1, wherein each of the first pixel, the second pixel, the third pixel, and the fourth pixel is at a same position in a corresponding pixel group of the plurality of pixel groups.

3. The imaging device according to claim 2, wherein each pixel of the four pixels of each pixel group of the plurality of pixel groups includes an on-chip lens.

4. The imaging device according to claim 1, wherein the color filter includes one of a red filter, a green filter, or a blue filter, and
each of the first pixel, the second pixel, the third pixel, and the fourth pixel includes an infrared light transmission filter.

5. The imaging device according to claim 4, wherein the infrared light transmission filter includes at least two of the red filter, the green filter, or the blue filter.

6. The imaging device according to claim 5, wherein the infrared light transmission filter further includes the red filter and the blue filter.

7. The imaging device according to claim 1, wherein the first pixel is adjacent to each of the second pixel, the third pixel, and the fourth pixel, so that the first pixel, the second pixel, the third pixel, and the fourth pixel are in the matrix of 2×2 in every four adjacent pixel groups of the plurality of pixel groups.

8. The imaging device according to claim 7, wherein each pixel of the four pixels of each pixel group of the plurality of pixel groups includes an on-chip lens.

9. The imaging device according to claim 7, wherein
each pixel of the three pixels of each of the first pixel group, the second pixel group, the third pixel group, and the fourth pixel group further includes an on-chip lens, and
the first pixel, the second pixel, the third pixel, and the fourth pixel include a common on-chip lens.

10. The imaging device according to claim 7, wherein
the color filter includes one of a red filter, a green filter, or a blue filter, and
the first pixel, the second pixel, the third pixel, and the fourth pixel include a common infrared light transmission filter.

11. The imaging device according to claim 10, wherein the common infrared light transmission filter includes at least two of the red filter, the green filter, or the blue filter.

12. The imaging device according to claim 1, wherein image data having a red component, a green component, and a blue component is generated for each pixel of the three pixels of each of the first pixel group, the second pixel group, the third pixel group, and the fourth pixel group.

13. The imaging device according to claim 1, wherein data of pixels of a same color in each pixel group of the plurality of pixel groups is added to generate image data.

14. The imaging device according to claim 7, wherein data of the first pixel, the second pixel, the third pixel, and the fourth pixel is added to generate image data.

15. The imaging device according to claim 1, wherein
each of the first pixel, the second pixel, the third pixel, and the fourth pixel is at a same position in a corresponding pixel group of the plurality of pixel groups,
a pair of scanning lines is arranged in each pixel row of the plurality of pixel groups, and
pixels in each image row are alternately connected to a first scanning line and a second scanning line.

16. The imaging device according to claim 1, wherein the first pixel is adjacent to each of the second pixel, the third pixel, and the fourth pixel, so that the first pixel, the second pixel, the third pixel, and the fourth pixel are in the matrix of 2×2 in every four adjacent pixel groups of the plurality of pixel groups, a pair of scanning lines is arranged in each pixel row of the plurality of pixel groups, and pixels in each image row are alternately connected in units of two pixels to a first scanning line and a second scanning line.

17. An image processing system, comprising:

an imaging device configured to image a subject; and circuitry configured to process a signal from the imaging device, wherein the imaging device includes a pixel array part that includes a plurality of pixel groups, each pixel group of the plurality of pixel groups includes four pixels in a matrix of 2×2, the plurality of pixel groups includes:

a first pixel group, wherein three pixels of the four pixels of the first pixel group are configured to receive red light, and a first pixel of the four pixels of the first pixel group is configured to receive infrared light, a second pixel group, wherein three pixels of the four pixels of the second pixel group are configured to receive blue light, and a second pixel of the four pixels of the second pixel group is configured to receive the infrared light, a third pixel group, wherein three pixels of the four pixels of the third pixel group are configured to receive green light, and a third pixel of the four pixels of the third pixel group is configured to receive the infrared light, and a fourth pixel group, wherein three pixels of the four pixels of the fourth pixel group are configured to receive the green light, and a fourth pixel of the four pixels of the fourth pixel group is configured to receive the infrared light, each pixel of the three pixels of each of the first pixel group, the second pixel group, the third pixel group, and the fourth pixel group includes a color filter and an infrared light absorption filter in contact with the color filter, the first pixel group, the second pixel group, the third pixel group, and the fourth pixel group are arranged in a set of 2×2 units in which the first pixel group and the second pixel group are diagonally positioned, and the third pixel group and the fourth pixel group are diagonally positioned, each pixel of the three pixels of each of the first pixel group, the second pixel group, the third pixel group, and the fourth pixel group is exposed under different exposure conditions, a first exposure pixel of the three pixels of each of the first pixel group, the second pixel group, the third pixel group, and the fourth pixel group has a first exposure time, a second exposure pixel of the three pixels of each of the first pixel group, the second pixel group, the third pixel group, and the fourth pixel group has a second exposure time, a third exposure pixel of the three pixels of each of the first pixel group, the second pixel group, the third pixel group, and the fourth pixel group has a third exposure time, each of the first pixel, the second pixel, the third pixel, and the fourth pixel, has a fourth exposure time, the second exposure time is longer than the first exposure time, the third exposure time is longer than the second exposure time, and the fourth exposure time is longer than the second exposure time and shorter than the third exposure time.

18. The image processing system according to claim 17, further comprising a light source configured to irradiate the subject with the infrared light.

19. The image processing system according to claim 17, wherein the circuitry is further configured to execute authentication processing based on an infrared light image.

20. The image processing system according to claim 17, wherein the first pixel is adjacent to each of the second pixel, the third pixel, and the fourth pixel, so that the first pixel, the second pixel, the third pixel, and the fourth pixel are in the matrix of 2×2 in every four adjacent pixel groups of the plurality of pixel groups, the first pixel, the second pixel, the third pixel, and the fourth pixel include a common on-chip lens, the circuitry is further configured to execute authentication processing by using at least one of an infrared light image or a depth map, and the depth map is based on an image plane phase difference of the first pixel, the second pixel, the third pixel, and the fourth pixel.

\* \* \* \* \*